(12) United States Patent
Schenk

(10) Patent No.: US 11,610,903 B2
(45) Date of Patent: Mar. 21, 2023

(54) CAPACITIVE MEMORY STRUCTURE, FUNCTIONAL LAYER, ELECTRONIC DEVICE, AND METHODS THEREOF

(71) Applicant: Ferroelectric Memory GmbH, Dresden (DE)

(72) Inventor: Tony Schenk, Dresden (DE)

(73) Assignee: FERROELECTRIC MEMORY GMBH, Dresden (DE)

(*) Notice: Subject to any disclaimer, the term of this patent is extended or adjusted under 35 U.S.C. 154(b) by 0 days.

(21) Appl. No.: 17/213,797

(22) Filed: Mar. 26, 2021

(65) Prior Publication Data

US 2022/0173114 A1  Jun. 2, 2022

(51) Int. Cl.
| H01L 21/00 | (2006.01) |
| H01L 27/11507 | (2017.01) |
| H01L 49/02 | (2006.01) |
| H01L 21/02 | (2006.01) |

(52) U.S. Cl.
CPC .. *H01L 27/11507* (2013.01); *H01L 21/02356* (2013.01); *H01L 28/60* (2013.01)

(58) Field of Classification Search
CPC ......... H01L 27/11507; H01L 21/02356; H01L 28/60
See application file for complete search history.

(56) References Cited

U.S. PATENT DOCUMENTS

| 8,722,548 B2 | 5/2014 | Aoyama | |
| 2019/0130956 A1* | 5/2019 | Müller | H01L 27/1159 |
| 2021/0408022 A1* | 12/2021 | Young | H01L 27/11514 |

OTHER PUBLICATIONS

Tapily, K., 'Texturing and Tetragonal Phase Stabilization of ALD HfxZr1-xO2 using a Cyclical Desposition and Annealing Scheme', 2012 ECS trans, vol. 45, (3) 411-420, downloaded Apr. 27, 2012, 10 pgs.
Clark, R. et al. 'Physical and Electrical Effects of the Dep-Anneal-Dep-Anneal (DADA) Process for Hfo2 in High K/Metal Gate Stacks', 2011 ECS trans, vol. 35 (4) 815-834, downloaded Aug. 4, 2011, 20pgs.
Robert W. Schwartz, et al., "Chemical solution deposition of electronic oxide films", Elsevier academic des sciences, © 2004, 29 pages.
Tim S. Böscke, "Crystalline Hafnia and Zirconia Based Dielectrics for Memory Applications", ResearchGate, dated Jan. 2010, 176 pages.
Milan Pešić, et al., "Low leakage $ZrO_2$ based capacitors for sub 20 nm DRAM technology nodes", 18 pages.
Tony Schenk, "Dissertation—Formation of Ferroelectricity in Hafnium Oxide Based Thin Films", NamLab, dated Jan. 11, 1987, 188 pages.

* cited by examiner

*Primary Examiner* — Richard A Booth
(74) *Attorney, Agent, or Firm* — Hickman Becker Bingham Ledesma LLP; Malgorzata A. Kulczycka

(57) ABSTRACT

Various aspects relate to a functional layer and the formation thereof. A method for manufacturing a functional layer of an electronic device may include: forming a plurality of sublayers of the functional layer by a plurality of consecutive sublayer processes, each sublayer process of the plurality of consecutive sublayer processes comprising: forming a sublayer of the plurality of sublayers by vapor deposition, the sublayer comprising one or more materials, and, subsequently, crystallizing the one or more materials comprised in the sublayer.

18 Claims, 29 Drawing Sheets

600

602

610

612

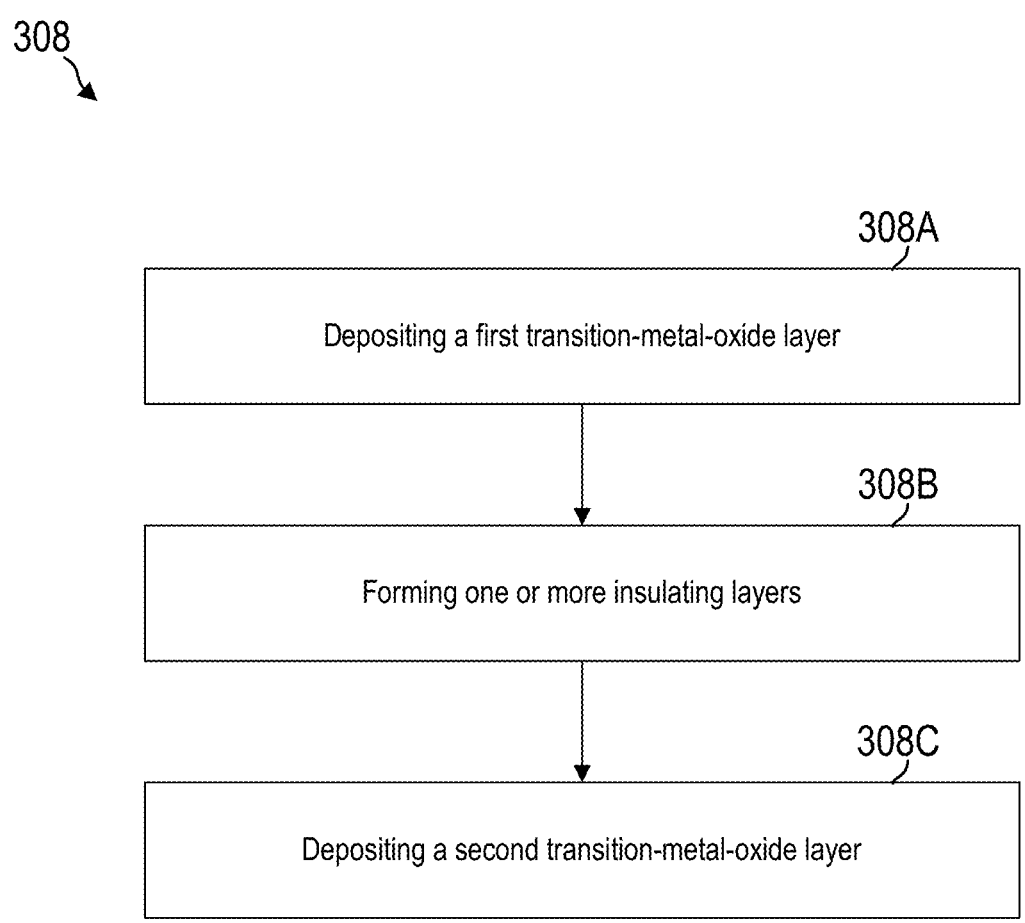

CAPACITIVE MEMORY STRUCTURE, FUNCTIONAL LAYER, ELECTRONIC DEVICE, AND METHODS THEREOF

TECHNICAL FIELD

Various aspects relate to an electronic device or at least a part of an electronic device, e.g., a capacitive memory structure, a capacitive storage structure, a pyroelectric structure, a piezoelectric structure, and methods for manufacturing an electronic device or at least a part of an electronic device, e.g., a capacitive memory structure, an electrostatic (e.g., super-) capacitor, a pyroelectric structure, a piezoelectric structure. Various aspects relate to a memory cell and methods for manufacturing a memory cell. Various aspects relate to a sensor and methods for manufacturing a sensor. Various aspects relate to a transmitter and/or receiver and methods for manufacturing a transmitter and/or receiver. Various aspects relate to a functional layer of an electronic device and methods for manufacturing a functional layer of an electronic device.

BACKGROUND

In general, various electronic devices have been developed. Usually, e.g., in the semiconductor industry, one or more electronic devices, as for example one or more memory cells, one or more sensors, one or more transmitters, one or more receivers, and the like, may be formed by so called semiconductor processes, e.g., layering processes, patterning, processes, annealing processes, and doping processes. Various electronic devices may include functional materials, e.g., ferroelectric materials, antiferroelectric materials, ferromagnetic materials, antiferromagnetic materials, piezoelectric materials, pyroelectric materials, only as examples, in form of one or more functional layers integrated solely and/or in combination with one or more other layers, e.g., electrode layers, semiconductor layers, protection layers, barrier layers, as examples.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIGS. 3, 5A, 5B, 6A, 7A, 8A, 9A, 10A, 11A, 12A, 13A, 13B, 13C each show a schematic flow diagram of a method for manufacturing an electronic device (e.g., a capacitive memory structure, e.g., a functional structure, e.g., a functional layer of an electronic device), according to various aspects;

DESCRIPTION

Figure 1:
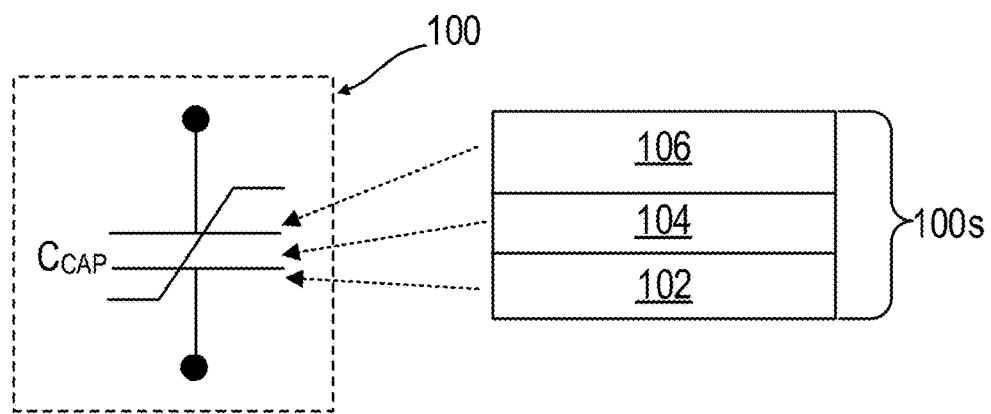
FIG. 1 shows schematically a capacitive memory structure, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, or a memory capacitor). However, it may be understood that aspects described in connection with methods may similarly apply to the devices, and vice versa.

In the semiconductor industry, the integration of non-volatile memory technologies, sensor technologies, transmitter technologies, electronic filter technologies, receiver technologies, and the like may be useful for various types of devices and applications. According to various aspects, an electronic device, e.g., a non-volatile memory may be integrated on a chip together with a processor core of a processor. As another example, one or more non-volatile memories may be used as part of a mass storage device. As still another example, one or more sensors may be used as part of a sensor device. As still another example, one or more transmitters and/or receivers may be used as part of a communication device.

Various aspects may be related to forming and/or influencing one or more functional layers of an electronic device. An example may include a memory layer as a functional layer of a memory cell. In some aspects, a non-volatile memory technology may be based on at least one field-effect transistor (FET) structure. In some aspects, a memory cell may include a field-effect transistor structure and a capacitive memory structure (also referred to herein as memory capacitor) coupled to a gate electrode of the field-effect transistor structure. The amount of charge stored in the capacitive memory structure may influence the threshold voltage(s) of the field-effect transistor structure. The threshold voltage(s) of the field-effect transistor structure may define the memory state the memory cell is residing in. In some aspects, the capacitive memory structure may be a ferroelectric capacitor structure (FeCAP) coupled to a gate electrode of the field-effect transistor structure to provide a ferroelectric field-effect transistor (FeFET) structure. Since a ferroelectric material may have at least two stable polarization states, it may be used to shift a threshold voltage of a field-effect transistor in a non-volatile fashion; therefore, it may be used to turn the field-effect transistor into a non-volatile field-effect transistor based memory structure. A ferroelectric material may turn a ferroelectric capacitor structure into a non-volatile capacitor based memory structure, e.g. by controlling the amount of charge stored in the capacitor structure. In other aspects, a non-volatile memory technology may be based on at least one capacitive memory structure. The capacitive memory structure may be or may include a ferroelectric capacitor structure. The amount of charge stored in the capacitive memory structure may be read out by suitable electronic read out circuits, e.g., by a charge to voltage converter, by a determination of a switching current of the capacitive memory structure.

Doped or substituted hafnium oxide ($HfO_2$), doped or substituted zirconium oxide ($ZrO_2$) or, more in general, transition-metal-oxides (TMO) and their mixtures may show great remanent polarization under certain process conditions (e.g., $Hf_{0.5}Zr_{0.5}O_2$ may possess strong ferroelectric properties). Electrical properties and, more specifically, polarization properties of a TMO may depend its stoichiometry and/or sub-stoichiometry. In some aspects, a presence of defects in the material may influence one or more electrical properties (e.g., polarization properties) of a spontaneously polarizable material. Such defects may include ionic defects (oxygen vacancies ($V_O$), as an example), electronic defects, defect dipoles, and/or domain boundaries, as examples.

Defect formation in a material may be influenced, in some aspects, by processing conditions used to form and/or treat the material. Various aspects may be related to providing a memory layer, e.g., as a part of a memory cell, wherein the memory layer includes (e.g., consists of) a spontaneously polarizable material having a predefined crystallographic texture (e.g., a (001)-texture or a (111)-texture) and a defect density in a predefined defect density range. The defect density may include an ionic defect density in a predefined defect density range, and/or an electronic defect density in a predefined defect density range, and/or a domain boundaries density in a predefined domain boundaries density range. A defect density, as referred to herein, may be associated with a number of defects per volume or area. A measurement volume or area to determine the defect density may be selected properly as a function of the total volume of a material to be analyzed, e.g., more than 50% of the volume may be used as a characteristic volume to determine the defect density. For example, a vacancy density (e.g., a total vacancy density or an oxygen vacancy density) may be in a predefined range from about $10^{14}$ vacancies/$cm^3$ to about $10^{22}$ vacancies/$cm^3$ (e.g., in the range from about $10^{14}$ vacancies/$cm^3$ to about $10^{18}$ vacancies/$cm^3$). For example, a defect density may be associated with a charge of vacancies, interstitials, dopants (e.g., unintended dopants, such as a silicon atom on a hafnium lattice site), clusters of dopants, vacancy clusters, etc. One or more of the defects may be measured using Hard X-ray Photoelectron Spectroscopy (HAXPES) for example.

In some aspects, a spontaneously polarizable memory layer including (e.g., consisting of) the spontaneously polarizable material may be polycrystalline including a plurality of crystallites. Furthermore, the crystallites of the spontaneously polarizable memory layer may have the predefined crystallographic texture and a defect density in the predefined defect density range. As an example, a majority of the crystallites (e.g., at least 50%, e.g., at least 75%, e.g., at least 90% of the crystallites) of a spontaneously polarizable memory layer may be oriented along the same direction and therefore define a crystallographic texture. A predefined crystallographic texture of the spontaneously polarizable memory layer, as referred to herein, may refer to a crystallographic texture of the spontaneously polarizable memory layer prior to a patterning of the spontaneously polarizable memory layer. For example, the spontaneously polarizable memory layer may be formed in one or more memory areas of a carrier (e.g., of a wafer, e.g., of a glass carrier, e.g., of a polymer carrier) and may have the predefined crystallographic texture within the respective memory area. In another example, the spontaneously polarizable memory layer may be formed over the most part of a wafer surface and may have the predefined crystallographic texture in each part of the wafer surface.

The term "texture", as used herein, may describe a crystallographic texture as a property of a material or of a layer including a material. The crystallographic texture may be related to a distribution of crystallographic orientations of crystallites of a polycrystalline material. The crystallographic texture may be described by an orientation distribution function (ODF). A crystallographic texture of a layer, as referred to herein, may describe a preferred orientation of the crystallites of a polycrystalline material with reference to a surface of the layer. A crystallographic texture of a layer, as referred to herein, may describe a preferred orientation of the crystallites of a polycrystalline material with reference a direction of an external electric field caused by a voltage applied to electrodes contacting the layer. In other words, a material or layer consisting of crystallites may have no texture in the case that the orientations of the crystallites are randomly distributed. The material or layer may be regarded as a textured material or layer in the case that the orientations of the crystallites show one or more preferred directions.

For example, a (001)-texture of a spontaneously polarizable memory layer may describe that most of the crystallites of the polycrystalline material that forms at least part of the spontaneously polarizable memory layer are oriented with their (001)-lattice planes along a direction perpendicular to the (e.g., upper) surface of the spontaneously polarizable memory layer. For example, a (001)-texture of a spontaneously polarizable memory layer may describe that most of the crystallites of the polycrystalline material that forms at least part of the spontaneously polarizable memory layer are oriented with their (001)-lattice planes along a direction perpendicular to a growth direction associated with the spontaneously polarizable memory layer. As another example, a (111)-texture of a spontaneously polarizable memory layer may describe that most of the crystallites of the polycrystalline material that forms at least part of the spontaneously polarizable memory layer are oriented with their (111)-lattice planes along a direction perpendicular to the (e.g., upper) surface of the spontaneously polarizable memory layer. For example, a (111)-texture of a spontaneously polarizable memory layer may describe that most of the crystallites of the polycrystalline material that forms at least part of the spontaneously polarizable memory layer are oriented with their (111)-lattice planes along a direction perpendicular to a growth direction associated with the spontaneously polarizable memory layer.

A polarization capability of a material (dielectric, spontaneous and remanent polarization) may be analyzed using capacity measurements (e.g., a spectroscopy), e.g., via a static (C-V) and/or time-resolved measurement or by polarization-voltage (P-V) or positive-up-negative-down (PUND) measurements.

In the following, various aspects of a memory cell and/or a capacitive memory structure are described with reference to exemplary types of memory cells and/or a capacitive memory structures. It is understood that, in general, a memory structure (e.g., a spontaneously polarizable memory structure) as described herein may be a functional component that allows for providing various types of memory cells, e.g., a capacitive memory cell as exemplarily illustrated in FIG. 1, e.g., a field-effect transistor (FET) based capacitive memory cell, as exemplarily illustrated in FIG. 2, or any other type of memory cells. According to various aspects, a memory structure may include one or more electrodes and at least one memory layer coupled to the one or more electrodes, the memory layer including a remanent polarizable material. In some aspects, a memory structure may be or may include any type of a capacitive memory structure ($C_{CAP}$). A capacitive memory structure itself may be understood as a memory cell, e.g., an array of capacitive memory structures may be addressed via control lines as a memory cell arrangement. In other aspects, a capacitive memory structure may be used in combination with a transistor, e.g., a FET having its gate coupled to an electrode of the capacitive memory structure, or a capacitive memory structure included in a gate structure of the FET, as a memory cell.

FIG. 1 shows a schematic functioning of a capacitive memory structure 100, according to various aspects. The capacitive memory structure 100 may include one or more electrodes 102, 106 (e.g., one or more electrode layers) and a memory element 104 coupled to the one or more electrodes 102, 106. The memory element 104 may include or may be a memory layer disposed between two electrode layers. The memory element 104 may include or may consist of a spontaneously polarizable material, e.g., a remanent polarizable material, e.g., a ferroelectric or antiferroelectric material. Therefore, the capacitive memory structure 100 may have a capacitance, $C_{CAP}$, associated therewith. The one or more electrodes 102, 106 (e.g., the two electrodes 102, 106 in a capacitor arrangement) and the memory element 104 may form a memory layer stack 100s. In some aspects, the memory layer stack 100s may be a planar layer stack; however, other shapes may be suitable as well, e.g., curved shapes, angled shapes, coaxially aligned shapes, as examples.

In some aspects, the capacitive memory structure 100 itself may be used as a memory cell 100 in a memory cell arrangement. In other aspects, the capacitive memory structure 100 may be coupled to or integrated in another device, e.g., a field-effect transistor, and the combination of the capacitive memory structure 100 and the other device may be used as a memory cell in a memory cell arrangement. A memory element that includes or consists of a spontaneously polarizable material, e.g., a remanent polarizable material, e.g., a ferroelectric or antiferroelectric material, may be referred as spontaneously polarizable memory element. A memory layer that includes or consists of a spontaneously polarizable material, e.g., a remanent polarizable material, e.g., a ferroelectric or antiferroelectric material, may be referred as spontaneously polarizable memory layer. According to various aspects, a memory element 104 may include one or more memory layers. According to various aspects, a spontaneously polarizable memory element 104 may include one or more spontaneously polarizable memory layers.

Figure 2:
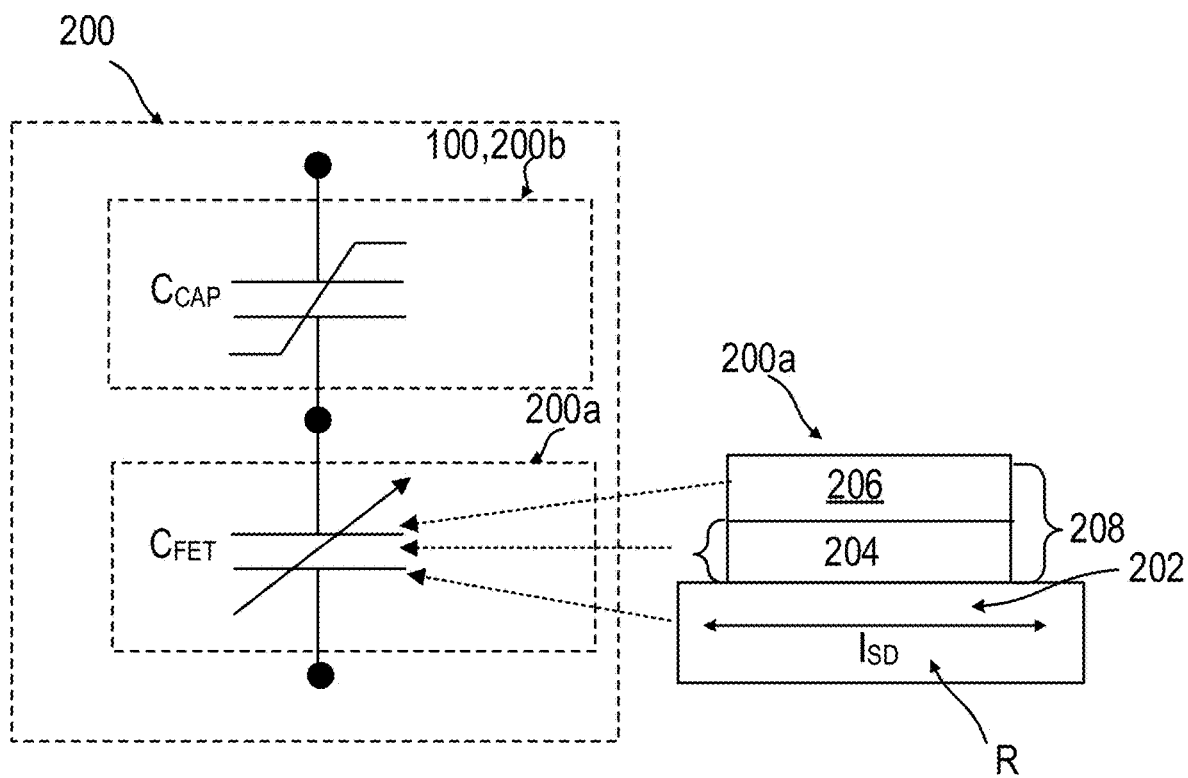
FIG. 2 shows schematically an equivalent circuit diagram of a memory cell including a capacitive memory structure, according to various aspects.

FIG. 2 shows a circuit equivalent of a memory cell 200 including a field-effect transistor structure 200a and a capacitive memory structure 200b, according to various aspects. According to various aspects, the capacitive memory structure 200b may be configured as described with reference to the capacitive memory structure 100 illustrated in FIG. 1, e.g., including one or more electrodes 102, 106 and a memory element 104 coupled to the one or more electrodes 102, 106. In other aspects, the capacitive memory structure 200b may be integrated within a gate stack 208 of the field-effect transistor structure 200a. The field-effect transistor structure 200a may include a gate structure 208, wherein the gate structure 208 may include a gate isolation 204 and a gate electrode 206. The gate structure 208 is illustrated exemplarily as a planar gate stack; however, it may be understood that the planar configuration shown in FIG. 2 is an example, and other field-effect transistor designs may include a gate structure 208 with a non-planar shape, for example a trench gate transistor design, a vertical field-effect transistor design, or other designs, such as a fin-FET design. The gate structure 208 may define a channel region 202, e.g., provided in a semiconductor portion (e.g., in a semiconductor layer, in a semiconductor die, etc.). The gate structure 208 may allow for a control of an electrical behavior (e.g., a resistance R) of the channel region 202, e.g., a current flow in the channel region 202 may be controlled (e.g., allowed, increased, prevented, decreased, etc.). In some aspects, the gate structure 208 may, for example, allow to control (e.g., allow or prevent) a source/drain current, $I_{SD}$, from a first source/drain region of the field-effect transistor structure 200a to a second source/drain region of the field-effect transistor structure 200a (the source/drains are provided in or adjacent to the channel but are not shown in FIG. 2). The channel region 202 and the source/drain regions may be formed, e.g., via doping one or more semiconductor materials or by the use of intrinsically doped semiconductor materials, within a layer and/or over a layer. With respect to the operation of the field-effect transistor structure 200a, a voltage may be provided at the gate electrode 206 to control the current flow, $I_{SD}$, in the channel region 202, the current flow, $I_{SD}$, in the channel region 102 being caused by voltages supplied via the source/drain regions. The gate electrode 206 may include an electrically conductive material. According to various aspects, the gate isolation 204 may be configured to provide an electrical separation of the gate electrode 206 from the channel region 202 and further to influence the channel region 202 via an electric field generated by the gate electrode 206. The gate isolation 204 may include one or more electrically insulating layers, as an example.

As illustrated by the circuit equivalent in FIG. 2, a first capacitance, $C_{FET}$, may be associated with the field-effect transistor structure 200a. Illustratively, the channel region 202, the gate isolation 204, and the gate electrode 206 may have a capacitance, $C_{FET}$, associated therewith, originating from the more or less conductive regions (the channel region 202 and the gate electrode 206) separated from one another by the gate isolation 204. The channel region 202 may be considered as a first capacitor electrode, the gate electrode 206 as a second capacitor electrode, and the gate isolation 204 as a dielectric medium between the two capacitor electrodes. In some aspects, the field-effect transistor structure 200a and the capacitive memory structure 100, 200b may be coupled (e.g., electrically connected) to one another such that a capacitive voltage divider is provided, as illustrated by the circuit equivalent in FIG. 2. The channel or bulk node of the field-effect transistor structure 200a may provide or may be connected to a first node, an electrode of the capacitive memory structure 100, 200b may provide or may be connected to a second node, and an intermediate conductive portion (electrode, layer, etc.) may provide or may be connected to a floating intermediate node.

Figure 3:
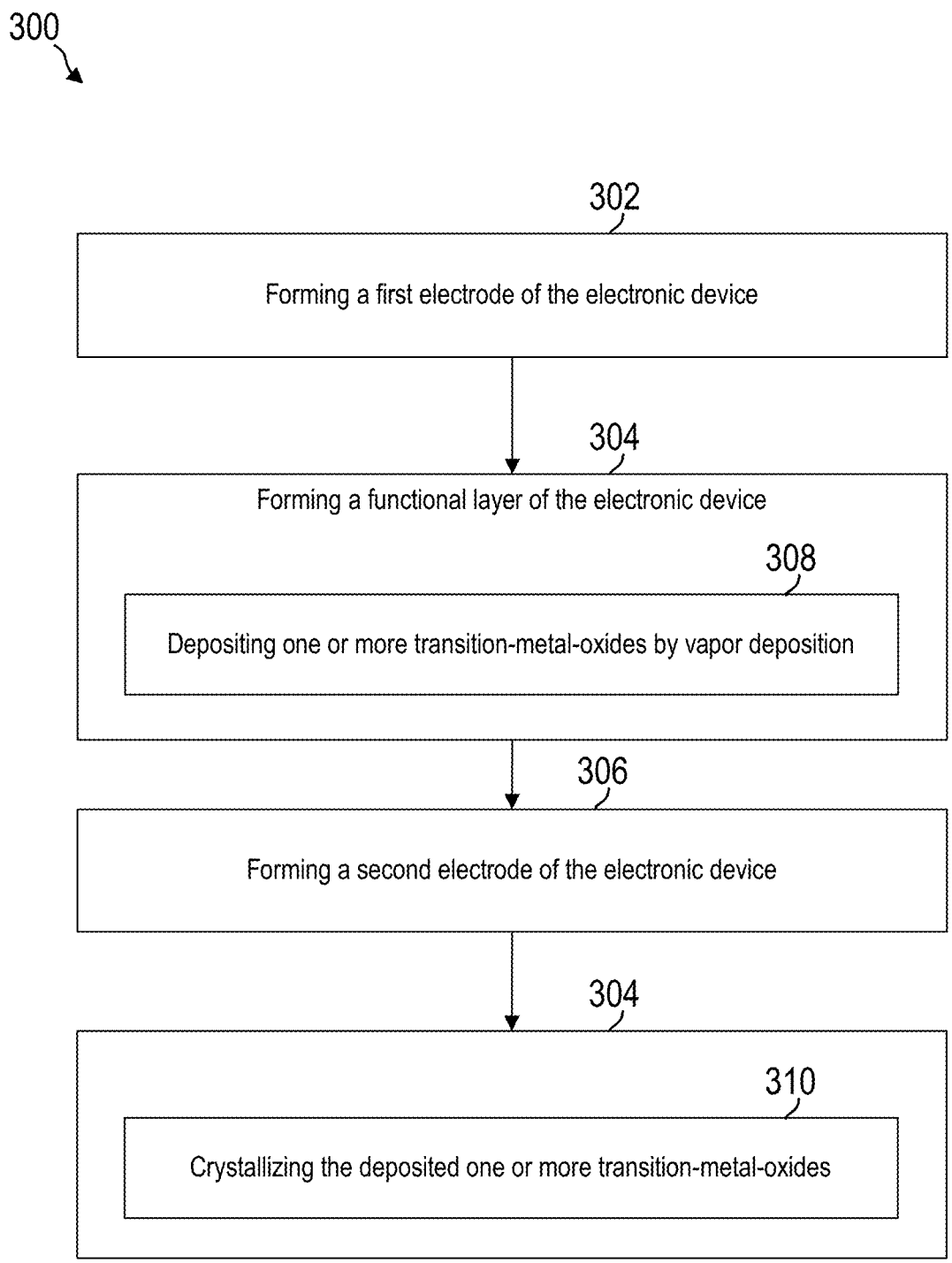

FIG. 3 shows a schematic flow diagram of a method 300 for manufacturing an electronic device (e.g., a capacitive memory structure), according to various aspects. In some aspects, the capacitive memory structure 100 may be processed by the method 300.

The method 300 may include forming a first electrode (e.g., a bottom electrode) of the electronic device (in 302). According to various aspects, the first electrode may be formed at least one of in or over a carrier, as described herein. The method 300 may further include forming a functional layer (e.g., a spontaneously polarizable memory layer) of the electronic device (e.g., of the capacitive memory structure) (in 304). In some aspects, the functional layer may be a memory layer, which includes (e.g., consists of) a spontaneously polarizable material. In other aspects, the functional layer may be piezoelectric layer of an electronic device, e.g., of a surface acoustic wave (SAW) device, of a bulk acoustic wave (BAW) device, of an electro-mechanic sensor, of an electro-mechanic actor, as examples. In still other aspects, the functional layer may be pyroelectric layer of an electronic device, e.g., of a sensor, of a thermoelectric converter, as examples. In still other aspects, the functional layer may be a spontaneously polarizable (ferroelectric or antiferroelectric) layer of an electronic device, e.g., of a sensor, of an energy storage, as examples. The method 300 may further include forming a second electrode (e.g., atop electrode) of the electronic device (in 306).

According to various aspects, in memory applications, the functional layer may be a spontaneously polarizable memory layer at least partially disposed between the first electrode and the second electrode to provide a capacitive memory structure. For example, the capacitive memory structure may correspond to the capacitive memory structure 100 and the memory layer 104 may include the spontaneously polarizable memory layer or the spontaneously polarizable memory layer may form the memory layer 104. In this case, the first electrode, the spontaneously polarizable memory layer, and the second electrode may form the memory layer stack 100s. According to various aspects, the first electrode, the spontaneously polarizable memory layer, and/or the second electrode may have a planar shape or a three-dimensional shape (e.g., as described with reference to the capacitive memory structure 500s).

The forming (in 302) of the first electrode and/or the forming (in 304) of the functional layer (e.g., the spontaneously polarizable memory layer) may be configured such that the function layer is formed with a predefined crystallographic texture (e.g., a (001)-texture or a (111)-texture) and a defect density in a predefined range (e.g., that the spontaneously polarizable memory layer formed with a predefined crystallographic texture (e.g., a (001)-texture or a (111)-texture) and a defect density in a predefined range). According to various aspects, the predefined crystallographic texture and the defect density may have a correlation with one another. For example, various defects, such as stacking faults, dislocations, antisite atoms, etc. may prohibit the predefined crystallographic texture. Illustratively, the predefined crystallographic texture may not be achieved in the case that a defect density (e.g., an ionic defect density, e.g., an electronic defect density, e.g., an open-volume defect density, etc.) is not in the predefined range. It is noted that various aspects, described herein with reference to the predefined crystallographic texture, may modify a respective defect density of one or more types of defects in order to achieve the predefined crystallographic texture, and vice versa. According to various aspects, the predefined crystallographic texture and the respective defect density in the associated predefined range may improve one or more electronic properties of the capacitive memory structure. For example, the predefined crystallographic texture and/or the defect density in the predefined range may cause a remanent polarization, $P_r$, determined in a positive-up-negative-down (PUND) measurement greater than 20 $\mu C/cm^2$ (e.g., at 3 MV/cm amplitude with 1 kHz). For example, the predefined crystallographic texture and/or the defect density in the predefined range may cause a leakage current, Leak, of less than 1 E–6 A/cm$^2$ (e.g., at ±2 MV/cm and a pad size≤10000 $\mu m^2$) after 10000 cycles at 3 MV/cm (e.g., with 100 kHz, e.g., rectangular, e.g., bipolar, e.g., a duty cycle of 50%). The leakage current, Leak, may be a current that may undesirably flow between the two electrodes of a capacitive memory structure. In some aspects, the predefined crystallographic texture and/or the defect density in the predefined range may cause a wake-up reduction to a virgin remanent polarization, $P_{r,virgin}$, for a polarization-electric field loop over the remanent polarization, $P_r$, greater than 90% ($P_{r,virgin}/P_r$>90%) during 10000 cycles at 3 MV/cm (e.g., with 100 kHz). A wake-up, as referred to herein, may refer to a change of a dielectric behavior (e.g., a characteristic of a polarization as a function of an electric field) of an as-fabricated functional structure (e.g., capacitive memory structure) as a function of a number of bipolar switching cycles, a function of applied unidirectional voltage pulses, and/or a function of an applied bias field. A wake-up-effect may describe an increase of an absolute value of the remanent polarization, $P_r$, and/or of $P_{max}$ (with $P_{max}$ being a polarization at $|E_{max}|$). A wake-up-effect may describe a change (e.g., a removal) of a constriction of a P-E loop (i.e., a polarization as a function of an electric field); in this case slopes may get steeper and/or may only show a single maximum. A wake-up, as referred to herein, may refer to a charge time associated with writing the capacitive memory structure and/or a discharge time associated with reading the capacitive memory structure. A wake-up reduction after a predefined number of cycles may refer to a reduced increase of the charge time and/or discharge time after the predefined number of cycles.

According to various aspects, spontaneously polarizable properties of a memory layer may be caused by using one or more oxidic materials, e.g., one or more TMOs. In some aspects, the defect density in oxidic materials may be an oxygen vacancy density. An oxygen vacancy density greater than an upper limit of a predefined oxygen vacancy density range may lead, for example, to a significant increase of a leakage current through the memory layer. The oxygen vacancy density may be reduced by increasing the oxygen content of the one or more oxidic materials; however, an oxygen content greater than an upper limit may lead to a failure of the spontaneously polarizable properties of the layer. Illustratively, forming the spontaneously polarizable memory layer may require in some aspects an oxygen content within a predefined range, which actually influences the oxygen vacancy density.

In the following, various aspects are described with reference a formation of a first electrode and/or of a spontaneously polarizable memory layer, which may lead to (and/or which support a formation of) a predefined crystallographic texture and a defect density in the predefined range. According to some aspects, several of the below described aspects may be combined in a method for manufacturing a capacitive memory structure to ensure a predefined crystallographic texture and a defect density in the predefined range in a memory layer of the capacitive memory structure.

Figure 4A:
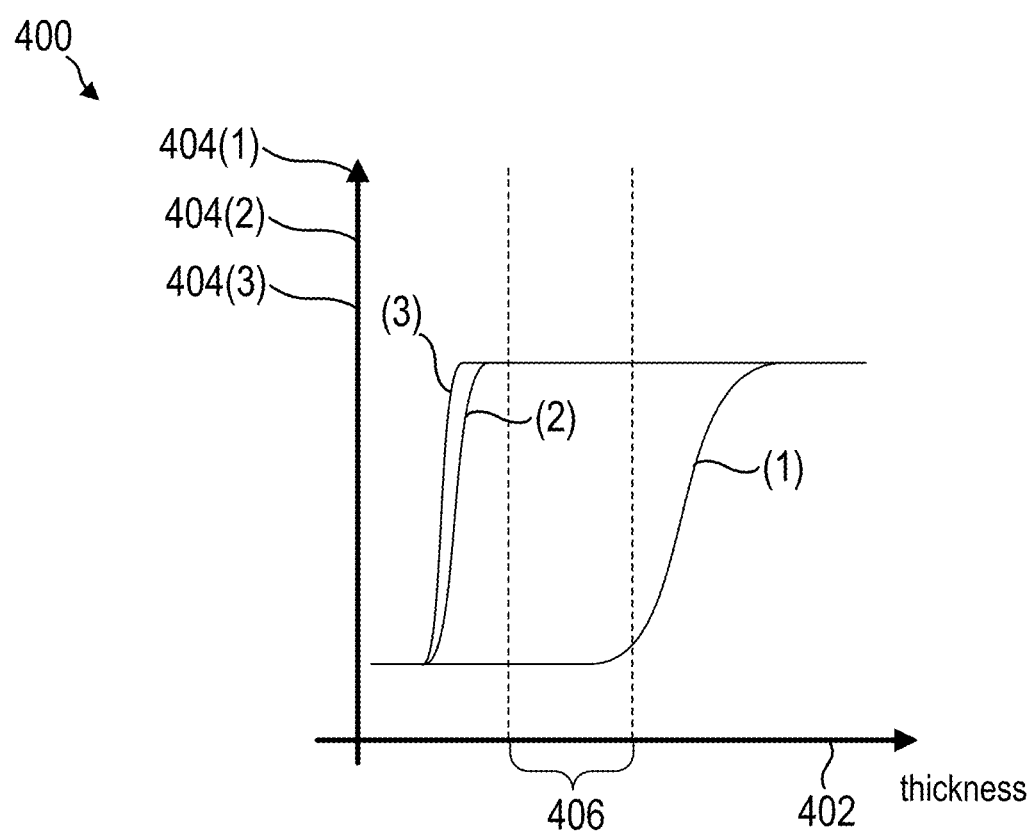
FIG. 4A shows properties of the an electrode as a function of thickness, according to various aspects.

According to various aspects, the first electrode may be formed as a first electrode layer. FIG. 4A shows properties 404(1), 404(2), 404(3) of the first electrode layer in dependence on a thickness 402 the first electrode layer. A first graph (1) shows a leakage current 404(1) of the capacitive memory structure as a function of the thickness 402 of the first electrode layer. According to various aspects, the leakage current 404(1) of the capacitive memory structure may increase significantly with the thickness 402 of the first electrode layer, in particular the leakage current 404(1) of the capacitive memory structure may increase significantly above a first threshold thickness associated with the first electrode layer. A second graph (2) shows a continuity 404(2) of the first electrode layer as a function of the thickness 402 of the first electrode layer. According to various aspects, a thickness 402 of the first electrode layer below a second threshold thickness associated with the first electrode layer may lead to a discontinuous film influencing one or more electronic properties of the capacitive memory structure and the crystallographic texture of the spontaneously polarizable memory layer. For example, an electrode conductivity 404(3) is shown in a third graph (3) indicating a significant decrease of the electrode conductivity 404(3) below a third threshold thickness associated with the first electrode layer. According to various aspects, the thickness of the first electrode may be in a predefined range 406 to control the crystallographic texture and the defect density of the spontaneously polarizable memory layer. The predefined range 406 may be in the range from about 8 nm to about 12 nm. The first graph (1), the second graph (2), and the third graph (3) may be normalized. According to various aspects, the second electrode may be or may include a second electrode layer. The continuity and/or the electrode conductivity of the second electrode layer may be depend on the thickness of the second electrode layer similar to the first electrode layer. According to various aspects, the thickness of the second electrode layer may be substantially equal to the thickness of the first electrode layer. This may lead to a symmetric stress profile of the spontaneously polarizable memory layer. The second electrode layer may have a thickness in the range from about 8 nm to about 12 nm.

According to various aspects, the thickness of the second electrode may be different from the thickness of the first electrode. This may lead to a bias within the spontaneously polarizable memory layer. According to various aspects, the composition of the second electrode may be different from composition of the first electrode. This may also lead to a bias field within the spontaneously polarizable memory layer. Illustratively, the first electrode and the second electrode may be asymmetric (e.g., with reference to thickness, e.g., with reference to composition). According to various aspects, the spontaneously polarizable memory layer may be antiferroelectric and the first electrode and second electrode may be asymmetric such that the bias field caused by the asymmetry shifts the electronic behavior of the spontaneously polarizable memory layer in one of the two loops of the antiferroelectric behavior. According to various aspects, the capacitive memory structure may be coupled with a further capacitor (e.g., a storage capacitor or a lever capacitor). The further capacitor may induce a further bias field on the capacitive memory structure. According to various aspects, the first electrode and second electrode may be asymmetric such that the further bias field caused by the further capacitor is compensated by the bias field of the capacitive memory structure. According to various aspects, a workfunction of the electrode material may be increased by inducing the bias field via asymmetry of the first electrode and the second electrode. According to various aspects, the first electrode and/or the second electrode may be doped and/or alloyed. This may also modify (e.g., increase) a workfunction of the electrode material and, thus, increasing the electronic properties of the capacitive memory structure (e.g., reducing a leakage current associated with the capacitive memory structure).

According to various aspects, different thicknesses of the second electrode and the first electrode may induce stress/strain into the spontaneously polarizable memory layer. This may allow to control the predefined crystallographic texture of the spontaneously polarizable memory layer.

With reference to FIG. 3, forming (in 304) the functional layer (e.g., the spontaneously polarizable memory layer) may include depositing one or more transition-metal-oxides by vapor deposition (in 308). According to various aspects, the vapor deposition of the one or more transition-metal-oxides may be a deposition of the one or more transition-metal-oxides from a gas phase. The vapor deposition of the one or more transition-metal-oxides may be carried out in a vacuum. For example, the vapor deposition may be a physical vapor deposition, such as sputtering. For example, the vapor deposition may be a chemical vapor deposition, such as atomic layer deposition (ALD). An atomic layer deposition, ALD, may include a plurality of ALD cycles. Each cycle of the plurality of cycles may include a transition-metal precursor pulse and a precursor pulse of oxygen for each transition-metal-oxide included in the one or more transition-metal-oxides. For example, the one or more transition-metal-oxides may include (e.g., consist of) hafnium oxide, $HfO_2$, and each ALD cycle of the plurality of ALD cycles may include a hafnium precursor pulse and the precursor pulse of oxygen. For example, the one or more transition-metal-oxides may include (e.g., consist of) hafnium zirconium oxide, $Hf_{1-x}Zr_xO_2$, and each ALD cycle of the plurality of ALD cycles may include a hafnium precursor pulse, a first precursor pulse of oxygen, a zirconium precursor pulse, and a second precursor pulse of oxygen. According to various aspects, a mixing ratio of hafnium and zirconium within the hafnium zirconium oxide, $Hf_{1-x}Zr_xO_2$, may be in the range from about 40:60 to about 60:40 (i.e., $0.4 \leq x \leq 0.6$). Other examples may include a range from about 25:75 to about 75:25 (i.e., $0.25 \leq x \leq 0.75$). It is noted that a sequence of hafnium precursor pulses and zirconium precursor pulses may be such that the desired mixing ratio of hafnium and zirconium is obtained. The hafnium precursor pulse may include any kind of precursor, which includes hafnium and is suitable for atomic layer deposition of hafnium, such as Tetrakis-(ethylmethylamido)-hafnium (TEMA-Hf) or Tetrakis-(dimethylamido)-hafnium (TDMA-Hf). The zirconium precursor pulse may include any kind of precursor, which includes zirconium and is suitable for atomic layer deposition of zirconium, such as Tetrakis-(ethylmethylamido)-zirconium (TEMA-Zr) or Tetrakis-(dimethylamido)-zirconium (TDMA-Zr). Any chemistry associated with the atomic layer deposition capable to remove ligands of the respective transition-metal-oxide precursor may be used. The precursor pulse of oxygen may include, for example, $H_2O$, $H_2O_2$, $O_2$, or $O_3$ as precursor or any other suitable oxygen-containing material. According to various aspects, an oxygen vacancy density may be modified by using $H_2O$ as a precursor in some ALD cycles and $O_3$ as a precursor in the other ALD cycles of the plurality of ALD cycles. Illustratively, using $O_3$ as a precursor may lead to a higher oxygen content and thus to a lower oxygen vacancy concentration as compared to using $H_2O$ as a precursor (considering a substantially similar pulse time). For example, a pulse time of each precursor pulse of oxygen may be in the range from about 1 second to about 30 seconds. The pulse time of a precursor pulse of oxygen in the range from about 1 second to about 30 seconds may reduce the amount of oxygen vacancies in the spontaneously polarizable memory layer 104.

According to various aspects, the oxygen vacancy density and/or oxygen content may be modified by varying a respective pulse time of the oxygen precursor of the plurality of ALD cycles. For example, the plurality of ALD cycles may include a first set of ALD cycles and a second set of ALD cycles carried out after the first set of ALD cycles. According to various aspects, the respective precursor pulse of oxygen of each ALD cycle of the first set of ALD cycles may include a pulse time in the range from about 0.1 second to about 1 second and the respective precursor pulse of oxygen of each ALD cycle of the second set of ALD cycles may include a pulse time in the range from about 1 second to about 30 seconds. Illustratively, an oxygen content within the one or more transition-metal-oxides may be reduced in a portion close to the first electrode and may be increased in a portion close to the second electrode.

According to various aspects, the one or more transition-metal-oxides may be deposited (in 308) at a temperature equal to or less than 300° C. For example, the one or more transition-metal-oxides may be deposited (in 308) by atomic layer deposition at a temperature equal to or less than 300° C. According to various aspects, the one or more transition-metal-oxides may be deposited 308 by atomic layer deposition using TDMA (e.g., TDMA-Hf, e.g., TDMA-Zr) at a temperature equal to or less than 260° C. According to various aspects, the deposition temperature associated with the atomic layer deposition may be greater than 200° C. This may ensure to remove the ligands of the respective transition-metal-oxide precursor. This may increase a stability of a ferroelectric phase of the spontaneously polarizable memory layer.

According to various aspects, forming (in 304) the functional layer (e.g., the spontaneously polarizable memory layer) may include crystallizing the deposited one or more transition-metal-oxides (in 310). According to various aspects, the deposited one or more transition-metal-oxides may be substantially amorphous prior to crystallization and may be crystalline after crystallizing the deposited one or more transition-metal-oxides. It is understood that a substantially amorphous material (e.g., the substantially amorphous deposited one or more transition-metal-oxides) may include crystallization nuclei. A crystallization nucleus may include, for example, up to 1000 atoms.

The deposited one or more transition-metal-oxides may be crystallized after forming (in 306) the second electrode of the electronic device (e.g., of the capacitive memory structure). Illustratively, a structure including the first electrode, the second electrode, and the deposited one or more transition-metal-oxides at least partially disposed between the first electrode and the second electrode may be formed and, subsequently, the deposited one or more transition-metal-oxides may be crystallized to form the spontaneously polarizable memory layer. According to various aspects, one or more portions of the deposited one or more transition-metal-oxides may be crystallized prior to forming (in 306) the second electrode of the electronic device (e.g., of the capacitive memory structure) (see, for example, FIG. 5A to FIG. 5E and the corresponding description).

According to various aspects, the deposited one or more transition-metal-oxides may be crystallized by annealing (e.g., thermally annealing) the deposited one or more transition-metal-oxides (e.g., by a post-metallization annealing, PMA). The annealing may include a furnace annealing, a flash-lamp annealing, and/or a laser annealing. The annealing may be carried out in an inert gas atmosphere (e.g., nitrogen, e.g., argon) at any suitable pressure, e.g., at atmospheric pressure, at a pressure below atmospheric pressure, or at a pressure above atmospheric pressure. In some aspects, the annealing may be carried out in a vacuum. A vacuum in a processing chamber (e.g., for depositing a material and/or for annealing a material) may be provided in a pressure range below 50 mbar. According to various aspects, the one or more transition-metal-oxides may be annealed using a laser annealing and/or a flash-lamp annealing of the deposited one or more transition-metal-oxides with local temperatures in the range from about 1500° C. to about 1850° C. The local temperatures in the range from about 1500° C. to about 1850° C. may result in homologous temperature, $T_H$, of the capacitive memory structure given by a temperature, T, over a melting temperature of the one or more transition-metal-oxides, $T_{melt}$, in the range from about 0.6 to about 0.7 or greater than 0.7.

According to various aspects, the second electrode may be deposited (in 306) at a temperature below 50° C. (e.g., at room temperature such as 25° C.). This may reduce (e.g., prohibit) a nucleation and/or crystallization of the deposited one or more transition-metal-oxides during deposition of the second electrode. The reduced crystallization of the one or more transition-metal-oxides during deposition of the second electrode may allow for a formation of the spontaneously polarizable memory layer with a predefined texture.

Figure 4B:
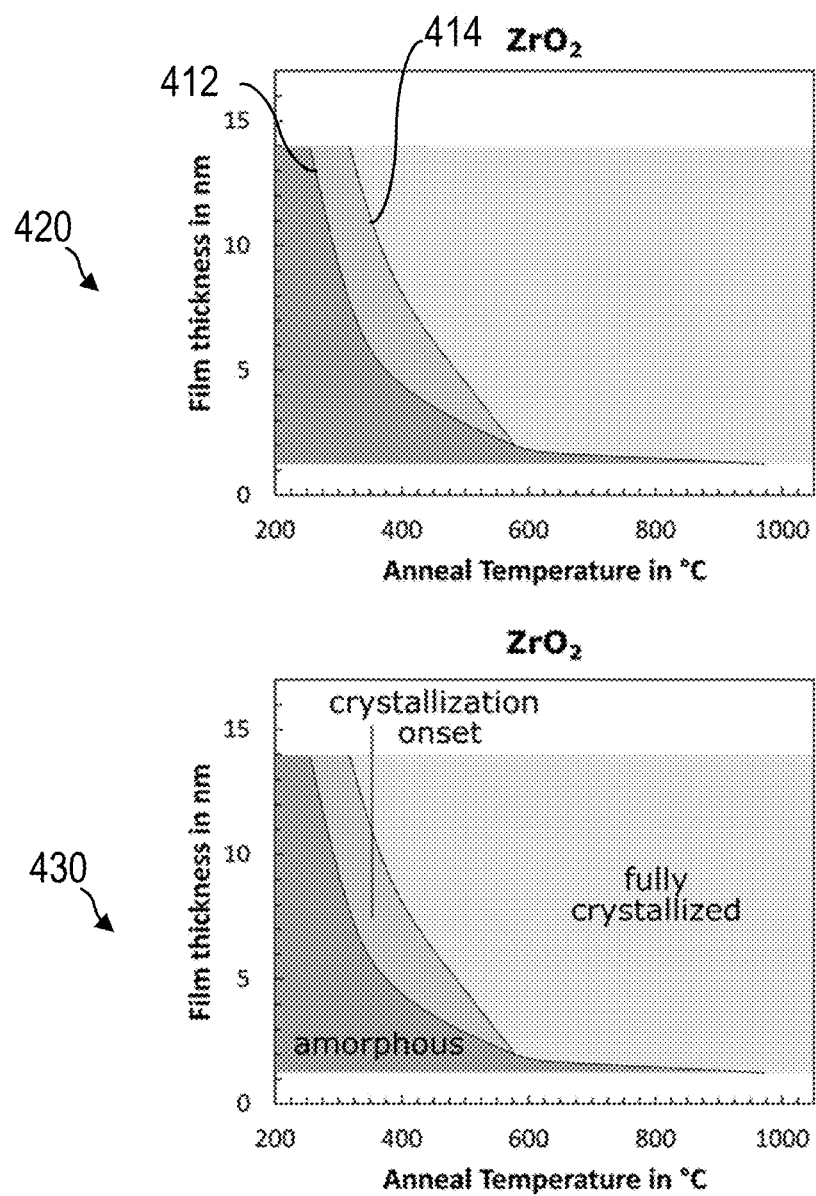
FIG. 4B and FIG. 4C each show a structure of a transition-metal-oxide as a function of thickness and temperature, according to various aspects.
Figure 4C:
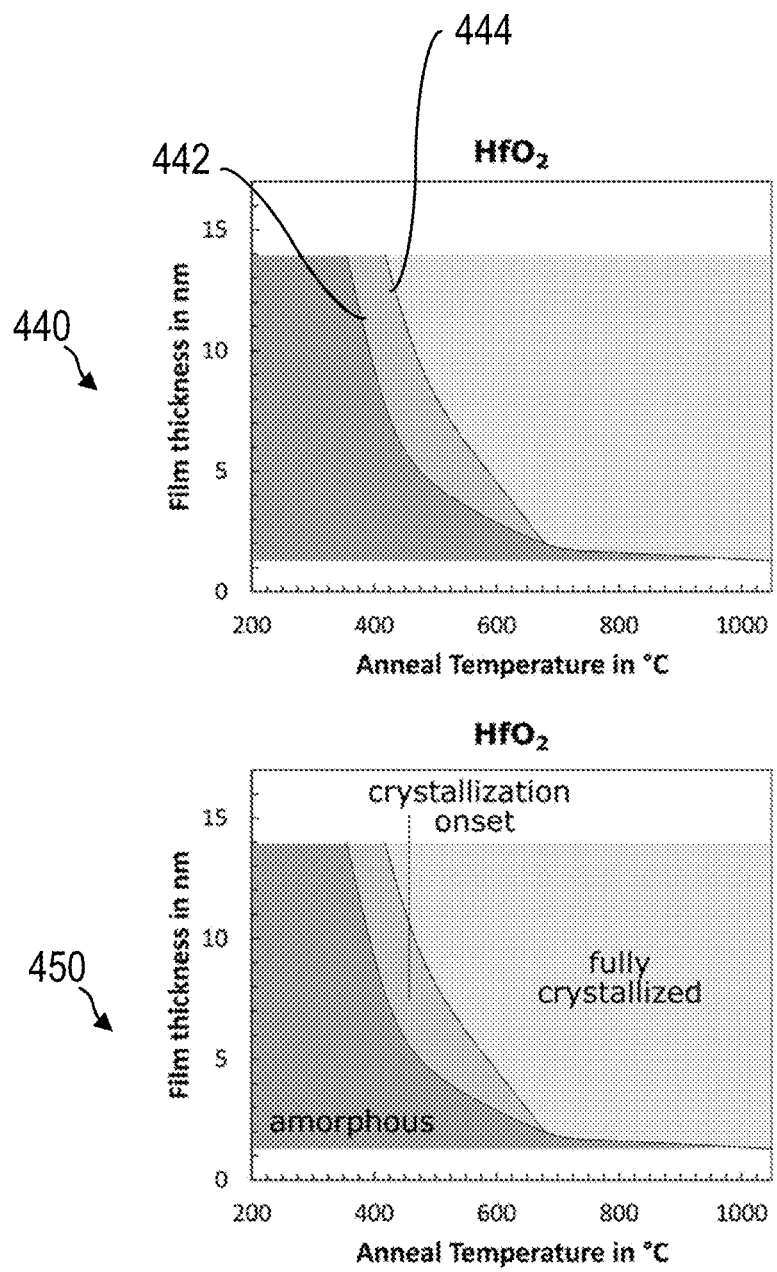

FIG. 4B and FIG. 4C each show graphs illustrating a structure of the one or more transition-metal-oxides (e.g., zirconium oxide, e.g., hafnium oxide, e.g., hafnium zirconium oxide) as a function of a thickness of the one or more transition-metal-oxides and a temperature.

FIG. 4B shows a structure of zirconium oxide as a function of thickness and temperature. Illustratively, a crystallization onset boundary 412, which depends on the thickness and temperature, at which nucleation (see crystallization onset boundary 412 in graph 420) and/or crystallization of the one or more transition-metal-oxides is initiated. A crystallization completion boundary 414 indicates a full crystallization. Graphs 420 and 430 graphically show an amorphous regime at temperatures less than the crystallization onset boundary 412, a crystallization onset regime at temperatures in the range from the crystallization onset boundary 412 to the crystallization completion boundary 414, and a fully crystallized regime at temperatures greater than the crystallization completion boundary 414.

FIG. 4C shows a structure of hafnium oxide as a function of thickness and temperature. Graphs 440 and 450 show an amorphous regime of hafnium oxide at temperatures less than a crystallization onset boundary 442, a crystallization onset regime of hafnium oxide at temperatures in the range from the crystallization onset boundary 442 to a crystallization completion boundary 444, and a fully crystallized regime of hafnium oxide at temperatures greater than the crystallization completion boundary 444. Graphs 440 and 450 show that a crystallization temperature of hafnium oxide may be about 100° C. greater than a crystallization temperature of zirconium oxide (see graphs 420, 430 in FIG. 4B).

According to various aspects, the one or more transition-metal-oxides may be or may include hafnium zirconium oxide, $Hf_{1-x}Zr_xO_2$. In this case, a crystallization onset boundary and a crystallization completion boundary of hafnium zirconium oxide may be a ratio of the respective boundaries of zirconium oxide (boundaries 412, 414) and the respective boundaries of hafnium oxide (boundaries 442, 444) in accordance with a stoichiometry (i.e., x) of hafnium zirconium oxide, $Hf_{1-x}Zr_xO_2$.

As described herein, in the case of atomic layer deposition, a growth temperature greater than 200° C. may be required to remove the ligands of the transition-metal-oxide precursor. The one or more transition-metal-oxides may be deposited such that the one or more transition-metal-oxides are amorphous. Hence, as shown in FIG. 4B and FIG. 4C, a maximum thickness of the deposited one or more transition-metal-oxides may be in the range from about 12 nm to about 20 nm (depending on the material of the one or more transition-metal-oxides) since otherwise nucleation may occur. As described herein, the maximum thermal budget to crystallize the one or more transition-metal-oxides may be, for example, about 400° C. Hence, as shown in FIG. 4B in the case of zirconium oxide, a minimum thickness of the deposited one or more transition-metal-oxides may be about 8 nm since otherwise no crystallization may occur at about 400° C. within a time in the range from about 1 second to about 5 seconds. The minimum thickness of the deposited one or more transition-metal-oxides may be lower than 8 nm in the case of an annealing time greater than 1 min (e.g., an annealing time greater than 1 h). As an example, in the case of an annealing at about 400° C. for a time of about 1 h, the minimum thickness of the deposited one or more transition-metal-oxides to crystallize the one or more transition-metal-oxides may be in the range from about 4 nm to about 6 nm. In the case of hafnium oxide, a minimum thickness of the deposited one or more transition-metal-oxides may be greater than for zirconium oxide.

As described herein, doping the one or more transition-metal-oxides with one or more trivalent dopants may increase the crystallization temperature. For example, doping the one or more transition-metal-oxides with lanthanum and/or silicon may increase the crystallization temperature (e.g., to achieve ferroelectric properties of the spontaneously polarizable memory layer) by a temperature equal to or greater than 150° C. (e.g., by a temperature in the range from about 150° C. to about 200° C.). For example, doping the one or more transition-metal-oxides with silicon to achieve antiferroelectric properties of the spontaneously polarizable memory layer may increase the crystallization temperature by a temperature equal to or greater than 200° C. For example, doping the one or more transition-metal-oxides with aluminum may increase the crystallization temperature (e.g., to achieve ferroelectric properties of the spontaneously polarizable memory layer) by a temperature equal to or greater than 100° C. (e.g., by a temperature in the range from about 100° C. to about 150° C.). For example, doping the one or more transition-metal-oxides with aluminum to achieve antiferroelectric properties of the spontaneously polarizable memory layer may increase the crystallization temperature by a temperature equal to or greater than 150° C. For example, doping the one or more transition-metal-oxides with scandium, ytterbium, yttrium and/or gadolinium may increase the crystallization temperature (e.g., to achieve ferroelectric properties of the spontaneously polarizable memory layer) by about 50° C. For example, the one or more transition-metal-oxides may be doped with silicon in the range from about 1 cation percent (cat %) to about 12 cat % of silicon. For example, the one or more transition-metal-oxides may be doped with aluminum in the range from about 1 cat % to about 12 cat % of aluminum. For example, the one or more transition-metal-oxides may be doped with germanium in the range from about 5 cat % to about 30 cat % of germanium. For example, the one or more transition-metal-oxides may be doped with lanthanum in the range from about 3 cat % to about 12 cat % of lanthanum.

According to various aspects, the spontaneously polarizable memory layer may be formed by a plurality of sublayer processes. Each sublayer process may include a deposition of one or more materials (e.g., one or more transition-metal-oxides) and a crystallizing of the deposited one or more materials (see, for example, FIG. 5A to FIG. 5I and corresponding description). Forming the spontaneously polarizable memory layer by a plurality of sublayer processes may be a measure which leads to (and/or which support a formation of) a predefined crystallographic texture and a defect density in the predefined range.

Figure 5A:
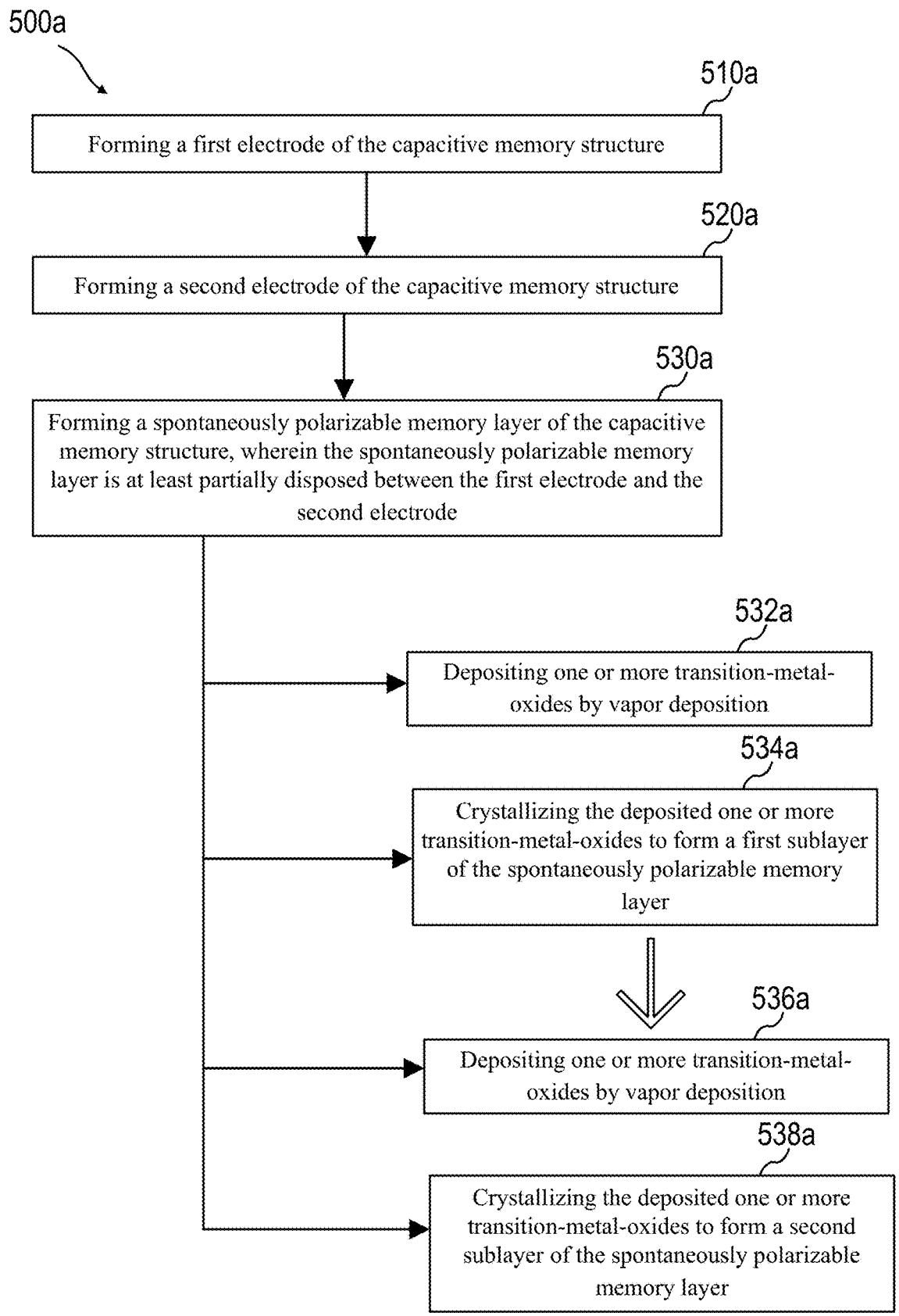

FIG. 5A shows a schematic flow diagram of a method 500a for manufacturing a capacitive memory structure 500, according to various aspects. The method 500a may include, in 510a, forming a first electrode of the capacitive memory structure. The method 500a may further include, in 520a, forming a second electrode of the capacitive memory structure. The method 500a may include, in 530a, forming a spontaneously polarizable memory layer of the capacitive memory structure, wherein the spontaneously polarizable memory layer is at least partially disposed between the first electrode and the second electrode.

According to various aspects, forming the spontaneously polarizable memory layer may include, e.g., in 532a, depositing one or more transition-metal-oxides by vapor deposition, and, e.g., in 534a, crystallizing the deposited one or more transition-metal-oxides to form a first sublayer of the spontaneously polarizable memory layer. Furthermore, forming the spontaneously polarizable memory layer may include, e.g., subsequently to 532a, 534a, e.g., in 536a, depositing one or more transition-metal-oxides by vapor deposition, and, e.g., in 538a, crystallizing the deposited one or more transition-metal-oxides to form a second sublayer of the spontaneously polarizable memory layer.

Figure 5B:
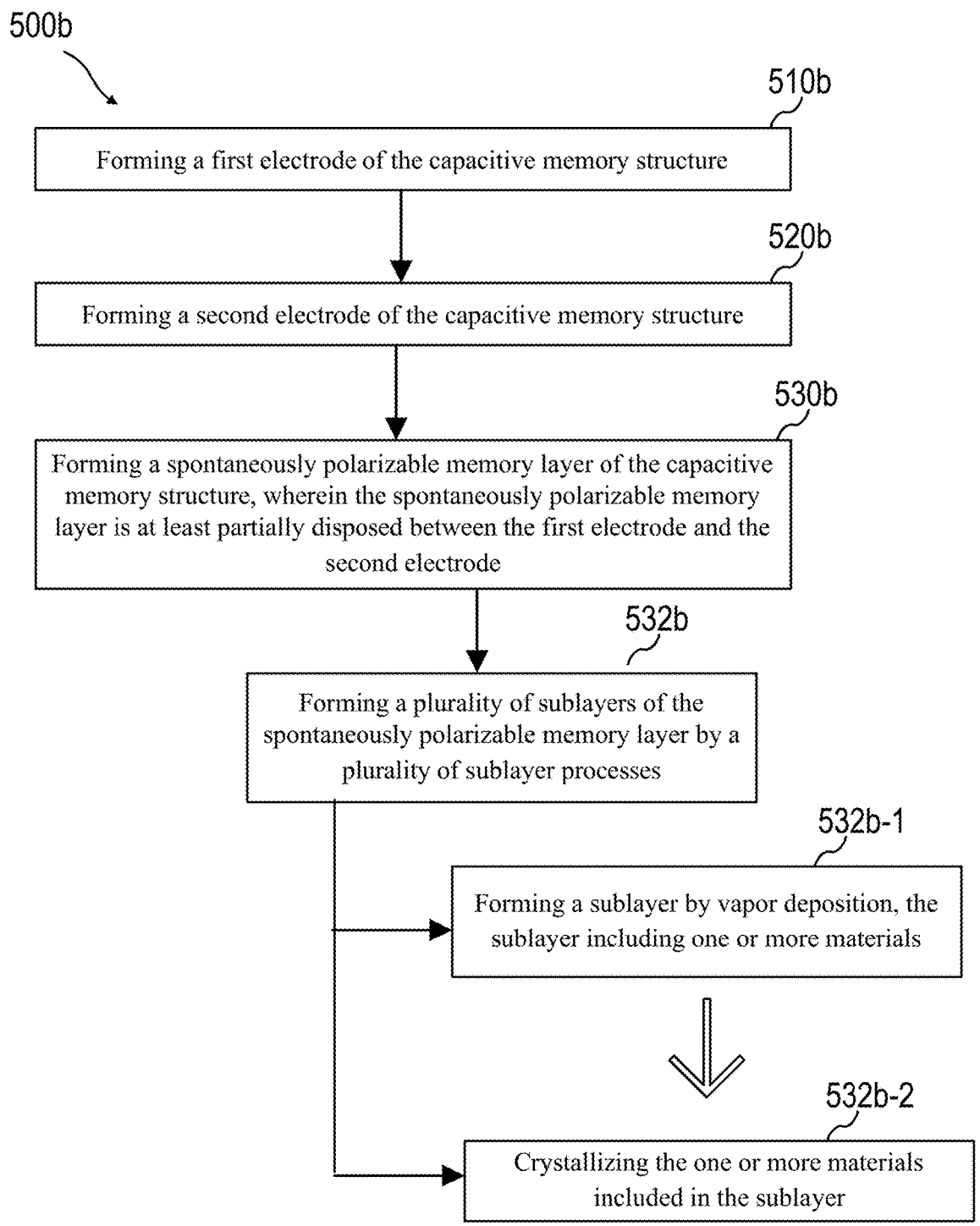
Figure 5C:
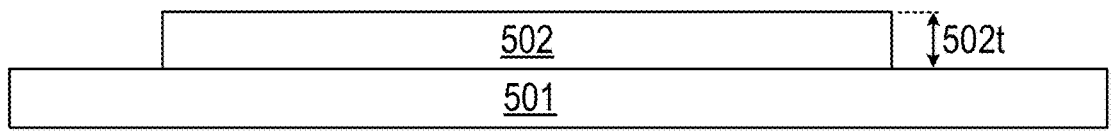
FIG. 5C to FIG. 5I show schematically a manufacturing or at least parts of a manufacturing process of an electronic device, e.g., of a capacitive memory structure, according to various aspects.
Figure 5D:
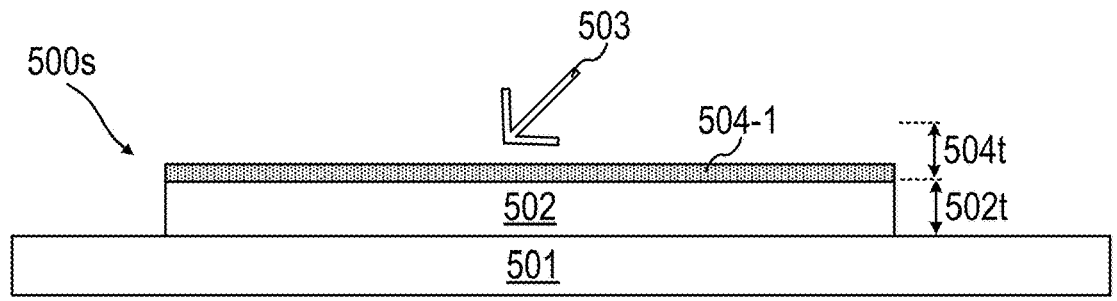
Figure 5E:
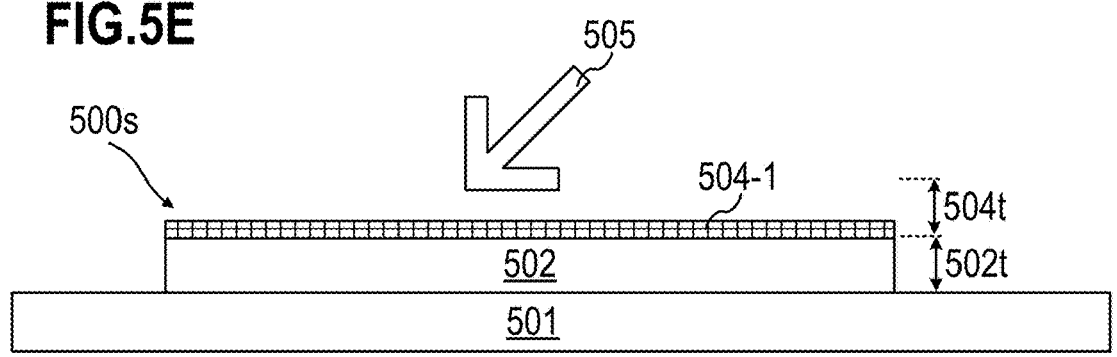
Figure 5F:
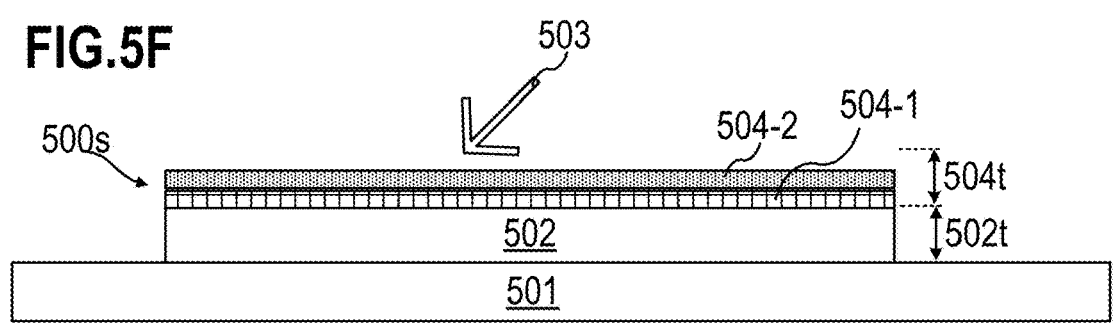
Figure 5G:
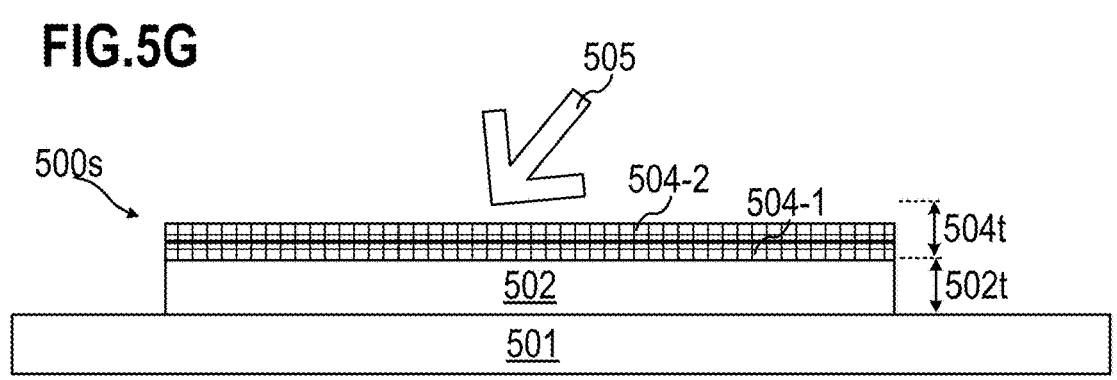

FIG. 5B shows a schematic flow diagram of a method 500b for manufacturing a capacitive memory structure 500, according to various aspects. The method 500b may include, in 510b, forming a first electrode of the capacitive memory structure. The method 500b may further include, in 520b, forming a second electrode of the capacitive memory structure. The method 500b may further include, in 530b, forming a spontaneously polarizable memory layer of the capacitive memory structure, wherein the spontaneously polarizable memory layer is at least partially disposed between the first electrode and the second electrode.

According to various aspects, forming the spontaneously polarizable memory layer may include, e.g., in 532b, forming a plurality of sublayers of the spontaneously polarizable memory layer by a plurality of sublayer processes. According to various aspects, each sublayer process may include, e.g., in 532b-1, forming a sublayer by vapor deposition, the sublayer including one or more materials, and, subsequently, e.g., in 532b-2, crystallizing the one or more materials included in the sublayer.

Various aspects of the method 500a and/or the method 500b described with reference to forming the first electrode, forming the second electrode, and/or forming the spontaneously polarizable memory layer may also apply to the method 300, and vice versa. For example, forming (in 304) the functional layer (e.g., the spontaneously polarizable memory layer) according to method 300 may include the formation of sublayers according to method 500a or method 500b. For example, forming 510a, 510b the first electrode and/or forming 530a, 530b the spontaneously polarizable memory layer according to method 500a, 500b may include one or more of the measures which lead to and/or support the formation of the predefined crystallographic texture and the defect density in the predefined range (e.g., as described with reference to FIG. 3 and FIG. 6A to FIG. 12B).

FIG. 5C, FIG. 5D, FIG. 5E, FIG. 5F, FIG. 5G, FIG. 5H, and FIG. 5I show schematically a manufacturing or at least parts of a manufacturing process of a capacitive memory structure 500s, according to various aspects. According to various aspects, a first electrode 502 may be formed, see, for example, FIG. 5C. The first electrode 502 may be formed over a substrate 501, in a substrate 501, and/or directly on a substrate 501. The first electrode 502 may be formed as a layer. The structure (e.g., the substrate, e.g., an electronic structure such as a transistor stack, as examples) underlying the first electrode 502 may have a planar shape. In this case, the first electrode 502 may be formed by any type of vapor deposition, e.g., chemical or physical vapor deposition (e.g., sputtering, e.g., atomic layer deposition, as examples). In another aspect, the structure (e.g., the substrate, e.g., an electronic structure such as a transistor stack, as examples) underlying the first electrode 502 may have a three-dimensional shape (e.g., may include a patterned layer, e.g., a fin structure, a trench structure, as examples). In this case, the first electrode 502 may be formed by a suitable type of vapor deposition that allows for a conformal deposition of the first electrode 502 as a conformal layer, e.g., atomic layer deposition, as example.

According to various aspects, the substrate 501 may include or may be a silicon substrate e.g., with or without a (e.g., native) $SiO_2$ surface layer, or any other suitable semiconductor substrate. In other aspects, the substrate may include or may be a non-conductive substrate, e.g., a glass substrate. According to various aspects, the first electrode 502 may be a bottom electrode of the capacitive memory structure 500s.

In some aspects, the first electrode 502 may be formed by repeated alternations (e.g., two or more alternations) of depositions and crystallizations (e.g., crystallization anneals) until the final layer thickness 502t is achieved for the first electrode 502. The final layer thickness 502t of the first electrode 502 may be, for example, in the range from about 3 nm to about 20 nm. This may allow for providing the first electrode 502 with a predefined texture and/or with a predefined, a lowest possible, defect density.

According to various aspects, forming the first electrode 502 by sputtering may offer to adapt a plurality of process parameters to alter the growth mode of the layers. The process parameters that can be varied during an atomic layer deposition process may be rather limited. Therefore, an intra layer anneal approach, as described herein, may be particularly attractive for 3D-integration that may require an atomic layer deposition.

According to various aspects, the intra layer anneal approach—e.g., including repeated alternations (e.g., two or more alternations) of depositions and crystallizations until a final layer thickness is achieved—can be used for any choice of electrode material, including but not limited to the following materials, titanium nitride (TiN), tantalum nitride (TaN), tungsten (W), ruthenium (Ru), iridium (Ir), platinum (Pt), palladium (Pd), molybdenum (Mo), ruthenium oxide ($RuO_2$), iridium oxide ($IrO_2$), as examples.

According to various aspects, a memory layer 504 (e.g., a spontaneously polarizable memory layer 504) may be formed, see, for example, FIG. 5D to FIG. 5H. The memory layer 504 may be formed over the substrate 501, in the substrate 501, and/or directly on the substrate 501. The memory layer 504 may be formed over, e.g., directly on, the first electrode 502. The structure (e.g., the substrate, e.g., an electronic structure such as a transistor stack, the first electrode 502, as examples) underlying the memory layer 504 may have a planar shape. In this case, the memory layer 504 may be formed by any type of vapor deposition, e.g., chemical or physical vapor deposition (e.g., sputtering, e.g., atomic layer deposition, as examples). In another aspect, the structure (e.g., the substrate, e.g., an electronic structure such as a transistor stack, the first electrode 502, as examples) underlying the memory layer 504 may have a three-dimensional shape (e.g., may include a patterned layer, e.g., a fin structure, a trench structure, as examples). In this case, the memory layer 504 may be formed by a suitable type of vapor deposition that allows for a conformal deposition of the memory layer 504 as a conformal layer, e.g., atomic layer deposition, as example.

In general, thin layers of a material may exhibit a polycrystalline microstructure, e.g., with an almost random orientation distribution of the crystals. An untextured layer may have no substantially preferred crystal orientation, e.g., the distribution of crystallographic orientations of a polycrystalline sample may be random. However, in some aspects, a textured layer (or in other words a textured material) may be preferred in the case that memory-states are to be stored based on polarization of a spontaneously polarizable material since a textured spontaneously polarizable material may have a better performance with respect to the remanence and/or the switching behavior, only as examples. According to various aspects, a spontaneously polarizable material may be provided as the memory layer, wherein the spontaneously polarizable material has either a (001)-texture (e.g., a majority of the crystals may be oriented with the (001)-crystal direction substantially perpendicular to the layer surface) or a (111)-texture (e.g., a majority of the crystals may be oriented with the (111)-crystal direction substantially perpendicular to the layer surface). The (001)-texture may be a (001)-fiber-texture or a (001)-biaxial-texture. The (111)-texture may be a (111)-fiber-texture or a (111)-biaxial-texture. In general, the crystallographic texture may be described by the orientation distribution function (ODF), wherein x-ray diffraction patterns (e.g., pole-figure measurements, e.g., theta-2theta x-ray diffraction measurements with a scattering vector in plane-normal direction, such as perpendicular to a surface of electrodes of a planar capacitive memory structure) or other suitable measurements, e.g., based on transmission electron microscopy, electron backscatter diffraction (EBSD), or transmission Kikuchi diffraction (TKD), may be used to determine the orientation of the crystalline grains of the material.

According to various aspects, the texture of the spontaneously polarizable material of the memory layer 504 may be substantially the same as the texture of the material of the bottom electrode 502. In some aspects, the texture of the bottom electrode 502 may define the texture of the memory layer 504.

According to various aspects, the memory layer 504 may be a functional layer of the capacitive memory structure 500s. In some aspects, the memory layer 504 may be formed by repeated alternations (e.g., two or more alternations) of depositions (503), e.g., sputter depositions or atomic layer depositions, and crystallizations (505), e.g., crystallization anneals, until the final layer thickness 504t is achieved for the memory layer 504, see FIG. 5H. The final layer thickness 504t of the memory layer 504 may be, for example, in the range from about 3 nm to about 20 nm, e.g., in the range from about 8 nm to about 12 nm. This may allow for providing the memory layer 504 with a predefined texture and/or with a predefined, a lowest possible, defect density.

According to various aspects, forming the memory layer 504 by sputtering may offer to adapt a plurality of process parameters to alter the growth mode of the layers. The process parameters to be used for an atomic layer deposition process may be rather limited. Therefore, an intra layer anneal approach, as described herein, may be particularly attractive for 3D-integration that may require an atomic layer deposition.

According to various aspects, the intra layer anneal approach—e.g., including repeated alternations (e.g., two or more alternations) of depositions and crystallizations until a final layer thickness is achieved—can be used for any choice of spontaneously polarizable material, including but not limited to the following materials, doped or undoped hafnium oxide ($HfO_x$), doped or undoped zirconium oxide ($ZrO_x$), doped or undoped hafnium/zirconium oxide (($Hf, Zr)O_x$), as examples.

According to various aspects, it was found that a random orientation of crystallites in the remanent polarizable material (e.g., in a ferroelectric material) of the memory layer 504 may results in a remanent polarization, $P_r$, of about only 50% of the maximum remanent polarization even if the remanent polarizable phase fraction (e.g., the ferroelectric phase fraction) is about 100%. Furthermore, it was found that the grains in the memory layer 504 may give rise to ionic defects and/or electronic defects. Furthermore, it was found that, in a ferroelectric material, domain boundaries can be charged and/or be conductive depending on the polarization configuration and on whether they are parallel or inclined to the polarization direction.

For layer growth and crystallization behavior, the so-called homologous temperature $T_H$ (a processing temperature relative to the melting temperature) may be an important parameter. The larger the homologous temperature, the larger is the mobility of atoms in the volume and at the surface. At a given processing temperature, a high melting temperature means that the atoms are not as mobile as for a material with a lower melting temperature. While lead zirconate titanate (PZT) has a melting temperature in the range of 1300 C to 1550° C., that of $HfO_2$ and $ZrO_2$ is, for example, around 2700° C. to 2800° C. Therefore, with an 800° C. anneal temperature, the homologous temperature is in the range of 0.6 to 0.7 for PZT, which is close to what sintering for ceramics usually may need. For $HfO_2$ and/or $ZrO_2$, such an anneal temperature represents a homologous temperature of about 0.35. This may explain why it is relatively easy to achieve oriented PZT films, but it may be very complex to achieve oriented $HfO_2$ and/or $ZrO_2$ films. Considering such aspects, one or more of the following aspects for an annealing process may be relevant:

To achieve $T_H$=0.6-0.7 in the anneal for materials like $HfO_2$ and/or $ZrO_2$, a temperature in the range from 1500° C. to 1850° C. would be required, which may not be possible with conventional rapid thermal annealing tools and/or which may not be permissible in the CMOS technology, e.g., front-end of line or back-end of line processes may be limited to a temperature below 1000° C.

Considering such aspects, one or more of the following aspects for a deposition process may be relevant:

One approach may include depositing a material already in a crystallized state. This may require a certain energy supply, which may be limited in some deposition processes, e.g., in an atomic layer deposition process usually by the atomic layer deposition window of the precursors used.

An amorphously deposited layer may tend to nucleate homogeneously (i.e. in the volume of the layer). According to various aspects, it was found that a layer can be forced into the regime of heterogeneous nucleation by reducing the layer thickness prior to an anneal step to below the typical grain radius found for heterogeneous nucleation.

Therefore, it may be beneficial to perform a crystallization (in 505) after depositing (in 503) a thin sublayer, e.g., a sublayer with a layer thickness on the range from about 1 nm to about 4 nm. The sublayer may be amorphously deposited by atomic layer deposition. However, a trade-off may be found as follows: A lower layer thickness may be beneficial to induce a heterogeneous nucleation during an annealing process, but the crystallization temperature may increase as the layer thickness decreases, see FIG. 4B and FIG. 4C.

In the following, various aspects of a method for processing (e.g., manufacturing) a capacitive memory structure (e.g., capacitive memory layer stack, a capacitive memory cell, as examples) are described. Aspects may be related to processes during manufacture of the capacitive memory structure, e.g., during manufacture of the capacitive memory structure 500s described herein:

at a first time, an amorphous layer may be deposited; and at a second time after the first time, e.g., after the amorphous layer has been deposited, the deposited amorphous layer may be subjected to a temperature treatment (also referred to as an anneal) to at least induce partial crystallization of the layer and/or to at least induce formation of crystal nuclei with a crystallographic orientation that is not random.

Aspects may be related to processes during manufacture of the capacitive memory structure, e.g., during manufacture of the capacitive memory structure 500s described herein:

in a first sub-process, depositing an amorphous layer; and (e.g., subsequently)

in a second sub-process after the first sub-process, e.g., after the amorphous layer has been deposited, annealing the deposited amorphous layer to at least induce partial crystallization of the layer and/or to at least induce formation of crystal nuclei with a crystallographic orientation that is not random. The first sub-process and the second sub-process may be executed multiple times (e.g., two times, three times, up to five times, up to ten times, as examples), wherein the first sub-process step followed by the second first sub-process until a desired layer thickness is reached.

Aspects may be related to processes during manufacture of the capacitive memory structure, wherein, in a first example, a solid solution of hafnium zirconium oxide ($H_2O$) is deposited by an intra layer anneal process, as described herein. The intra layer anneal process may include:

depositing an about 3 nm thick layer of $H_2O$ via atomic layer deposition; and (e.g., subsequently)

annealing the about 3 nm thick layer of $H_2O$ after its deposition, e.g., at a temperature of about 400° C. for a duration in the range from about 1 s to about 5 min, as example, wherein the depositing and the annealing are repeated in total three to four times until about 10 nm layer thickness is reached.

Aspects may be related to processes during manufacture of the capacitive memory structure, wherein, in a second example, a solid solution of hafnium zirconium oxide ($H_2O$) is deposited by an intra layer anneal process, as described herein. The intra layer anneal process may include:

depositing an about 1 nm thick layer of $H_2O$ via atomic layer deposition; and (e.g., subsequently)

annealing the about 1 nm thick layer of H₂O after its deposition, e.g., at a temperature of about 600° C. for a duration in the range from about 1 s to about 5 min, as example, wherein the depositing and the annealing are repeated in total ten times until about 10 nm layer thickness is reached.

Aspects may be related to processes during manufacture of the capacitive memory structure, wherein, in a third example, a super-lattice of hafnium zirconium oxide (H₂O) is deposited by an intra layer anneal process, as described herein. The intra layer anneal process may include:

depositing an about 1.5 nm thick layer of hafnium oxide (HfO$_x$) via atomic layer deposition; (e.g., subsequently)

annealing the about 1.8 nm thick layer of hafnium oxide after its deposition, e.g., at a temperature of about 550° C. for a duration in the range from about 15 s to about 25 s, as example; (e.g., subsequently)

depositing an about 1.8 nm thick layer of zirconium oxide (ZrO$_x$) via atomic layer deposition; (e.g., subsequently)

annealing the about 1.8 nm thick layer of hafnium oxide after its deposition, e.g., at a temperature of about 450° C. for a duration in the range from about 40 s to about 50 s, as example;

wherein the depositing and the annealing of the hafnium oxide and the depositing and the annealing of the zirconium oxide are repeated in total three times until about 10 nm layer thickness is reached.

Aspects may be related to processes during manufacture of the capacitive memory structure, wherein, in a fourth example, a (e.g., gadolinium, Gd) doped hafnium zirconium oxide (Gd:HfO$_x$) is deposited by an intra layer anneal process, as described herein. The intra layer anneal process may include:

depositing an about 1 nm thick layer of doped (e.g., 4 cat % Gd-doped) hafnium oxide via atomic layer deposition; and (e.g., subsequently) annealing the about 1 nm thick layer of layer of doped hafnium oxide after its deposition, e.g., at a temperature of about 600° C. for a duration in the range from about 1 s to about 10 s, as example, wherein the depositing and the annealing are repeated in total ten times until about 10 nm layer thickness is reached. The term "cat %" may described a cation-percent (cationic ratio) in the doped material.

Aspects may be related to processes during manufacture of the capacitive memory structure, wherein, in a fifth example, a bottom electrode and solid solution of hafnium zirconium oxide (H₂O) are deposited by a respective intra layer anneal process, as described herein. The intra layer anneal processes may include:

depositing an about 2.5 nm thick layer of tungsten (W) via atomic layer deposition; and (e.g., subsequently)

annealing the about 2.5 nm thick layer of tungsten after its deposition, e.g., at a temperature of about 400° C. for a duration in the range from about 20 s to about 40 s, as example, wherein the depositing and the annealing of the tungsten layer are repeated in total four times until about 10 nm layer thickness is reached; and (e.g., subsequently) depositing an about 2 nm thick layer of H₂O via atomic layer deposition; and (e.g., subsequently)

annealing the about 2 nm thick layer of H₂O after its deposition, e.g., at a temperature of about 450° C. for a duration in the range from about 20 s to about 40 s, as example, wherein the depositing and the annealing of the H₂O layer are repeated in total five times until about 10 nm layer thickness is reached.

Aspects may be related to processes during manufacture of the capacitive memory structure, wherein, in a fifth example, a bottom electrode and solid solution of hafnium zirconium oxide (H₂O) are deposited by a respective intra layer anneal process, as described herein. The intra layer anneal processes may include:

depositing an about 2 nm thick layer of ruthenium (Ru) via sputter deposition; and (e.g., subsequently)

annealing the about 2 nm thick layer of ruthenium after its deposition, e.g., at a temperature of about 400° C. for a duration in the range from about 50 s to about 70 s, as example, wherein the depositing and the annealing of the tungsten layer are repeated in total five times until about 10 nm layer thickness is reached; and (e.g., subsequently)

depositing an about 1 nm thick layer of H₂O via atomic layer deposition; and (e.g., subsequently), annealing the about 1 nm thick layer of H₂O after its deposition, e.g., at a temperature of about 550° C. for a duration in the range from about 50 s to about 70 s, as example, wherein the depositing and the annealing of the H₂O layer are repeated in total ten times until about 10 nm layer thickness is reached.

The described aspects may not be limited to the described ones and modifications may be made with reference to one or more of the following: e.g. individual layer thicknesses, number of layers, compositions of layers, thermal treatments in order to achieve best possible ferroelectric performance.

According to various aspects, the layers described herein may be formed by vacuum deposition. In some aspects, the method for manufacturing the capacitive memory structure may be configured to avoid a vacuum break during the intra layer anneal process, e.g., a vacuum break may be avoided until at least the top electrode is formed over the memory layer 504, see FIG. 5I.

Figure 5H:
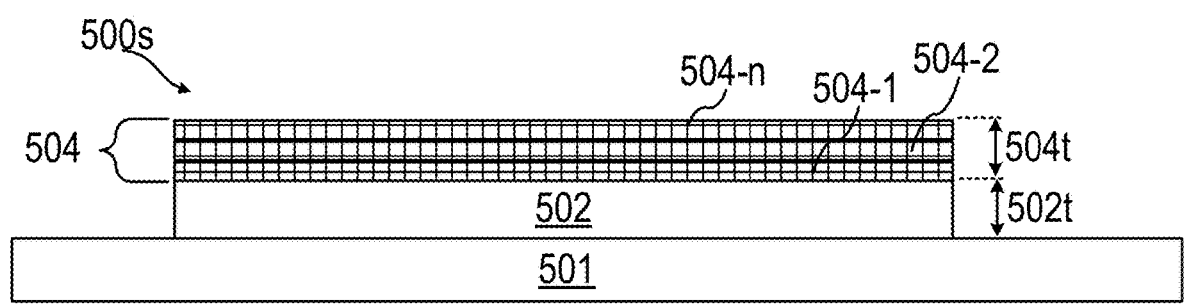
Figure 5I:
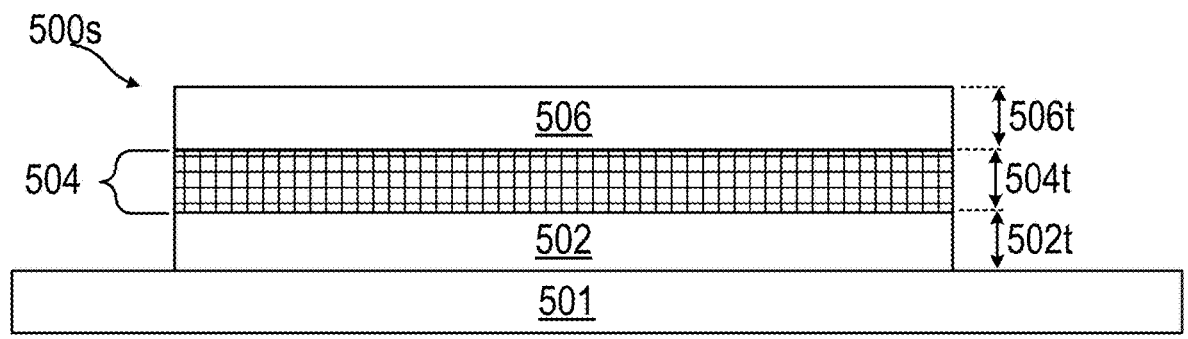

According to various aspects, a second electrode 506 may be formed, see, for example, FIG. 5I. The second electrode 506 may be formed over the substrate 501, e.g., over the first electrode 502 and over the memory layer 504, and/or directly on the memory layer 504. The second electrode 506 may be formed as a layer. The structure (e.g., the substrate, e.g., an electronic structure such as a transistor stack, the first electrode 502, the memory layer 504, as examples) underlying the second electrode 506 may have a planar shape. In this case, the second electrode 506 may be formed by any type of vapor deposition, e.g., chemical or physical vapor deposition (e.g., sputtering, e.g., atomic layer deposition, as examples). In another aspect, the structure (e.g., the substrate, e.g., an electronic structure such as a transistor stack, the first electrode 502, the memory layer 504, as examples) underlying the second electrode 506 may have a three-dimensional shape (e.g., may include a patterned layer, e.g., a fin structure, a trench structure, as examples). In this case, the second electrode 506 may be formed by a suitable type of vapor deposition that allows for a conformal deposition of the second electrode 506 as a conformal layer, e.g., atomic layer deposition, as example.

In some aspects, the layer thickness 506*t* of the second electrode 506 may be, for example, in the range from about 3 nm to about 20 nm.

According to various aspects, the second electrode 506 may be a top electrode of the capacitive memory structure 500*s*. The memory layer 504 may be disposed between the top electrode 506 and the bottom electrode 502 of the capacitive memory structure 500*s*. According to various aspects, the bottom electrode 502 may be in direct physical contact with the memory layer 504, and the memory layer 504 may be in direct physical contact with the top electrode 506. The capacitive memory structure 500s—and therefore the bottom electrode 502, the memory layer 504, and the top electrode 506—may have any desired two- or three-dimensional shape. The capacitive memory structure 500s may be or may include a trench capacitive memory structure, a pillar capacitive memory structure, a planar capacitive memory structure, an angled capacitive memory structure, a curved capacitive memory structure, or a fin-FET structure as examples.

According to various aspects, forming the second electrode 506 by sputtering may offer to adapt a plurality of process parameters to alter the growth mode of the layers. The process parameters that can be varied during an atomic layer deposition process may be rather limited. Therefore, an intra layer anneal approach, as described herein, may be particularly attractive for 3D-integration that may require an atomic layer deposition.

According to various aspects, the second electrode 506 may include or consist of the following materials: titanium nitride (TiN), tantalum nitride (TaN), tungsten (W), ruthenium (Ru), iridium (Ir), platinum (Pt), palladium (Pd), molybdenum (Mo), ruthenium oxide ($RuO_2$), iridium oxide ($IrO_2$), as examples.

According to various aspects, the memory layer may include a plurality of sublayers 504-n (n may be in the range from about 2 to 20, e.g., in the range from about 3 to about 15), see, for example, FIG. 5H. An interface may remain between one or more (or each) neighboring pair of sublayers. In some aspects, the respective sublayers may partially crystallize, e.g., from the direction of the bottom electrode 502. In this case, disordered crystals, defects, or other microstructural features may be present in an interface region between one or more (or each) neighboring pair of sublayers.

According to various aspects, a first sublayer of the plurality of sublayers (e.g., sublayer 504-1) may include or may consist of a first material and the crystallization (in 505) of the first sublayer may include or may consist of an annealing process at a first annealing temperature. Furthermore, a second sublayer of the plurality of sublayers (e.g., sublayer 504-2) may include or may consist of a second material, distinct from the first material, and the crystallization (in 505) of the second sublayer may include or may consist of an annealing process at a second annealing temperature distinct from the first annealing temperature. According to various aspects, a first sublayer of the plurality of sublayers (e.g., sublayer 504-1) may include or may consist of a first material and the crystallization (in 505) of the first sublayer may include or may consist of an annealing process having a first annealing duration. Furthermore, a second sublayer of the plurality of sublayers (e.g., sublayer 504-2) may include or may consist of a second material, distinct from the first material, and the crystallization (in 505) of the second sublayer may include or may consist of an annealing process having a second annealing duration distinct from the first annealing duration. Illustratively, a material dependent annealing temperature and/or annealing duration may be used in the intra layer anneal process, according to various aspects.

In general, an annealing temperature may be understood as a maximal temperature associated with a corresponding annealing process. In general, an annealing duration may be understood as a time interval or sum of time intervals at which the actual temperature is substantially the annealing temperature (e.g., in the range from about 90% of the annealing temperature to about 110% of the annealing temperature). According to various aspects, a hafnium oxide layer may be subjected to a higher annealing temperature and/or a longer annealing duration compared to a zirconium oxide layer. This may allow for an efficient forming of a memory layer 504 having a super-lattice based on at least two transition metal oxides, e.g., based on hafnium oxide and zirconium oxide.

Figure 6A:
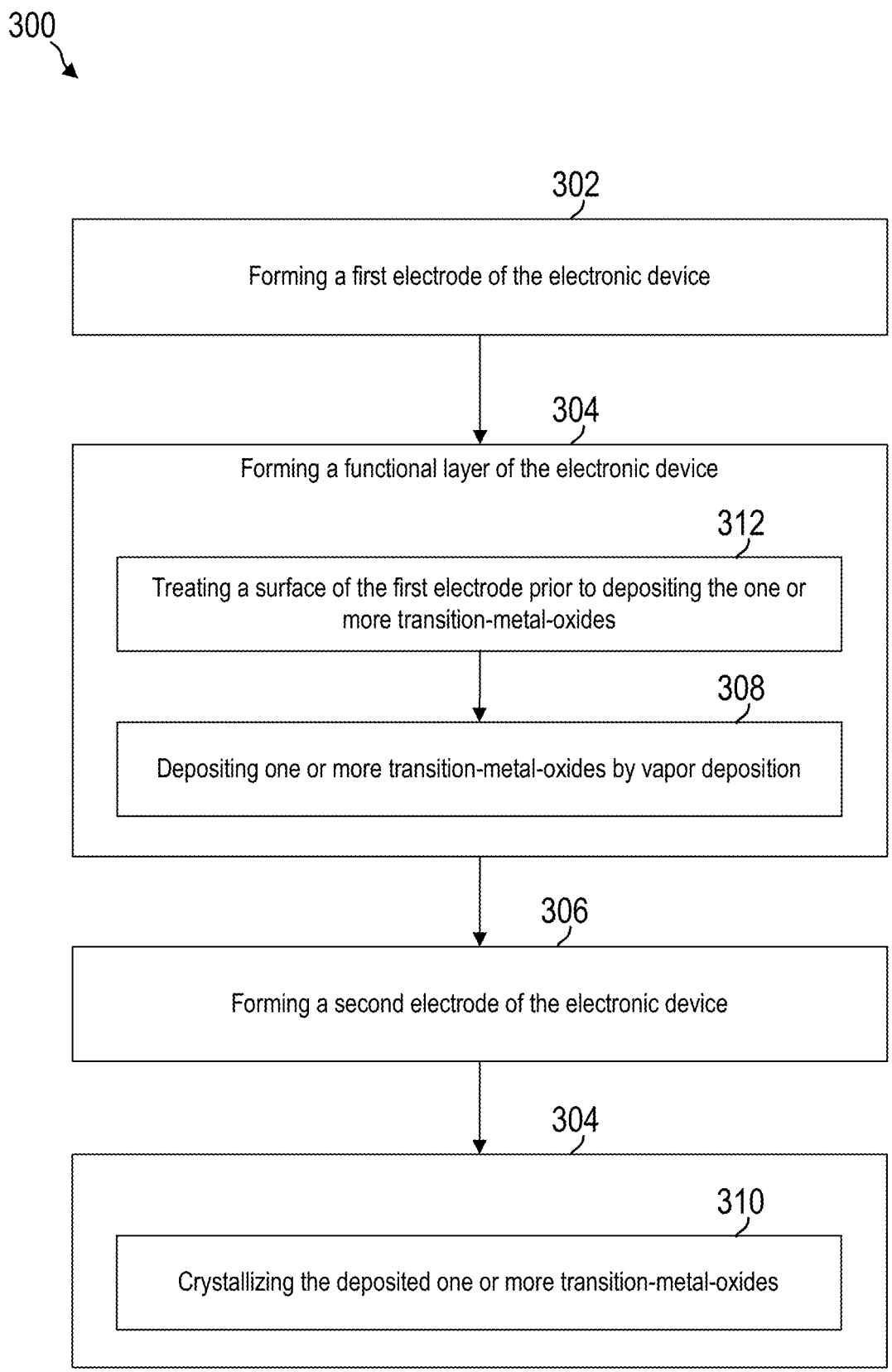

As shown in FIG. 6A, forming (in 304) the functional layer (e.g., the spontaneously polarizable memory layer) may include treating a surface of the first electrode prior to depositing (in 308) the one or more transition-metal-oxides (in 312). The surface of the first electrode may be, for example, treated using a plasma treatment. According to various aspects, the surface treatment (e.g., the plasma treatment) may reduce a surface roughness of the first electrode. According to various aspects, the surface treatment (e.g., the plasma treatment) may reduce a number of adsorbates on the first electrode. Depositing (in 308) the one or more transition-metal-oxides in direct physical contact with the surface of the first electrode with reduced roughness and/or removed surface adsorbates may control the crystallographic texture and the defect density of the spontaneously polarizable memory layer. According to various aspects, the plasma treatment may reduce a leakage current associated with the capacitive memory structure.

Figure 6B:
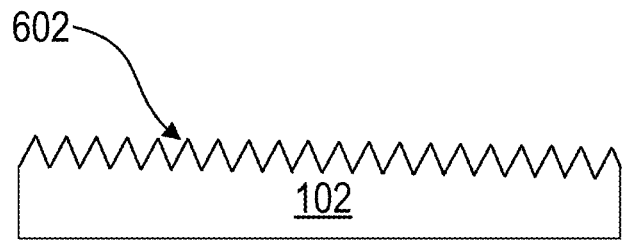
FIG. 6B shows an electrode prior to and after a surface treatment, according to various aspects.
Figure 6B:
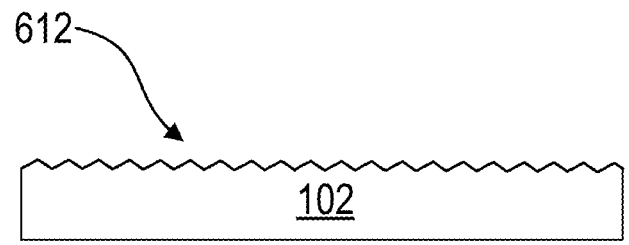

FIG. 6B shows an exemplary first electrode 102 prior to the surface treatment (in 600) and after the surface treatment (in 610). The surface roughness of the first electrode 102 may be an arithmetical mean deviation (e.g., given by a roughness value Ra) and/or a root mean squared (RMS) surface roughness (e.g., given by an RMS roughness value Rq). The first electrode 102 may have a first surface roughness 602 (e.g., a first RMS roughness) prior to the surface treatment (e.g., a plasma treatment) and a second surface roughness 612 (e.g., a second RMS roughness) after the surface treatment. According to various aspects, the second surface roughness 612 is less than the first surface roughness 602. For example, a first RMS value, $Rq_1$, associated with the first RMS roughness is greater than a second RMS value, $Rq_2$, associated with the second RMS roughness. According to various aspects, a second RMS value, $Rq_2$, associated with the second surface roughness 612 may be less than 1 nm (e.g., less than 0.3 nm).

Figure 6C:
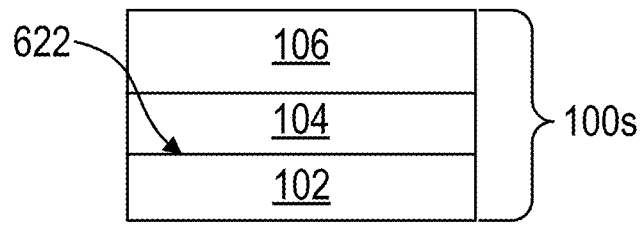
FIGS. 6C, 7B, 8B, 8C, 9B, 10B, 11B, and 12B each show an exemplary electronic device, e.g., a capacitive memory structure, according to various aspects.

FIG. 6C shows an exemplary functional structure 620 (e.g., a capacitive memory structure), according to various aspects. The functional structure 620 may be formed by the method 300 as shown in FIG. 6A. The functional structure 620 may include the first electrode 102, the functional layer (e.g., a spontaneously polarizable memory layer as memory element 104) and the second electrode 106. The first electrode 102 may have a surface-treated surface 622 (e.g., a plasma-treated surface) in direct physical contact with the functional layer.

Figure 7A:
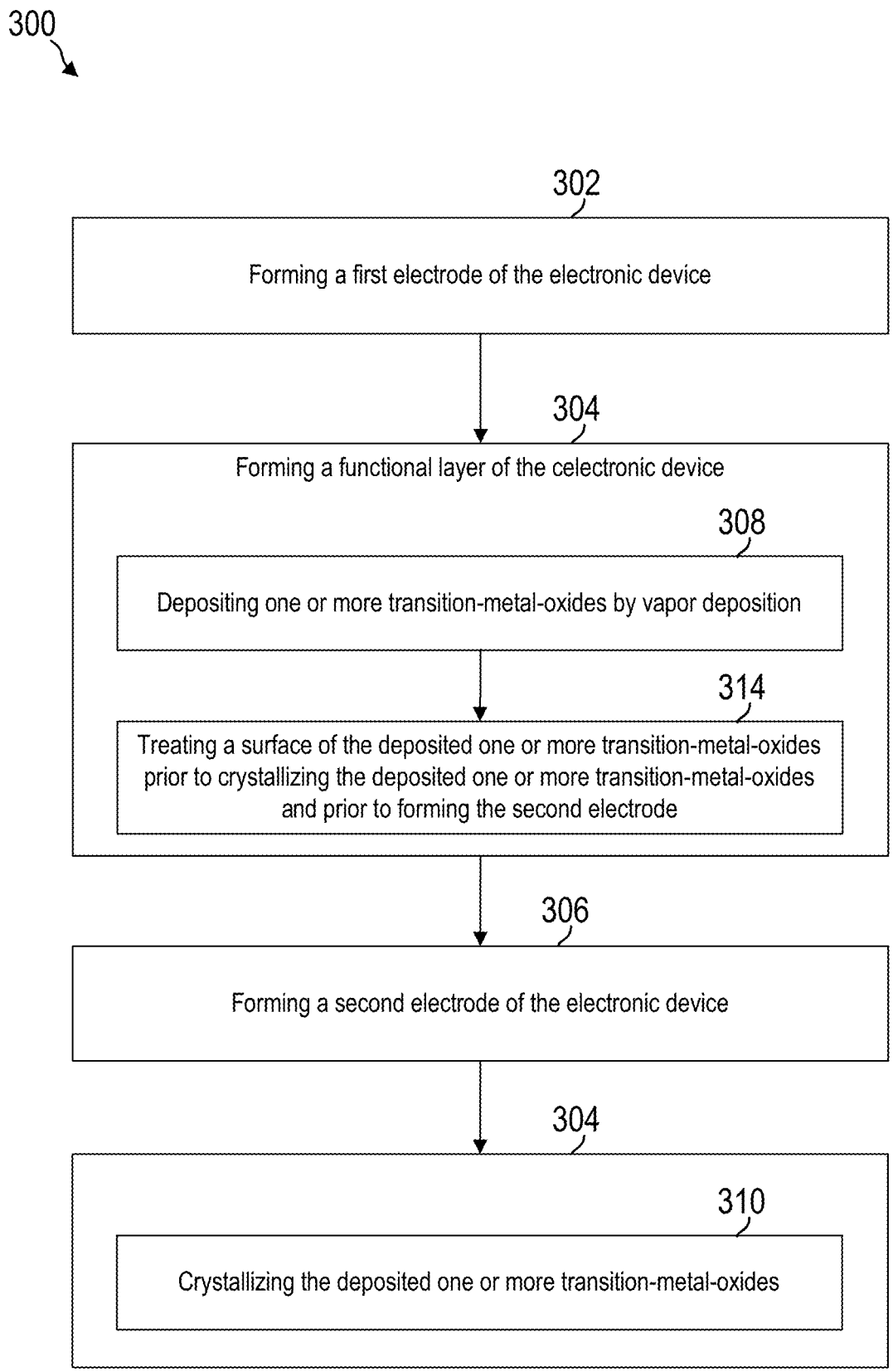

As shown in FIG. 7A, forming (in 304) the functional layer (e.g., the spontaneously polarizable memory layer) may include treating a surface of the deposited one or more transition-metal-oxides prior to forming (in 306) the second electrode (in 314). According to various aspects, the surface of the deposited one or more transition-metal-oxides may be treated prior to crystallizing (in 310) the deposited one or more transition-metal-oxides. The surface of the deposited one or more transition-metal-oxides may be, for example, treated using a plasma treatment. According to various aspects, the surface treatment (e.g., the plasma treatment) may reduce a surface roughness of the deposited one or more transition-metal-oxides, as described for the first electrode with reference to FIG. 6B (e.g., the surface treatment may reduce a roughness value Ra and/or an RMS roughness value Rq). According to various aspects, the surface treatment (e.g., the plasma treatment) may reduce a number of adsorbates on the deposited one or more transition-metal-oxides. Forming (in 306) the second electrode in direct physical contact with the surface of the deposited one or more transition-metal-oxides with reduced roughness and/or removed surface adsorbates may control the crystallographic texture and the defect density of the spontaneously polarizable memory layer. According to various aspects, the plasma treatment may reduce a leakage current associated with the capacitive memory structure.

Figure 7B:
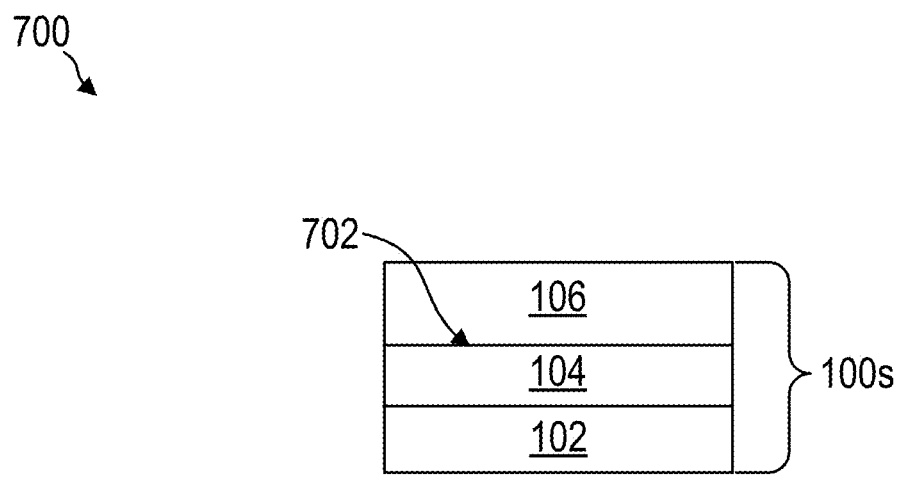

FIG. 7B shows an exemplary functional structure 700 (e.g., a capacitive memory structure), according to various aspects. The functional structure 700 may be formed by the method 300 as shown in FIG. 7A. The functional structure 700 may include the first electrode 102, the functional layer (e.g., a spontaneously polarizable memory layer as memory element 104) and the second electrode 106. The functional layer may have a plasma-treated surface 702 in direct physical contact with the second electrode 106.

Figure 8A:
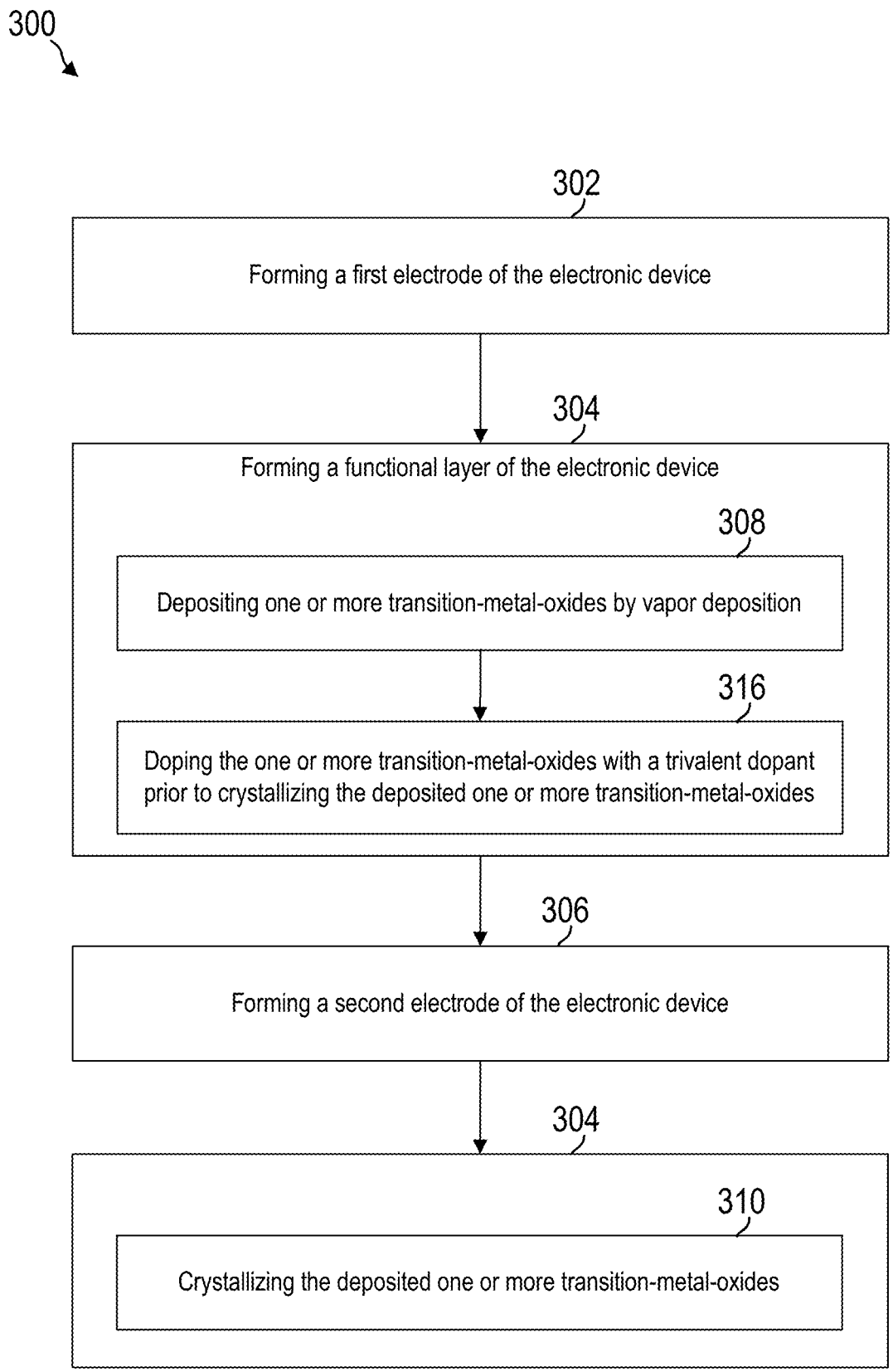

As shown in FIG. 8A, forming (in 304) the functional layer (e.g., the spontaneously polarizable memory layer) may include doping the deposited one or more transition-metal-oxides with a trivalent dopant (in 316). According to various aspects, the deposited one or more transition-metal-oxides may be doped with the trivalent dopant prior to crystallizing (in 310) the deposited one or more transition-metal-oxides.

Doping the one or more transition-metal-oxides, as described herein, may refer a dopant concentration in the range from about 0.1 cation percent (cat %) to about 40 cat %. For example, the one or more transition-metal-oxides may include or may be hafnium zirconium oxide, $Hf_{1-x-y}Zr_{x-y}D_yO_{2-a}$, doped with at least one trivalent dopant, D, as described herein and the dopant concentration, y, may be in the range from about 0.1 cat % to about 30 cat % (i.e., $0.01 \le y \le 0.3$). For example, the dopant concentration, y, may be in the range from about 0.1 cat % to about 20 cat % (i.e., $0.01 \le y \le 0.2$). For example, the dopant concentration, y, may be in the range from about 0.1 cat % to about 10 cat % (i.e., $0.01 \le y \le 0.1$). The trivalent dopant, D, may induce oxygen vacancies. This may reduce an oxygen stoichiometry as represented by the oxygen concentration, 2−a (e.g., with $0 \le a \le 0.2$). As described herein, the mixing ratio of hafnium and zirconium may be in the range from about 40:60 to about 60:40 (e.g., $0.32 \le x \le 0.48$ for y=0.2). For example, the one or more transition-metal-oxides may include or may be hafnium oxide, $Hf_{1-y}D_yO_2$, doped with at least one trivalent dopant, D, as described herein and the dopant concentration, y, may be in the range from about 0.1 cat % to about 40 cat %. For example, the one or more transition-metal-oxides may include or may be zirconium oxide, $Zr_{1-y}D_yO_{2-a}$, doped with at least one trivalent dopant, D, as described herein and the dopant concentration, y, may be in the range from about 0.1 cat % to about 20 cat %. It is noted that doping, as described herein, is understood as intentionally introducing dopants and that impurities and/or contaminates are not understood as dopants (e.g., impurities and/or contaminates with concentrations less than 0.1 cat %).

According to various aspects, the trivalent dopant may compensate oxygen vacancies. As described herein, oxygen vacancies may increase a leakage current associated with the capacitive memory structure. Hence, the trivalent dopant may reduce the leakage current associated with the capacitive memory structure. Illustratively, doping (in 316) the deposited one or more transition-metal-oxides with the trivalent dopant may modify the predefined range associated with the defect density (in this case the oxygen vacancy density). According to various aspects, doping (in 316) the deposited one or more transition-metal-oxides with the trivalent dopant may increase a temperature associated with crystallizing (in 310) the deposited one or more transition-metal-oxides (e.g., a crystallization temperature of the one or more transition-metal-oxides). An increase of the crystallization temperature may modify a phase composition of the spontaneously polarizable memory layer and, thus, may control the predefined crystallographic texture and/or the defect density of the spontaneously polarizable memory layer. An increase of the crystallization temperature may reduce (e.g., prohibit) a formation of a non-spontaneously polarizable phase of the one or more transition-metal-oxides and, thus, may control the predefined crystallographic texture and/or the defect density of the spontaneously polarizable memory layer. It is noted that doping (in 316) the deposited one or more transition-metal-oxides may also include doping the deposited one or more transition-metal-oxides with more than one trivalent dopant.

According to various aspects, the trivalent dopant may include or may be lanthanum (La). Besides compensating oxygen vacancies, doping the deposited one or more transition-metal-oxides with lanthanum may lead to a strong increase of the crystallization temperature as compared to other trivalent dopants. As described above, this may reduce the formation of non-spontaneously polarizable phases of the one or more transition-metal-oxides. Hence, doping the deposited one or more transition-metal-oxides with lanthanum may lead to the predefined crystallographic texture (and/or may support to obtain the predefined crystallographic texture) of the spontaneously polarizable memory layer and may allow for a defect density of the spontaneously polarizable memory layer in the predefined range.

According to various aspects, the trivalent dopant may include or may be gadolinium (Gd). Besides compensating oxygen vacancies, doping the deposited one or more transition-metal-oxides with gadolinium may only slightly increase the crystallization temperature as compared to other trivalent dopants. The crystallization temperature increase induced by doping gadolinium may be less than the crystallization temperature increase induced by doping lanthanum. As described herein, the capacitive memory structure may be associated with a maximum thermal budget. Doping the deposited one or more transition-metal-oxides with gadolinium may allow to control a thermal energy required for crystallizing the deposited one or more transition-metal-oxides (e.g., to enable a crystallizing the deposited one or more transition-metal-oxides using the maximum thermal budget).

According to various aspects, the trivalent dopant may include or may be yttrium (Y). Besides compensating oxygen vacancies, doping the deposited one or more transition-metal-oxides with yttrium may lead to an increase of the crystallization temperature, which is less than the increase of the crystallization temperature associated with lanthanum. Hence, doping the deposited one or more transition-metal-oxides with yttrium may enable a tradeoff between increasing the crystallization temperature of the deposited one or more transition-metal-oxides and allowing for a crystallizing of the deposited one or more transition-metal-oxides using the maximum thermal budget.

According to various aspects, the trivalent dopant may include or may be scandium (Sc) and/or ytterbium (Yb). Besides compensating oxygen vacancies, doping the deposited one or more transition-metal-oxides with scandium and/or ytterbium may lead to an increase of the crystallization temperature comparable to gadolinium and yttrium.

According to various aspects, the trivalent dopant may include or may be aluminum, Al. Besides compensating oxygen vacancies, doping the deposited one or more transition-metal-oxides with aluminum may lead to a crystallization temperature increase greater than the crystallization temperature increase associated with gadolinium. For example, doping the deposited one or more transition-metal-oxides with aluminum may lead to a crystallization temperature increase comparable to the crystallization temperature increase associated with lanthanum. Doping the deposited one or more transition-metal-oxides with aluminum may allow to control a thermal energy required for crystallizing the deposited one or more transition-metal-oxides (e.g., to enable a crystallizing the deposited one or more transition-metal-oxides using the maximum thermal budget). Doping the deposited one or more transition-metal-oxides with aluminum may lead to antiferroelectric properties of the spontaneously polarizable memory layer (e.g., antiferroelectric properties of hafnium zirconium oxide, e.g., antiferroelectric properties of hafnium oxide). Hence, doping the deposited one or more transition-metal-oxides with aluminum may allow to control the properties of the spontaneously polarizable memory layer.

According to various aspects, the doping concentration of the trivalent dopant may be selected such that the thermal energy required to crystallize the one or more transition-metal-oxides as represented by the crystallization temperature is close (e.g., substantially equal) to the maximum thermal budget. Illustratively, the crystallization temperature of the one or more transition-metal-oxides may be increased as much as crystallizing the one or more transition-metal-oxides using the maximum thermal budget is still possible. This may minimize a nucleation of atoms prior to crystallizing (in 310) the one or more transition-metal-oxides and, thus, may lead to (and/or support) the formation of the predefined crystallographic texture of the spontaneously polarizable memory layer responsive to crystallizing (e.g., annealing) the one or more transition-metal-oxides.

According to various aspects, doping (in 316) the deposited one or more transition-metal-oxides may include doping the one or more transition-metal-oxides during depositing (in 308) the one or more transition-metal-oxides. As described herein, the one or more transition-metal-oxides may be deposited using atomic layer deposition. According to various aspects, the one or more transition-metal-oxides may be doped with the trivalent dopant during the atomic layer deposition. For example, each ALD cycle of the plurality of ALD cycles may include a precursor pulse of the trivalent dopant. Illustratively, an (in-situ) precursor mixing may be carried out. The precursor mixing may allow to uniformly distribute the trivalent dopant within the spontaneously polarizable memory layer. For example, a segregation of the trivalent dopant within the spontaneously polarizable memory layer may be reduced (e.g., prohibited). For example, a reliability (e.g., a wake-up, e.g., an imprint, e.g., a retention) of the capacitive memory structure may be improved using the precursor mixing. The precursor mixing may enable to form (e.g., support the formation of) the predefined crystallographic texture of the spontaneously polarizable memory layer.

According to various aspects, each ALD cycle may include the precursor pulse of the trivalent dopant after the transition metal precursor pulse and prior to the oxygen precursor pulse. For example, the one or more transition-metal-oxides may include (e.g., consist of) hafnium zirconium oxide, $Hf_{1-x}Zr_xO_2$, and each ALD cycle of the plurality of ALD cycles may include a hafnium precursor pulse, a first precursor pulse of the trivalent dopant, a first precursor pulse of oxygen, a zirconium precursor pulse, a second precursor pulse of the trivalent dopant, and a second precursor pulse of oxygen. According to various aspects, at least one ALD cycle may include either the first precursor pulse of the trivalent dopant or the second precursor pulse of the trivalent dopant. Illustratively, the (in-situ) precursor mixing may be carried out using the precursor pulses of the trivalent dopant. According to various aspects, an inert gas purge may be carried out after each precursor pulse.

According to various aspects, doping (in 316) the deposited one or more transition-metal-oxides may include doping at least a first portion and a second portion of the one or more transition-metal-oxides. The first portion may be at least partially disposed between the first electrode and a center portion of the one or more transition-metal-oxides and the second portion may be at least partially disposed between the second electrode and the center portion of the one or more transition-metal-oxides. The one or more transition-metal-oxides may be deposited using atomic layer deposition and depositing the first portion of the one or more transition-metal-oxides may be associated with one or more first ALD cycles and depositing the second portion of the one or more transition-metal-oxides may be associated with one or more second ALD cycles. According to various aspects, each ALD cycle of the one or more first ALD cycles and each ALD cycle of the one or more second ALD cycles may include a respective precursor pulse of the trivalent dopant. Illustratively, a region (e.g., the first portion) of the one or more transition-metal-oxides close to the first electrode and a region (e.g., the second portion) of the one or more transition-metal-oxides close to the second electrode may be doped with the trivalent dopant and a region (e.g., the center portion) disposed between the two regions may not be doped with the trivalent dopant. This may reduce the leakage current associated with the capacitive memory structure (e.g., by compensating the oxygen vacancies in the regions close to the electrodes) as well as improving the crystallographic texture of the spontaneously polarizable memory layer (e.g., by not increasing the crystallization temperature in the center portion of the one or more transition-metal-oxides).

According to various aspects, the capacitive memory structure may be formed on a wafer. The wafer may be associated with a maximum thermal budget. The maximum thermal budget may define one or more temperature treatments. Each of the one or more temperature treatments may be associated with a respective temperature and a respective time. Each temperature treatment corresponding to the maximum thermal budget of the wafer may define a temperature and a time below (with a lower temperature and/or shorter time) which no components of the wafer are expected to break. Illustratively, the one or more components may break in the case of a temperature treatment having a higher temperature and/or a longer time than the temperature treatment corresponding to the maximum thermal budget of the wafer. According to various aspects, it may be necessary to ensure that the deposited one or more transition-metal-oxides can be crystallized with the maximum thermal budget of the wafer.

According to various aspects, the wafer may be associated with a respective maximum thermal budget based on an integration level of the capacitive memory structure. According to various aspects, doping the deposited one or more transition-metal-oxides may be configured such that the deposited one or more transition-metal-oxides can be crystallized with the maximum thermal budget of the wafer.

For example, the capacitive memory structure may be formed in a front-end-of-line process. In this case, the maximum thermal budget of the wafer may, for example, include temperatures in the range from about 1000° C. to about 1100° C. for a time in the range from about 1 second to about 10 seconds. According to various aspects, the temperatures in the range from about 1000° C. to about 1100° C. may be associated with a source-drain activation annealing. According to various aspects, the capacitive memory structure may be formed after the source-drain activation annealing. In this case the maximum thermal budget may, for example, include a temperature treatment at a temperature in the range from about 550° C. to about 650° C. (e.g., at 600° C.) for a time in the range from about 1 second to about 1 minute (e.g., in the range from about 1 second to about 30 seconds). For example, the maximum thermal budget of the wafer may include the temperature treatment at 600° C. for 1 second and a subsequent temperature treatment at 400° C. for 1 hour (e.g., after (e.g., subsequent to) temperature treatment at 600° C. for 1 second). The temperature treatment at 400° C. for 1 hour may be associated with a deposition of one or more metallization layers in a back-end-of-line process. According to various aspects, in a front-end-of-line integration, the deposited one or more transition-metal-oxides may be doped with silicon, aluminum, germanium, or lanthanum prior to crystallizing (in 310) the deposited one or more transition-metal-oxides. The one or more transition-metal-oxides may, for example, include hafnium zirconium oxide, $Hf_{1-x}Zr_xO_2$, and the hafnium zirconium oxide may be doped with lanthanum. As described herein, lanthanum may lead to a higher crystallization temperature of the doped hafnium zirconium oxide as compared to the other dopants and may improve the crystallographic texture. This may lead to a reduced leakage current associated with the capacitive memory structure. The one or more transition-metal-oxides may, for example, include hafnium oxide, $HfO_2$, and the hafnium oxide may be doped with silicon, aluminum, germanium, or lanthanum. The crystallographic texture of the spontaneously polarizable memory layer may be controlled by controlling the dopant concentration and, thus, the crystallization temperature. For example, in the case of a 10 nm thick spontaneously polarizable memory layer and in the case of ferroelectric properties of the spontaneously polarizable memory layer, the hafnium oxide, $HfO_2$, may be doped with silicon, $Si:HfO_2$, in the range from about 1 cation percent (cat %) to about 5 cat % of silicon. For example, in the case of a 10 nm thick spontaneously polarizable memory layer and in the case of ferroelectric properties of the spontaneously polarizable memory layer, the hafnium oxide, $HfO_2$, may be doped with aluminum, $Al:HfO_2$, in the range from about 1 cat % to about 5 cat % of aluminum. For example, in the case of a 10 nm thick spontaneously polarizable memory layer and in the case of antiferroelectric properties of the spontaneously polarizable memory layer, the hafnium oxide, $HfO_2$, may be doped with silicon, $Si:HfO_2$, in the range from about 5 cat % to about 12 cat % of silicon. For example, in the case of a 10 nm thick spontaneously polarizable memory layer and in the case of antiferroelectric properties of the spontaneously polarizable memory layer, the hafnium oxide, $HfO_2$, may be doped with aluminum, $Al:HfO_2$, in the range from about 5 cat % to about 12 cat % of aluminum. For example, in the case of a 10 nm thick spontaneously polarizable memory layer, the hafnium oxide, $HfO_2$, may be doped with germanium, $Ge:HfO_2$, in the range from about 5 cat % to about 30 cat % of germanium. For example, in the case of a 10 nm thick spontaneously polarizable memory layer, the hafnium oxide, $HfO_2$, may be doped with lanthanum, $La:HfO_2$, in the range from about 3 cat % to about 12 cat % of lanthanum. According to various aspects, the crystallization temperature of deposited the one or more transition-metal-oxides may depend on a thickness of the deposited the one or more transition-metal-oxides. The crystallization temperature of deposited the one or more transition-metal-oxides may increase with increasing thickness of the deposited the one or more transition-metal-oxides. Hence, the above mentioned dopant concentrations may vary depending on the thickness of the spontaneously polarizable memory layer.

For example, the capacitive memory structure may be formed in a mid-end-of-line process. In this case, the maximum thermal budget of the wafer may, for example, include a temperature treatment at a temperature in the range from about 450° C. to about 550° C. (e.g., at 500° C.) for a time in the range from about 1 second to about 10 minutes (e.g., for 30 seconds). For example, the maximum thermal budget of the wafer may include the temperature treatment at 500° C. for 30 seconds and a subsequent temperature treatment at 400° C. for 1 hour (e.g., after (e.g., subsequent to) temperature treatment at 500° C. for 30 seconds). According to various aspects, in a mid-end-of-line integration, the deposited one or more transition-metal-oxides may be doped prior to crystallization of the deposited one or more transition-metal-oxides with at least one element of the following group of elements: silicon, aluminum, germanium, lanthanum, gadolinium, yttrium, scandium, and/or ytterbium (in 310). The one or more transition-metal-oxides may, for example, include hafnium zirconium oxide, $Hf_{1-x}Zr_xO_2$, or hafnium oxide, $HfO_2$. According to various aspects, the one or more transition-metal-oxides may include a dopant concentration of 5 cat % or less. According to various aspects, the thickness of the spontaneously polarizable memory layer may be equal to or greater than 10 nm. This may ensure a crystallization of the one or more transition-metal-oxides to the spontaneously polarizable memory layer with the predefined crystallographic texture using the thermal budget of the mid-end-of-line process (e.g., the temperature treatment at 500° C. for 30 seconds).

For example, the capacitive memory structure may be formed in a back-end-of-line process. In this case, the maximum thermal budget of the wafer may, for example, include a temperature treatment at 400° C. for 1 hour. According to various aspects, in a back-end-of-line integration, the deposited one or more transition-metal-oxides may be doped prior to crystallization with at least one element of the following elements: gadolinium, yttrium, scandium, and/or ytterbium (in 310) the deposited one or more transition-metal-oxides. The one or more transition-metal-oxides may, for example, include hafnium zirconium oxide, $Hf_{1-x}Zr_xO_2$, or hafnium oxide, $HfO_2$. According to various aspects, crystallizing (in 310) the one or more transition-metal-oxides may include an annealing of the deposited one or more transition-metal-oxides using six heating and cooling cycles, wherein each of the six heating and cooling cycles includes heating the deposited one or more transition-metal-oxides to 400° C., annealing the deposited one or more transition-metal-oxides at 400° C. for 10 minutes, and cooling the deposited one or more transition-metal-oxides to a predefined temperature below 400° C. (e.g., to room temperature such as 25° C.).

According to various aspects, the crystallization temperature of the deposited one or more transition-metal-oxides may be varies by varying the thickness of the deposited one or more transition-metal-oxides. According to various aspects, the crystallization temperature of the deposited one or more transition-metal-oxides may be increased by decreasing the thickness of the deposited one or more transition-metal-oxides, and vice versa. According to various aspects, the thickness of the spontaneously polarizable memory layer may be in the range from about 8 nm to about 12 nm. For example, the thickness of the spontaneously polarizable memory layer may be selected in the range from about 8 nm to about 12 nm so that, responsive to applying one or more of the measures described herein, the predefined crystallographic texture and a defect density in the predefined range can be obtained upon annealing the deposited one or more transition-metal-oxides using the maximum thermal budget or less. See also FIG. 4B and FIG. 4C as well as the corresponding description.

Figure 8B:
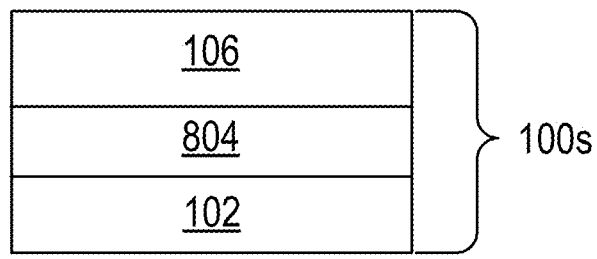

FIG. 8B shows an exemplary functional structure 802 (e.g., a capacitive memory structure), according to various aspects. The functional structure 802 may be formed by the method 300 as shown in FIG. 8A. The functional structure 802 may include the first electrode 102, a functional layer 804 (e.g., as memory layer 104) doped with the trivalent dopant and the second electrode 106.

Figure 8C:
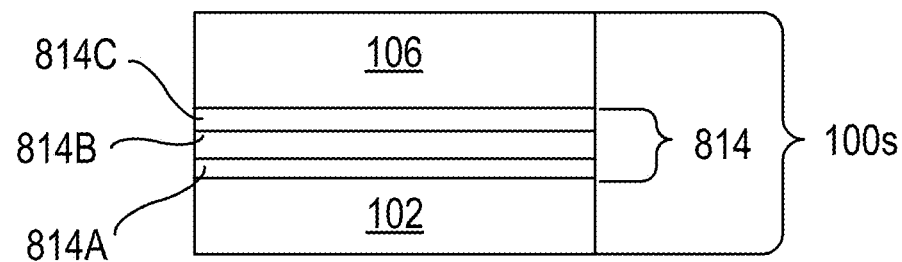

FIG. 8C shows an exemplary functional structure 812 (e.g., a capacitive memory structure), according to various aspects. The functional structure 812 may be formed by the method 300 as shown in FIG. 8A, wherein the center portion of the functional layer (e.g., the spontaneously polarizable memory layer) may not be doped with the trivalent dopant. The functional structure 802 may include the first electrode 102, a functional layer 814 (e.g., a spontaneously polarizable memory layer, e.g., as memory layer 104) partially doped with the trivalent dopant and the second electrode 106. According to various aspects, the functional layer 814 may include a first portion 814A, a center portion 814B, and a second portion 814C. According to various aspects, the first portion 814A and the second portion 814B may be doped with the trivalent dopant and the center portion 814B may not be doped with the trivalent dopant.

As shown in FIG. 9A, depositing (in 308) the one or more transition-metal-oxides may include depositing a first transition-metal-oxide layer (in 308A). The first transition-metal-oxide layer may include the one or more transition-metal-oxides. Depositing (in 308) the one or more transition-metal-oxides may include forming one or more insulating layers (in 308B). Depositing (in 308) the one or more transition-metal-oxides may include depositing a second transition-metal-oxide layer (in 308C). According to various aspects, the one or more insulating layers (e.g., one or more insulating interlayer) may be at least partially disposed between the first transition-metal-oxide layer and the second transition-metal-oxide layer. According to various aspects, the one or more insulating layers may be formed in direct physical contact with the first transition-metal-oxide layer. The second transition-metal-oxide layer may be deposited after forming (in 308B) the one or more insulating layers. The second transition-metal-oxide layer may be deposited such that the second transition-metal-oxide layer physically contacts the one or more insulating layers. The one or more insulating layers may have a thickness of 1 nm or less (e.g., in the range from about 0.2 nm to about 1 nm). The one or more insulating layers may include aluminum oxide. For example, the one or more insulating layers may consist of aluminum oxide. For example, the one or more insulating layers may consist of a compound including aluminum oxide (e.g., $TaO_x$—$Al_2O_3$, e.g., $NbO_x$—$Al_2O_3$, e.g., $TaO_x$—$NbO_z$—$Al_2O_3$).

According to various aspects, one or more insulating layers may be formed in physical contact with the first electrode. In this case, depositing (in 308) the one or more transition-metal-oxides may include forming the one or more insulating layers and depositing the one or more transition-metal-oxides after forming the one or more insulating layers.

According to various aspects, one or more insulating layers may be formed in physical contact with the second electrode. In this case, depositing (in 308) the one or more transition-metal-oxides may include depositing the one or more transition-metal-oxides and forming the one or more insulating layers after depositing the one or more transition-metal-oxides.

According to various aspects, one or more insulating layers may include at a first insulating layer and a second insulating layer. In this case, depositing (in 308) the one or more transition-metal-oxides may include depositing the first transition-metal-oxide layer, forming the first insulating layer, depositing the second transition-metal-oxide layer, forming the second insulating layer, and depositing a third transition-metal-oxide layer.

The one or more transition-metal-oxides (e.g., the first transition-metal-oxide layer and the second transition-metal-oxide layer) may be deposited using atomic layer deposition and forming (in 308B) the one or more insulating layers may include an atomic layer deposition of an insulating material after a predefined number of ALD cycles (e.g., a predefined number of ALD cycles to deposit (in 308A) the first transition-metal-oxide layer) of the plurality of ALD cycles and prior to the other ALD cycles (e.g., the ALD cycles to deposit (in 308C) the second transition-metal-oxide layer) of the plurality of ALD cycles.

According to various aspects, a band-gap of the one or more insulating layers may be greater than a band-gap of the spontaneously polarizable memory layer. This may reduce (e.g., prevent) a movement of electrons and/or holes when injected to the conduction band or valence band.

The one or more insulating layers may prevent a growth of grain boundaries from the first electrode to the second electrode. This may support the formation of the spontaneously polarizable memory layer with a predefined texture.

Figure 9B:
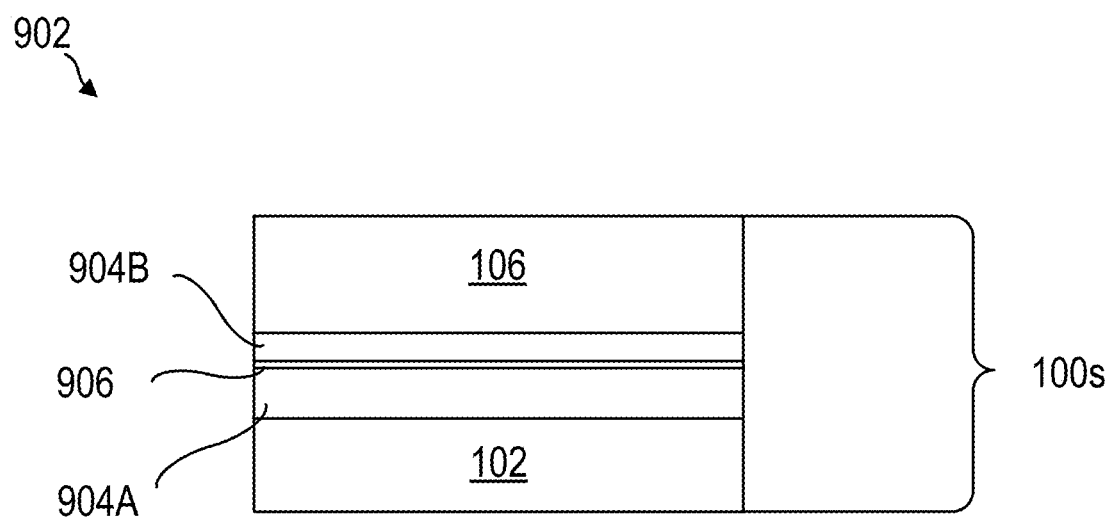

FIG. 9B shows an exemplary functional structure 902 (e.g., a capacitive memory structure), according to various aspects. The functional structure 902 may be formed by the method 300 as shown in FIG. 9A. The functional structure 902 may include the first electrode 102, a functional layer (e.g., a spontaneously polarizable memory layer, e.g., as memory layer 104), the second electrode 106, and an insulating layer 906. The functional layer may include a first sublayer 904A (e.g., a first spontaneously polarizable sublayer) and a second sublayer 904B (e.g., a second spontaneously polarizable sublayer). The insulating layer may be at least partially disposed between the first sublayer 904A and the second sublayer 904B.

Figure 10A:
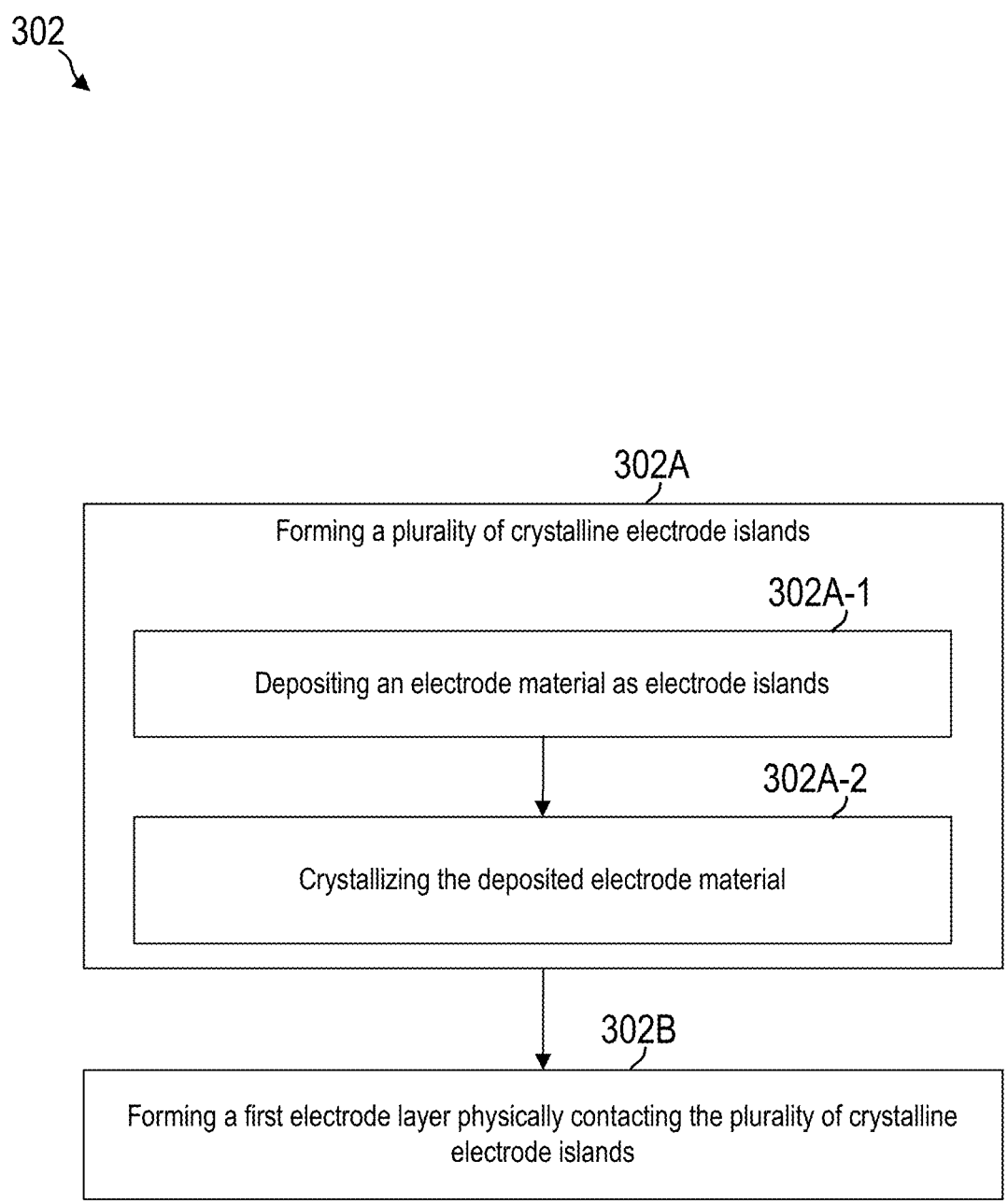

As shown in FIG. 10A, depositing 302 the first electrode of the electronic device (e.g., of the capacitive memory structure) may include forming a plurality of crystalline electrode islands (in 302A). Depositing 302 the first electrode of the capacitive memory structure may include forming a first electrode layer in direct physical contact with the plurality of crystalline electrode islands (in 302B). The plurality of crystalline electrode islands may be formed by depositing an electrode material (e.g., in and/or over a carrier) as electrode islands (in 302A-1) and by crystallizing the deposited electrode material (in 302A-2). The crystalline electrode islands may serve as nucleation sites for a crystallization of the first electrode layer to enhance a crystallographic texture of the first electrode (e.g., the first electrode layer). Depositing the one or more transition-metal-oxides in direct physical contact with the first electrode with enhanced crystallographic texture may lead to the predefined crystallographic texture (and/or may support to obtain the predefined crystallographic texture) of the spontaneously polarizable memory layer. A material of the electrode islands may correspond to a material of the first electrode layer. According to various aspects, a composition of the material of the electrode islands may be different from a composition of the material of the first electrode layer. For example, the electrode islands and first electrode layer may include a metal oxide, $MO_x$, as an electrode material and the composition of the metal oxide of the electrode islands may be different from the composition of the metal oxide of the first electrode layer (i.e., x of the electrode islands and x of the first electrode layer are different from one another).

Figure 10B:
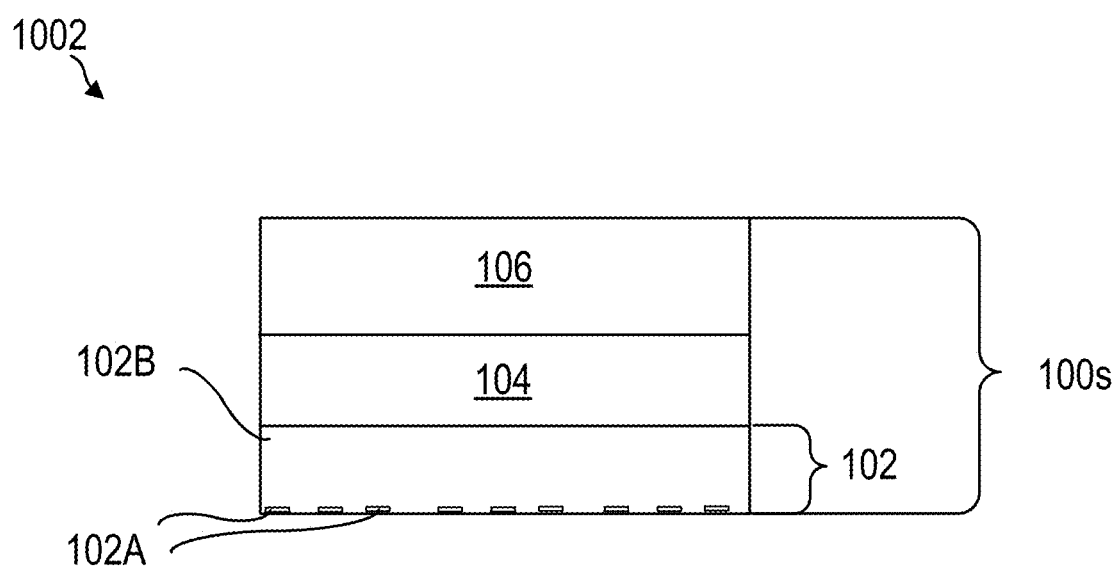

FIG. 10B shows an exemplary functional structure 1002 (e.g., a capacitive memory structure), according to various aspects. The functional structure 1002 may be formed by the method 300 as shown in FIG. 10A. The functional structure 1002 may include the first electrode 102, a functional layer (e.g., a spontaneously polarizable memory layer as memory layer 104), and the second electrode 106. The first electrode 102 may include a plurality of electrode islands 102A and a first electrode layer 102B. Both, the plurality of electrode islands 102A and the first electrode layer 102B may include, may include a metal oxide (e.g., the same metal of the metal oxide). The composition of the metal oxide of the plurality of electrode islands may be different from the composition of the metal oxide of the first electrode layer (e.g., an oxygen content of the metal oxide may vary).

Figure 11A:
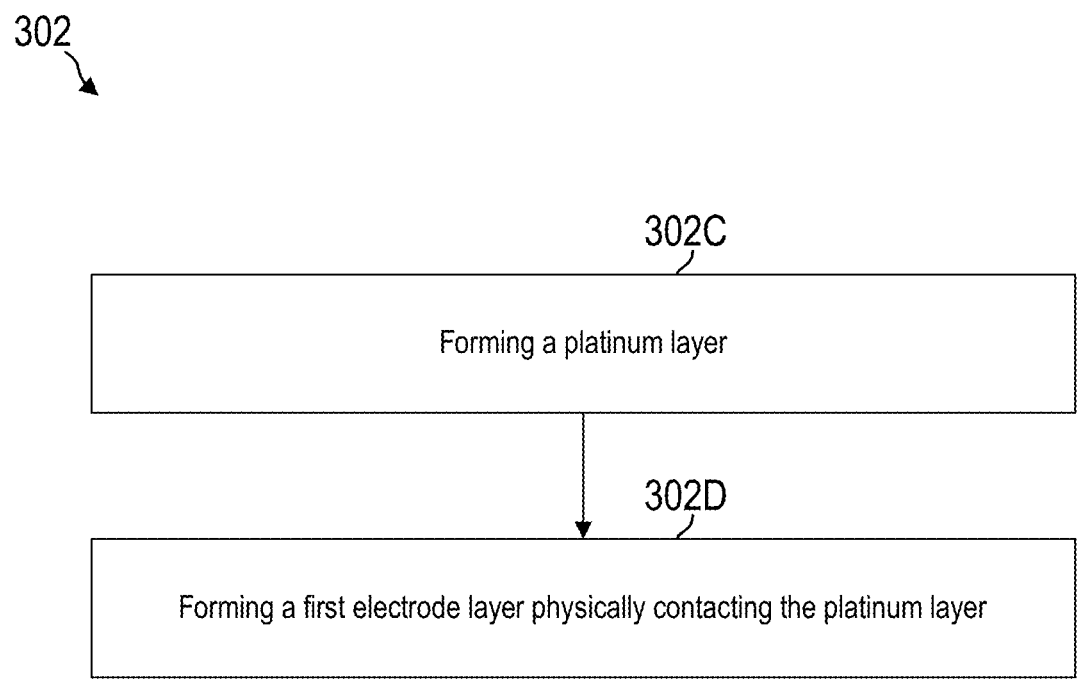

As shown in FIG. 11A, depositing (in 302) the first electrode of the electronic device (e.g., of the capacitive memory structure) may include forming a platinum layer (in 302C). Depositing 302 the first electrode of the capacitive memory structure may include forming a first electrode layer in direct physical contact with the platinum layer (in 302D). The platinum layer may control a crystallization of the first electrode layer to form a crystallographic texture (e.g., a (111)-texture) of the first electrode (e.g., the first electrode layer). Depositing the one or more transition-metal-oxides in direct physical contact with the first electrode with the crystallographic texture may lead to the predefined crystallographic texture (and/or may support to obtain the predefined crystallographic texture) of the spontaneously polarizable memory layer.

Figure 11B:
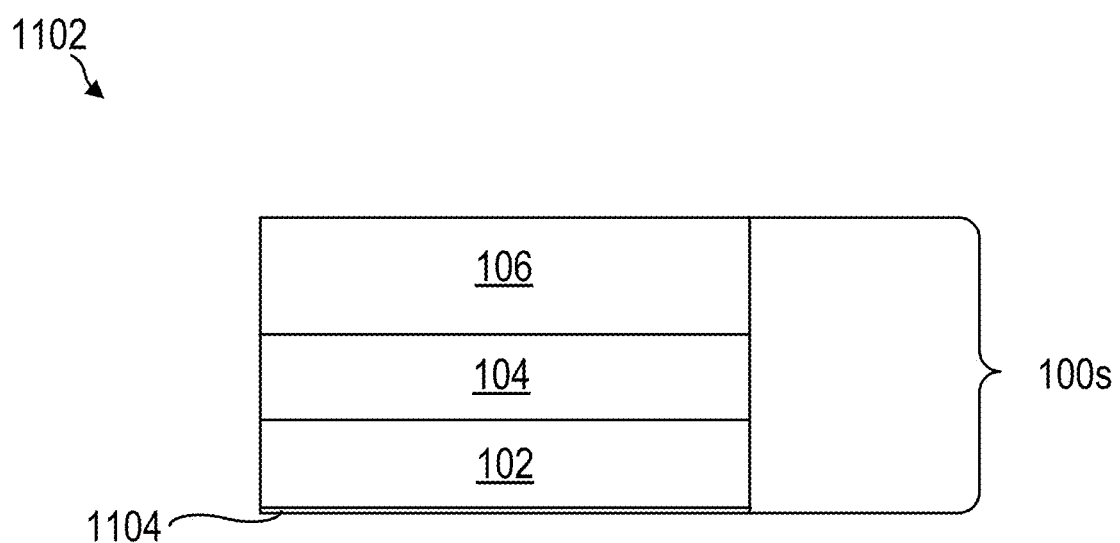

FIG. 11B shows an exemplary functional structure 1102 (e.g., a capacitive memory structure), according to various aspects. The functional structure 1102 may be formed by the method 300 as shown in FIG. 11A. The functional structure 1102 may include the first electrode 102, a platinum layer 1104 in direct physical contact with the first electrode 102, a functional layer (e.g., a spontaneously polarizable memory layer as memory layer 104), and the second electrode 106.

Figure 12A:
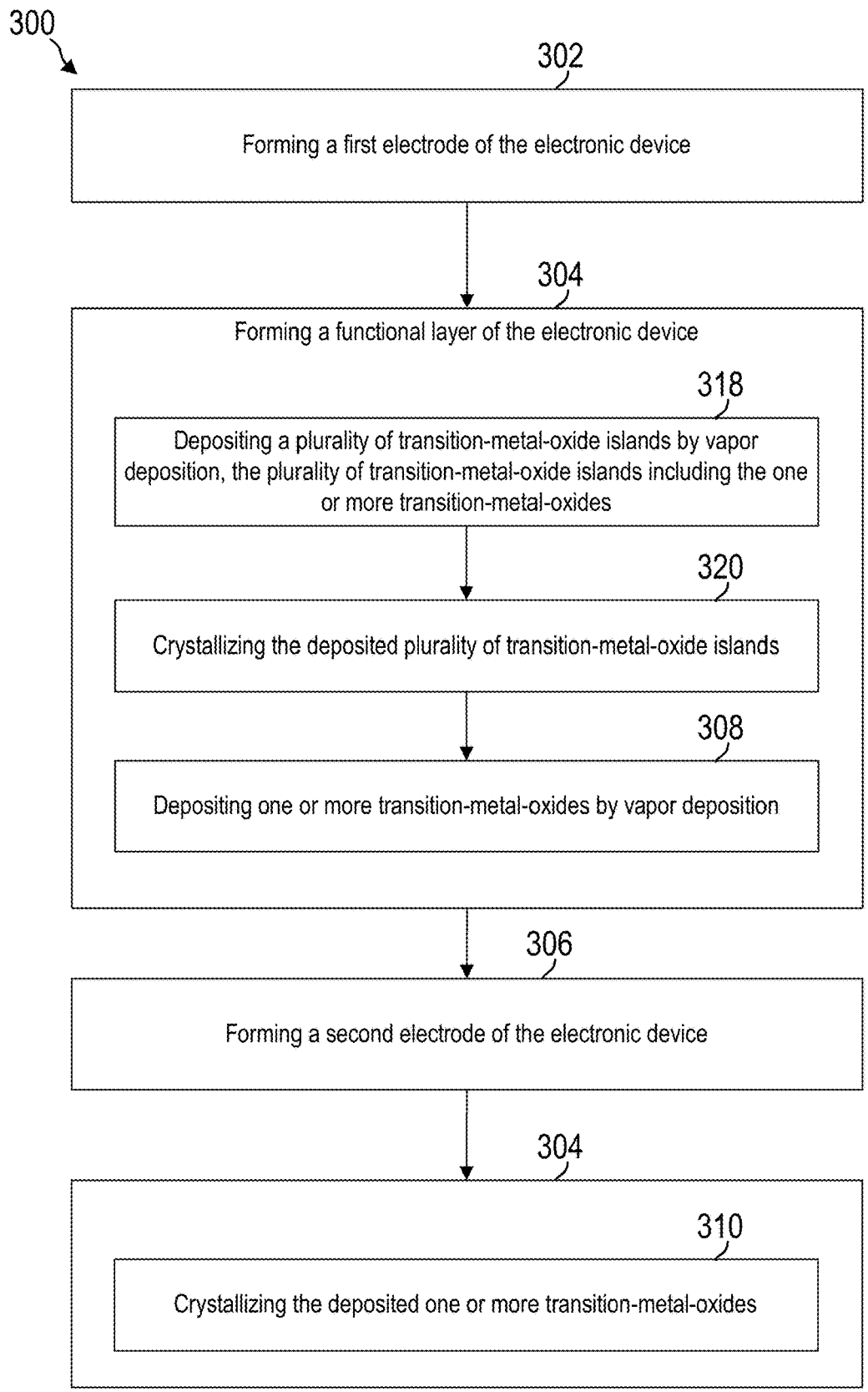

As shown in FIG. 12A, forming (in 304) the functional layer (e.g., the spontaneously polarizable memory layer) may include depositing a plurality of transition-metal-oxide islands by vapor deposition (in 318). The plurality of transition-metal-oxide islands may be deposited (in 318) prior to depositing the one or more transition-metal-oxides. The plurality of transition-metal-oxide islands may include the one or more transition-metal-oxides. Forming (in 304) the functional layer (e.g., the spontaneously polarizable memory layer) may include crystallizing the deposited plurality of transition-metal-oxide islands (in 320). The transition-metal-oxide islands may be crystallized by a thermal annealing, such as a furnace annealing, a flash-lamp annealing, and/or a laser annealing. The transition-metal-oxide islands may be crystallized prior to depositing (in 308) the one or more transition-metal-oxides. According to various aspects, a composition of the one or more transition-metal-oxides of the transition-metal-oxide islands may be different from a composition of the one or more transition-metal-oxides deposited subsequently. The crystallized transition-metal-oxide islands may serve as nucleation sites for a crystallization of the subsequently deposited transition-metal-oxides to enhance a crystallographic texture of the spontaneously polarizable memory layer. Depositing the one or more transition-metal-oxides in direct physical contact with the crystallized transition-metal-oxide islands may lead to the predefined crystallographic texture (and/or may support to obtain the predefined crystallographic texture) of the spontaneously polarizable memory layer.

Figure 12B:
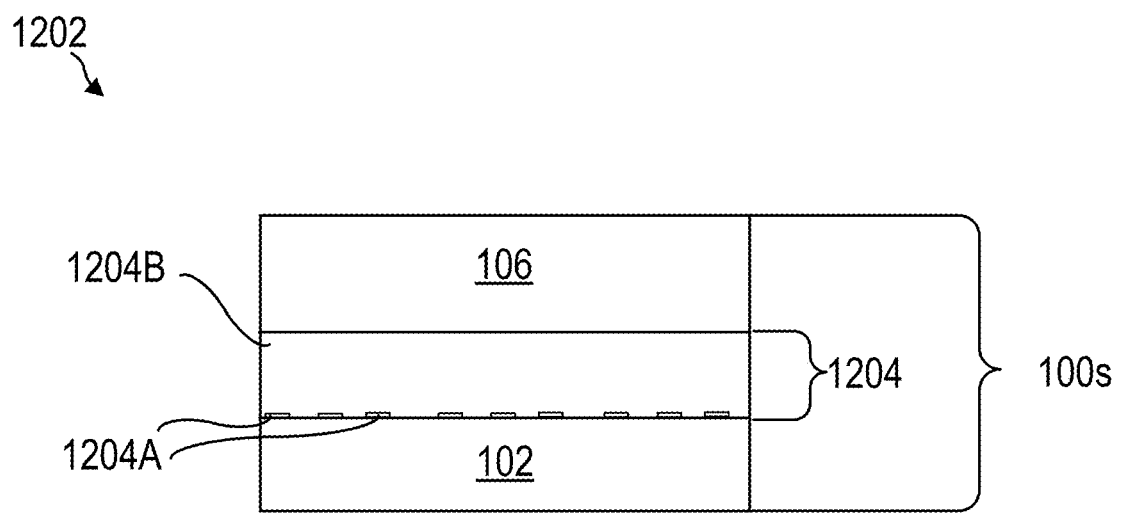

FIG. 12B shows an exemplary functional structure 1202 (e.g., a capacitive memory structure), according to various aspects. The functional structure 1202 may be formed by the method 300 as shown in FIG. 12A. The functional structure 1202 may include the first electrode 102, a spontaneously polarizable memory layer 1204 as a functional layer (e.g., as memory layer 104), and the second electrode 106. The spontaneously polarizable memory layer 1204 may include a plurality of spontaneously polarizable islands 1204A and a spontaneously polarizable sublayer 1204B. Both, the plurality of spontaneously polarizable islands 1204A and the spontaneously polarizable sublayer 1204B may include the same elements within one or more transition-metal-oxides. A composition of the elements within the one or more transition-metal-oxides of the plurality of spontaneously polarizable islands 1204A may be different from a composition of the elements within the one or more transition-metal-oxides of the spontaneously polarizable sublayer 1204B (e.g., an oxygen content of the one or more transition-metal-oxides may be increased for the plurality of spontaneously polarizable islands 1204A as compared to the spontaneously polarizable sublayer 1204B).

According to various aspects, the respective effects of the measures described with reference to FIG. 3 to FIG. 12B, which lead to (and/or which support a formation of) the predefined crystallographic texture and the defect density in the predefined range, may depend on an electrode material of the first electrode and/or an electrode material of the second electrode. In the following, various electrode materials are described and several of the above described measures are highlighted for the respective electrode material. In particular, metal nitride electrodes, oxidation resistant metal electrodes, and metal oxide electrodes are described.

(I) Metal Nitride Electrodes

According to various aspects, the first electrode and the second electrode may be formed by depositing a metal nitride. The metal nitride may be, for example, a titanium-based alloy (e.g., TiN, e.g., Ti—C—N, e.g., Ti—Al—N, e.g., TiN—TaN) or tantalum-based alloy (e.g., TaN, e.g., Ta—C—N, e.g., TaN—TiN). According to various aspects, forming (in 302) the first electrode may include a physical vapor deposition of (e.g., sputtering) the metal nitride. According to various aspects, forming (in 302) the first electrode may include an atomic layer deposition of the metal nitride. According to various aspects, forming (in 306)

the second electrode may include a physical vapor deposition of (e.g., sputtering) the metal nitride. According to various aspects, forming (in 306) the second electrode may include an atomic layer deposition of the metal nitride. For example, the metal nitride may be deposited at a temperature below 50° C. (e.g., at room temperature such as 25° C.).

With reference to FIG. 6A, the surface treatment of the first electrode may be a plasma treatment using a nitrogen-based compound (e.g., $N_2O$, e.g., $N_2$, e.g., $NH_3$). This may remove a Ti—O(—N) or Ta—O(—N) layer on the surface of the first electrode reducing defects in the capacitive memory structure (e.g., reducing dead layer effects at an interface of the first electrode and the spontaneously polarizable memory layer, e.g., reducing trapping sited at the interface of the first electrode and the spontaneously polarizable memory layer). According to various aspects, metal nitride electrodes may exhibit a scavenging behavior (e.g., an oxygen scavenging behavior). According to various aspects, the surface treatment of the first electrode may reduce the scavenging behavior of the first electrode.

With reference to FIG. 7A, the surface treatment of the deposited one or more transition-metal-oxides may be a plasma treatment using a nitrogen-based compound (e.g., $N_2O$, e.g., $NH_3$). This may also reduce defects in the capacitive memory structure (e.g., reducing dead layer effects at an interface of the first electrode and the spontaneously polarizable memory layer, e.g., reducing trapping sited at the interface of the first electrode and the spontaneously polarizable memory layer). According to various aspects, the surface treatment of the deposited one or more transition-metal-oxides may reduce the scavenging behavior of the first electrode. For example, the surface treatment of the deposited one or more transition-metal-oxides may form a stable barrier towards the second electrode to suppress a scavenging behavior of the second electrode. Illustratively, the surface of the first electrode may be nitrogen-passivated by the surface plasma treatment using the nitrogen-based compound.

According to various aspects, the one or more transition-metal-oxides may be deposited (in 308) by atomic layer deposition and a respective precursor pulse of oxygen of each ALD cycle of the first set of ALD cycles may include a pulse time in the range from about 0.1 second to about 1 second and the respective precursor pulse of oxygen of each ALD cycle of the second set of ALD cycles may include a pulse time in the range from about 1 second to about 30 seconds, as described with reference to FIG. 3. This may lead to a reduced oxygen content within the one or more transition-metal-oxides in a portion close to the first electrode. According to various aspects, the reduced oxygen content in the portion close to first electrode may reduce (e.g., prohibit) an oxidation of the interface of the first electrode and the spontaneously polarizable memory layer. The reduced interface oxidation may lead to (and/or may support a formation of) the predefined crystallographic texture of the spontaneously polarizable memory layer.

According to various aspects, crystallizing (in 310) the one or more transition-metal-oxides may include annealing the deposited one or more transition-metal-oxides in a substantially oxygen-free atmosphere (e.g., in an inert gas atmosphere, such as nitrogen or argon, e.g., in vacuum). This may prohibit an oxidation of the metal nitride electrodes (e.g., the first electrode, e.g., the second electrode) and may enable the predefined crystallographic texture of the spontaneously polarizable memory layer.

According to various aspects, using metal nitride electrodes in combination with one or more of the measures for supporting the predefined crystallographic texture and/or the defect density in the predefined range may increase a stability of a ferroelectric phase of the spontaneously polarizable memory layer. According to various aspects, using metal nitride electrodes in combination with one or more of the measures for supporting the predefined crystallographic texture and/or the defect density in the predefined range may reduce a leakage current and/or a wake-up reduction of the capacitive memory structure.

(II) Oxidation Resistant Metal Electrodes

According to various aspects, the first electrode and the second electrode may be formed by depositing an oxidation resistant metal (e.g., a noble metal). The oxidation resistant metal may have an electronegativity greater than 1.85 on the Pauling scale. The oxidation resistant metal may have a melting temperature greater than 1450° C. This may reduce an oxidation of the interface of the respective electrode (the first electrode and/or the second electrode) and the spontaneously polarizable memory layer. The reduced interface oxidation may lead to (and/or may support a formation of) the predefined crystallographic texture of the spontaneously polarizable memory layer. The oxidation resistant metal may include (e.g., consist of), for example, tungsten, platinum, iridium, ruthenium, palladium, osmium, rhodium, molybdenum, cobalt, rhenium, or nickel. According to various aspects, the first electrode and/or the second electrode may have a workfunction of the oxidation resistant metal equal to or greater than 5 eV. According to various aspects, using oxidation resistant metal electrodes in combination with the one or more transition-metal-oxides of the spontaneously polarizable memory layer (e.g., as a high-k capacitor dielectric) may suppress a charge injection due to the workfunction equal to or greater than 5 eV and a comparatively high band-offset. The band-offset may be a conduction band-offset for electrons (between Fermi-level of the electrode and the conduction band of the dielectric layers) or a valance ben offset for holes (between Fermi-level of the electrode and the valence band of the dielectric layers).

This may improve one or more electronic properties of the capacitive memory structure (e.g., a reduced leakage current, e.g., a reduced wake-up effect). According to various aspects, forming (in 302) the first electrode may include a physical vapor deposition of (e.g., sputtering) the oxidation resistant metal. According to various aspects, forming (in 302) the first electrode may include an atomic layer deposition of the oxidation resistant metal. According to various aspects, forming (in 306) the second electrode may include a physical vapor deposition of (e.g., sputtering) the oxidation resistant metal. According to various aspects, forming (in 306) the second electrode may include an atomic layer deposition of the oxidation resistant metal. For example, the oxidation resistant metal may allow the use of atomic layer deposition. For example, the oxidation resistant metal may be deposited at a temperature below 50° C. (e.g., at room temperature such as 25° C.). Using atomic layer deposition to form the first electrode and/or the second electrode may offer a 3D-integration of the capacitive memory structure.

According to various aspects, crystallizing (in 310) the one or more transition-metal-oxides may include annealing the deposited one or more transition-metal-oxides in a processing atmosphere (e.g., a nitrogen atmosphere, e.g., an argon atmosphere) including dilute oxygen. For example, the processing atmosphere may include an oxygen partial content in the range up to about 10%. For example, the processing atmosphere may include dilute oxygen introduced by a gas flow including less than 30% oxygen content. In some aspects, the oxygen content may be greater than 10%. For example, the processing atmosphere may be an oxygen atmosphere including substantially only oxygen. Using an atmosphere including oxygen may reduce an oxygen vacancy density of the material of the spontaneously polarizable memory layer. According to various aspects, the oxygen content of the processing atmosphere (e.g., the oxygen containing atmosphere) may be selected based on the Gibbs energy of the material of the oxidation resistant metal at the annealing temperature. According to various aspects, the oxygen content of the processing atmosphere may be selected the greater the greater the Gibbs energy of the material of the oxidation resistant metal at the annealing temperature. Table 1 shows the respective Gibbs energy of various materials at different temperatures:

| materials sorted with decreasing oxidation resistance of the respective metal | G at 0K in kJ/mol | slope in kJ/mol/K | Gibbs energy in kJ/mol at T in K | | | | | | | | | |
|---|---|---|---|---|---|---|---|---|---|---|---|---|
| | | | 298 | 673 | 773 | 873 | 973 | 1073 | 1173 | 1273 | 1323 | 1373 |
| $RhO_2(g)$ | 301 | 0.16 | 349 | 409 | 425 | 441 | 457 | 473 | 489 | 505 | 513 | 521 |
| $MoO_3(g)$ | −18 | 0.03 | −9 | 2 | 5 | 8 | 11 | 14 | 17 | 20 | 22 | 23 |
| $RuO_3$ | −53 | 0.04 | −41 | −26 | −22 | −18 | −14 | −10 | −6 | −2 | 0 | 2 |
| $RuO_4(g)$ | −90 | 0.07 | −69 | −43 | −36 | −29 | −22 | −15 | −8 | −1 | 3 | 6 |
| $PtO_2$ | −164 | 0 | −164 | −164 | −164 | −164 | −164 | −164 | −164 | −164 | −164 | −164 |
| PdO | −222 | 0.19 | −165 | −94 | −75 | −56 | −37 | −18 | 1 | −20 | 29 | 39 |
| $IrO_2$ | −234 | 0.17 | −183 | −120 | −103 | −86 | −69 | −52 | −35 | −18 | −9 | −1 |
| $Rh_2O_5$ | −199 | −0.02 | −205 | −212 | −214 | −216 | −218 | −220 | −222 | −224 | −225 | −226 |
| $M_2O_2(g)$ | −240 | 0.04 | −228 | −213 | −209 | −205 | −201 | −197 | −193 | −189 | −187 | −185 |
| $OsO_2$ | −290 | 0.18 | −236 | −169 | −151 | −133 | −115 | −97 | −79 | −61 | −52 | −43 |
| $RuO_2$ | −301 | 0.16 | −253 | −193 | −177 | −161 | −145 | −129 | −113 | −97 | −89 | −81 |
| $ReO_2$ | −428 | 0.17 | −377 | −314 | −297 | −280 | −263 | −246 | −229 | −212 | −203 | −195 |
| $CO_3O_4$ | −479 | 0.23 | −410 | −324 | −301 | −278 | −255 | −232 | −209 | −186 | −175 | −163 |
| $Ni_2O$ | −471 | 0.17 | −420 | −357 | −340 | −323 | −306 | −289 | −272 | −255 | −246 | −238 |
| $MoO_2$ | −478 | 0.17 | −427 | −364 | −347 | −330 | −313 | −296 | −279 | −262 | −253 | −245 |
| CoO | −491 | 0.16 | −443 | −383 | −367 | −351 | −335 | −319 | −303 | −287 | −279 | −271 |
| $MoO_3$ | −493 | 0.16 | −445 | −385 | −369 | −353 | −337 | −321 | −305 | −289 | −281 | −273 |
| $WO_3$ | −556 | 0.16 | −508 | −448 | −432 | −416 | −400 | −384 | −368 | −352 | −344 | −336 |
| $WO_2$ | −581 | 0.17 | −530 | −467 | −450 | −433 | −416 | −399 | −382 | −365 | −356 | −348 |
| $Ta_2O_5$ | −810 | 0.17 | −759 | −696 | −679 | −662 | −645 | −628 | −611 | −594 | −585 | −577 |
| $TiO_2$ | −941 | 0.18 | −887 | −820 | −802 | −784 | −766 | −748 | −730 | −712 | −703 | −694 |
| $Ti_3O_5$ | −974 | 0.17 | −923 | −860 | −843 | −826 | −809 | −792 | −775 | −758 | −749 | −741 |
| $Ti_2O_3$ | −1001 | 0.17 | −950 | −887 | −870 | −853 | −836 | −819 | −802 | −785 | −776 | −768 |
| TiO | −1029 | 0.15 | −984 | −928 | −913 | −898 | −883 | −868 | −853 | −838 | −831 | −823 |
| $HfO_2$ | −1063 | 0.17 | −1012 | −949 | −932 | −915 | −898 | −881 | −864 | −847 | −838 | −830 |
| $ZrO_2$ | −1092 | 0.18 | −1038 | −971 | −953 | −935 | −917 | −899 | −881 | −863 | −854 | −845 |

As can be seen in table 1, some of the metals may have gaseous oxide phases, e.g., Mo, Ru, Rh. Such metals may be treated in an atmosphere including diluted oxygen.

According to various aspects, using oxidation resistant metal electrodes may significantly reduce (e.g., rule out) an interface oxidation allowing for the predefined crystallographic texture and/or the defect density in the predefined range using one or more of the measures described herein. According to various aspects, a stability of a ferroelectric phase of the spontaneously polarizable memory layer may be increased a leakage current associated with the capacitive memory structure may be reduced, and/or a wake-up reduction of the capacitive memory structure may be reduced.

(III) Metal Oxide Electrodes

According to various aspects, the first electrode and the second electrode may be formed by depositing a metal oxide, $MO_x$. According to various aspects, this may prohibit an oxidation scavenging from the spontaneously polarizable memory layer to the electrodes. Hence, this may prohibit an increase of the oxygen vacancy density of the spontaneously polarizable memory layer in an interface region. According to various aspects, the metal oxide electrodes may provide oxygen to the spontaneously polarizable memory layer such that a stoichiometry of the spontaneously polarizable memory layer is maintained. Illustratively, using a metal oxide as an electrode material may serve as an oxygen reservoir for the spontaneously polarizable memory layer. The metal oxide may include (e.g., consist of), for example, iridium oxide, ruthenium oxide, osmium oxide, molybdenum oxide, indium tin oxide, strontium ruthenium oxide, strontium titanate, and/or lanthanum strontium manganite. According to various aspects, forming (in 302) the first electrode may include a physical vapor deposition of (e.g., sputtering) the metal oxide. According to various aspects, forming (in 302) the first electrode may include an atomic layer deposition of the metal oxide. For example, the metal oxide may allow the use of atomic layer deposition. According to various aspects, forming (in 306) the second electrode may include a physical vapor deposition of (e.g., sputtering) the metal oxide. According to various aspects, forming (in 306) the second electrode may include an atomic layer deposition of the metal oxide. For example, the metal oxide may be deposited at a temperature below 50° C. (e.g., at room temperature such as 25° C.). Using atomic layer deposition of the metal oxide to form the first electrode and/or the second electrode may offer a 3D-integration of the capacitive memory structure.

According to various aspects, crystallizing (in 310) the one or more transition-metal-oxides may include annealing the deposited one or more transition-metal-oxides in a processing atmosphere (e.g., a nitrogen atmosphere, e.g., an argon atmosphere) including dilute oxygen. For example, the processing atmosphere may include oxygen or may be an oxygen atmosphere (see, for example Table 1 and corresponding description). This may reduce an oxygen vacancy density of the spontaneously polarizable memory layer. According to various aspects, the one or more transition-metal-oxides may be annealed (e.g., furnace annealed) at 400° C. Using a metal oxide as electrode material may offer the use of laser annealing and/or flash-lamp annealing. According to various aspects, the one or more transition-metal-oxides may be annealed using a laser annealing and/or a flash-lamp annealing of the deposited one or more transition-metal-oxides with local temperatures in the range from about 1500° C. to about 1850° C. The local temperatures in the range from about 1500° C. to about 1850° C. may result in homologous temperature, $T_H$, of the capacitive memory structure given by a temperature, T, over a melting temperature of the one or more transition-metal-oxides, $T_{melt}$, in the range from about 0.6 to about 0.7 or greater than 0.7. This may increase an amount of heterogeneous nucleation (and, thus, reduce an amount of homogenous nucleation) associated with crystallizing (in 310) the one or more transition-metal-oxides. According to various aspects, the increased amount of heterogeneous nucleation during crystallizing the one or more transition-metal-oxides to form the spontaneously polarizable memory layer may enable (e.g., support) the formation of the predefined crystallographic texture.

According to various aspects, using metal oxide electrodes in combination with one or more of the measures for supporting the predefined crystallographic texture and/or the defect density in the predefined range may increase a stability of a ferroelectric phase of the spontaneously polarizable memory layer. According to various aspects, using metal oxide electrodes in combination with one or more of the measures for supporting the predefined crystallographic texture and/or the defect density in the predefined range may reduce a leakage current and/or a wake-up reduction of the capacitive memory structure.

According to various aspects, the method 300 may further include patterning the capacitive memory structure. For example, the second electrode may be patterned. For example, the second electrode and the spontaneously polarizable memory layer may be patterned. For example, the second electrode, the spontaneously polarizable memory layer, and the first electrode may be patterned. According to various aspects, patterning the capacitive memory structure may include forming a plurality of memory cells. The plurality of memory cells may constitute a memory cell arrangement.

Figure 13A:
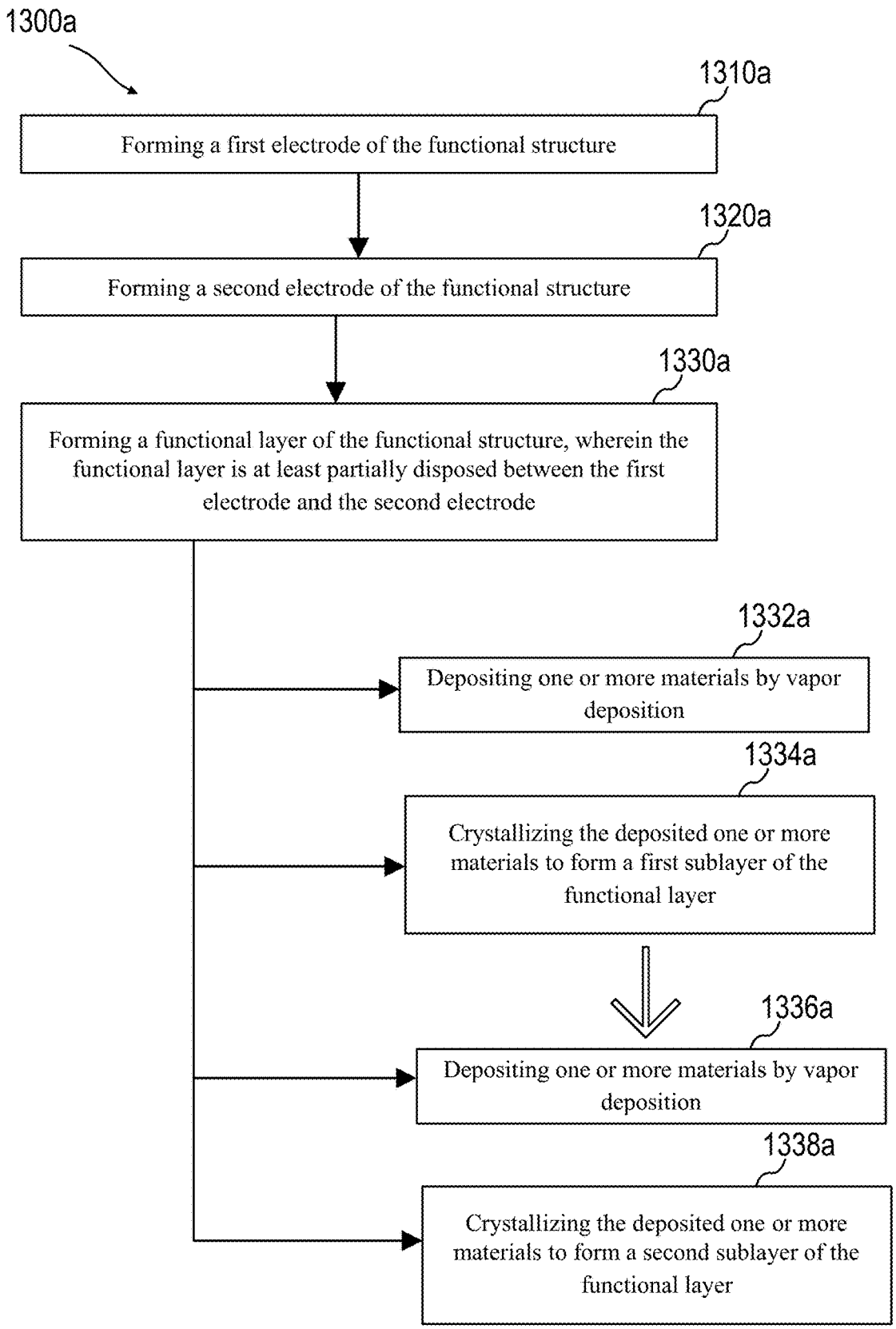

FIG. 13A shows a schematic flow diagram of a method 1300a for manufacturing a functional structure, according to various aspects. The method 1300a may include, in 1310a, forming a first electrode of the functional structure. The method 1300a may further include, in 1320a, forming a second electrode of the functional structure. The method 1300a may include, in 530a, forming a functional layer of the functional structure, wherein the functional layer is at least partially disposed between the first electrode and the second electrode. According to various aspects, forming the functional layer may include, e.g., in 1332a, depositing one or more materials by vapor deposition, and, e.g., in 1334a, crystallizing the deposited one or more materials to form a first sublayer of the functional layer. Furthermore, forming the functional layer may include, e.g., subsequently to 1332a, 1334a, e.g., in 1336a, depositing one or more materials by vapor deposition, and, e.g., in 1338a, crystallizing the deposited one or more materials to form a second sublayer of the functional layer.

Figure 13B:
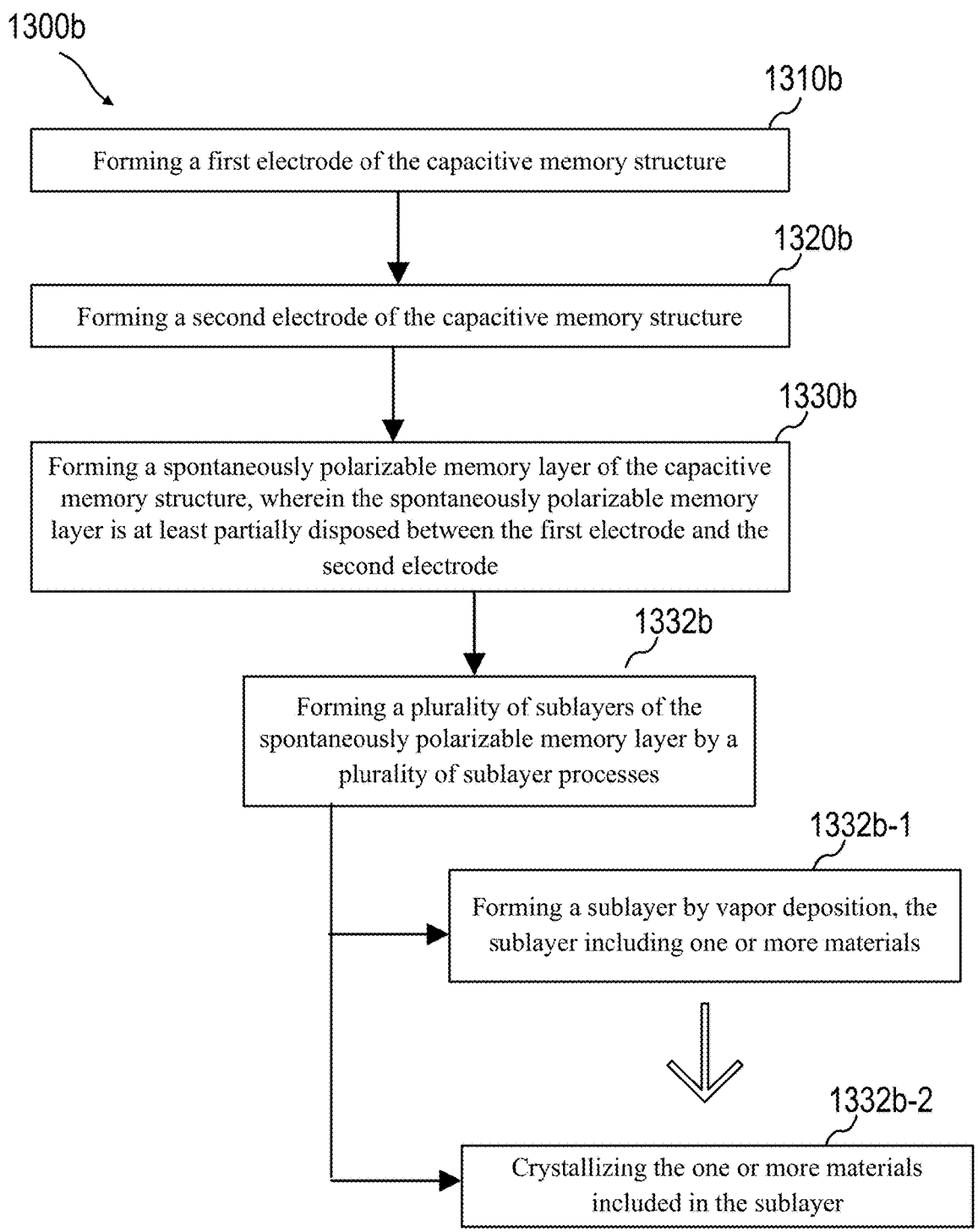

FIG. 13B shows a schematic flow diagram of a method 1300b for manufacturing a functional structure, according to various aspects. The method 1300b may include, in 1310b, forming a first electrode of the functional structure. The method 1300b may further include, in 1320b, forming a second electrode of the functional structure. The method 1300b may further include, in 1330b, forming a functional layer of the functional structure, wherein the functional layer is at least partially disposed between the first electrode and the second electrode. According to various aspects, forming the functional layer may include, e.g., in 1332b, forming a plurality of sublayers of the functional layer by a plurality of sublayer processes. According to various aspects, each sublayer process may include, e.g., in 1332b-1, forming a sublayer by vapor deposition, the sublayer including one or more materials, and, subsequently, e.g., in 1332b-2, crystallizing the one or more materials included in the sublayer.

Figure 13C:
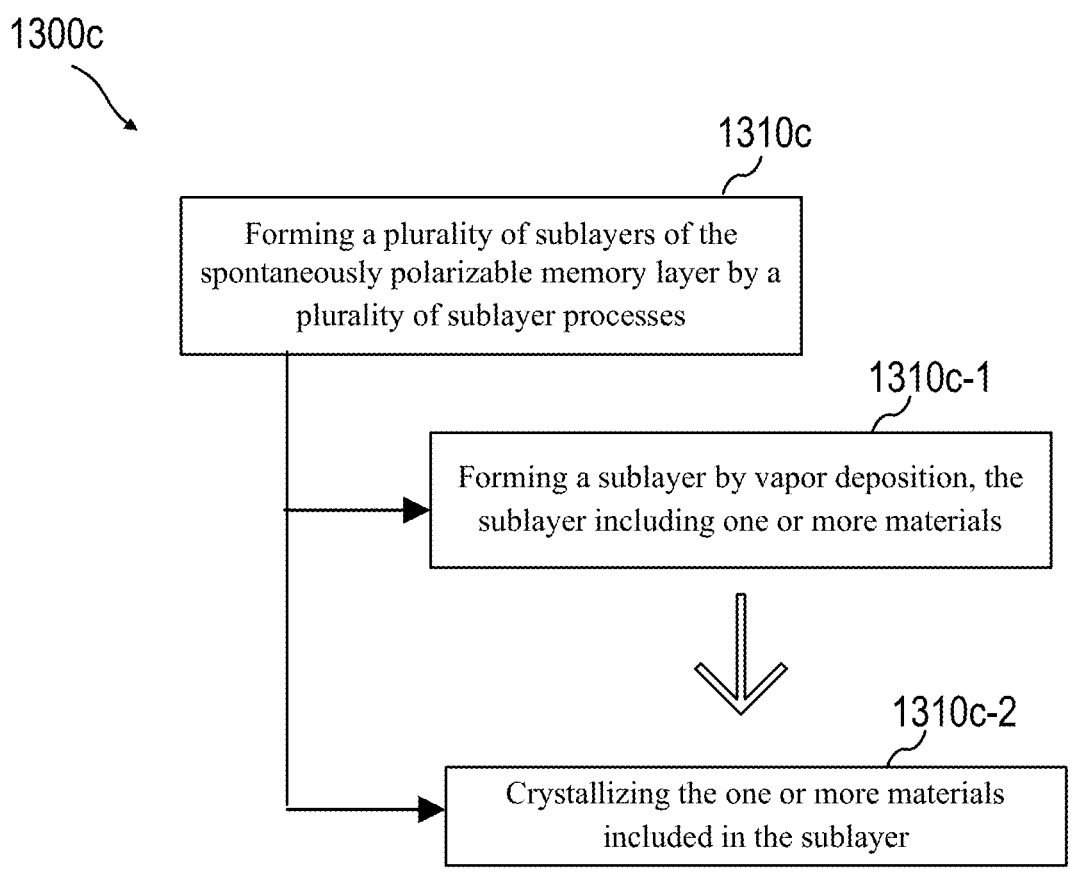

FIG. 13C shows a schematic flow diagram of a method 1300c for manufacturing a functional layer of an electronic device, according to various aspects. The method 1300c may include, in 1310c, forming a plurality of sublayers of a functional layer by a plurality of sublayer processes. According to various aspects, each sublayer process may include, e.g., in 1310c-1, forming a sublayer by vapor deposition, the sublayer including one or more materials, and, subsequently, e.g., in 1310c-2, crystallizing the one or more materials included in the sublayer.

According to various aspects, each of the methods 1300a, 1300b, 1300c may be used to form one or more functional layers of an electronic device. The one or more functional layers may include one or more sensor layers in the case that the electronic device is a sensor device. The one or more functional layers may include one or more memory layers in the case that the electronic device is a memory device. The one or more functional layers may include one or more piezoelectric layers in the case that the electronic device is an electromechanical sensor device. The one or more functional layers may include one or more pyroelectric layers in the case that the electronic device is a thermoelectric device (e.g., a thermoelectric sensor device or a thermoelectric generator device). More generally, the methods 1300a, 1300b, 1300c may be used to form one or more functional layers of an electronic device in the case that a predefined orientation of a polycrystalline material that forms the functional layer or that is at least part of the functional layer is relevant to increase the performance of the device. This may include generating a predefined texture in a functional layer to allow for an efficient polarization behavior of a polarizable material and/or an efficient electromechanical behavior of a piezoelectric material and/or an efficient thermoelectric behavior of a pyroelectric material, as examples. In other aspects, it may be desirable to form an electrode layer having a predefined texture, e.g., as a seed layer for another textured layer on top of the electrode layer, e.g., as an electrode layer an efficient electrical behavior (e.g., a lower resistance, a higher conductivity, an enhanced barrier property to reduce diffusion of other atoms through the electrode layer, as examples, compared to a similar but untextured electrode layer).

FIG. 14A, FIG. 14B, FIG. 14C, FIG. 14D, FIG. 14E, and FIG. 14F show schematically a manufacturing or at least parts of a manufacturing process of a functional layer 1404 of an electronic device 1400, according to various aspects. According to various aspects, the functional layer 1404 may be formed over a substrate 1401, in a substrate 1401, and/or directly on a substrate 1401, see, for example, FIG. 14F. According to various aspects, the substrate 1401 may include or may be a silicon substrate e.g., with or without a (e.g., native) $SiO_2$ surface layer, or any other suitable semiconductor substrate. In other aspects, the substrate may include or may be an electrically non-conductive substrate, e.g., a glass substrate. In still other aspects, the substrate may include or may be an electrically conductive substrate, e.g., a metal substrate.

According to various aspects, the functional layer 1404 may (e.g., a spontaneously polarizable layer, e.g., a piezoelectric layer, e.g., a pyroelectric layer) may be formed by a plurality of sublayer processes, see, for example, FIG. 14A to FIG. 14E. The structure (e.g., the substrate 1401, e.g., an electrode, e.g., an electronic structure such as a transistor stack, as examples) underlying the functional layer 1404 may have a planar shape. In this case, the functional layer 1404 may be formed by any type of vapor deposition, e.g., chemical or physical vapor deposition (e.g., sputtering, e.g., atomic layer deposition, as examples). In another aspect, the structure (e.g., the substrate 1401, e.g., an electrode, e.g., an electronic structure such as a transistor stack, as examples) underlying the functional layer 1404 may have a three-dimensional shape (e.g., may include a patterned layer, e.g., a fin structure, a trench structure, as examples). In this case, the functional layer 1404 may be formed by a suitable type of vapor deposition that allows for a conformal deposition of the functional layer 1404 as a conformal layer, e.g., atomic layer deposition, as example.

As explained above, thin layers of a material (e.g., of a metal, of a piezoelectric material, of a pyroelectric material, of a remanently polarizable material) may exhibit a polycrystalline microstructure, e.g., with an almost random orientation distribution of the crystals. An untextured layer may have no substantially preferred crystal orientation, e.g., the distribution of crystallographic orientations of a polycrystalline sample may be random. However, in some aspects, a textured layer (or in other words a textured material) of a material may be preferred in the case that volume properties of the material (such as a maximum possible polarization, a maximum possible response (e.g., electric field vs. stress) of a piezoelectric material or a maximum possible response (e.g. electric filed vs. temperature) of a pyroelectric material) are relevant.

According to various aspects, the functional layer 1404 may be disposed over an electrode, e.g., directly on a bottom electrode of the electronic device 1400, wherein the texture of the functional layer 1404 may be substantially the same as the texture of the material of the electrode. In some aspects, the texture of an electrode underlying the functional layer 1404 may define the texture of the functional layer 1404.

According to various aspects, the functional layer 1404 may be formed by repeated alternations (e.g., two or more alternations) of depositions (1403), e.g., sputter depositions or atomic layer depositions, and crystallizations (1405), e.g., crystallization anneals, until the final layer thickness 1404t is achieved for the functional layer 1404, see FIG. 4E. The final layer thickness 1404t of the functional layer 1404 may be, for example, in the range from about 3 nm to about 20 nm, e.g., in the range from about 8 nm to about 12 nm, in the case that the functional layer 1404 is a memory layer of a capacitive memory structure. For other applications, e.g., pyroelectric applications and/or piezoelectric applications, the functional layer 1404 may have a final layer thickness 1404t in the range from about 3 nm to about 1 μm.

According to various aspect, it was found that an amorphously deposited layer of a pyroelectric material and/or piezoelectric material may tend to nucleate homogeneously (i.e. in the volume of the layer). According to various aspects, it was found that a layer can be forced into the regime of heterogeneous nucleation by reducing the layer thickness prior to an anneal step to below the typical grain radius found for heterogeneous nucleation. Therefore, it may be beneficial to perform a crystallization (in 1405) after depositing (in 1403) a thin sublayer, e.g., a sublayer with a layer thickness on the range from about 1 nm to about 4 nm. The sublayer may be, for example, amorphously deposited by atomic layer deposition. However, a trade-off may be found as follows: A lower layer thickness may be beneficial to induce a heterogeneous nucleation during an annealing process, but the crystallization temperature may increase as the layer thickness decreases, see FIG. 4B and FIG. 4C.

In the following, various aspects of a method for processing (e.g., manufacturing) an electronic device or one or more functional layers of an electronic device are described. Aspects may be related to processes during manufacture, e.g., during manufacture of the electronic device 1400 described herein:

at a first time, an amorphous layer may be deposited; and at a second time after the first time, e.g., after the amorphous layer has been deposited, the deposited amorphous layer may be subjected to a temperature treatment (also referred to as an anneal) to at least induce partial crystallization of the layer and/or to at least induce formation of crystal nuclei with a crystallographic orientation that is not random.

in a first sub-process, depositing an amorphous layer; and (e.g., subsequently)

in a second sub-process after the first sub-process, e.g., after the amorphous layer has been deposited, annealing the deposited amorphous layer to at least induce partial crystallization of the layer and/or to at least induce formation of crystal nuclei with a crystallographic orientation that is not random. The first sub-process and the second sub-process may be executed multiple times (e.g., two times, three times, up to five times, up to ten times, as examples), wherein the first sub-process step followed by the second first sub-process until a desired layer thickness is reached.

Figure 14A:
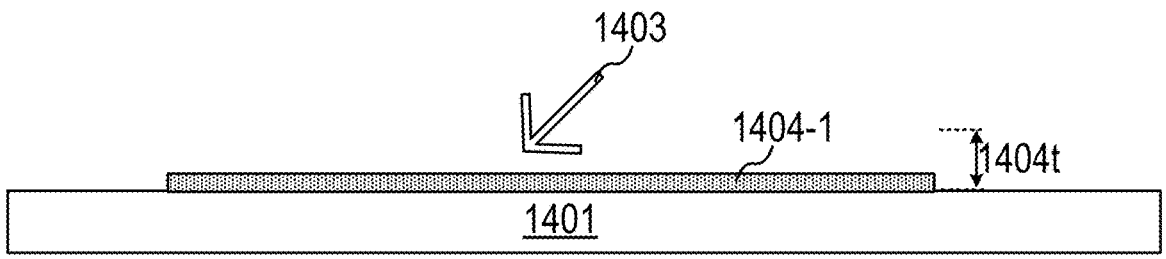
FIGS. 14A, 14B, 14C, 14D, 14E and 14F show schematically a manufacturing or at least parts of a manufacturing process of a functional layer of an electronic device, according to various aspects.
Figure 14B:
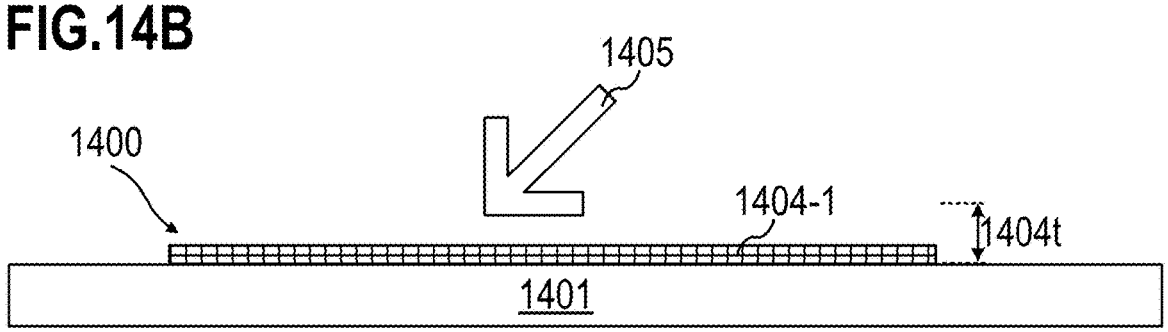
Figure 14C:
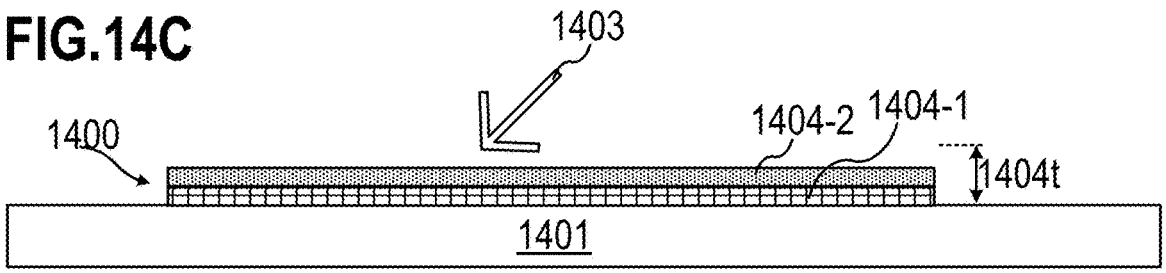
Figure 14D:
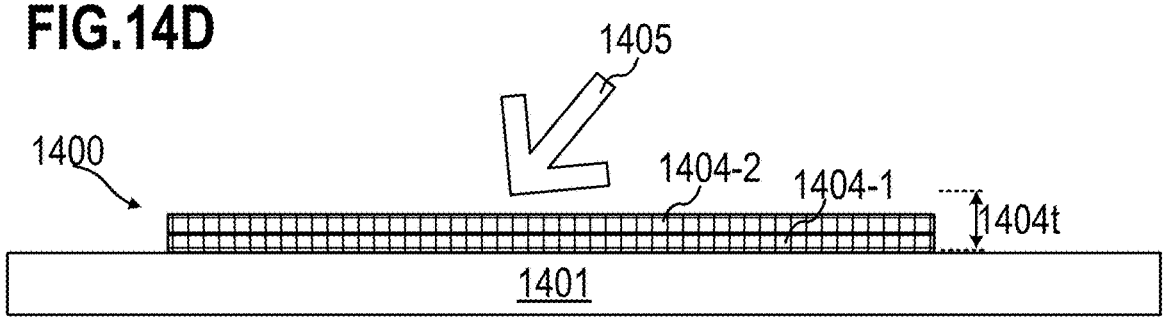
Figure 14E:
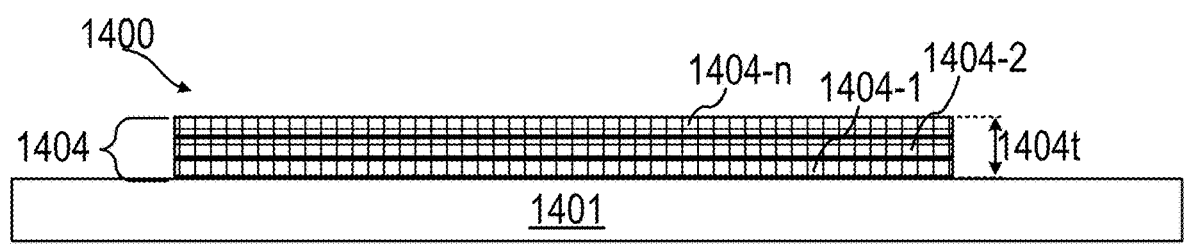
Figure 14F:
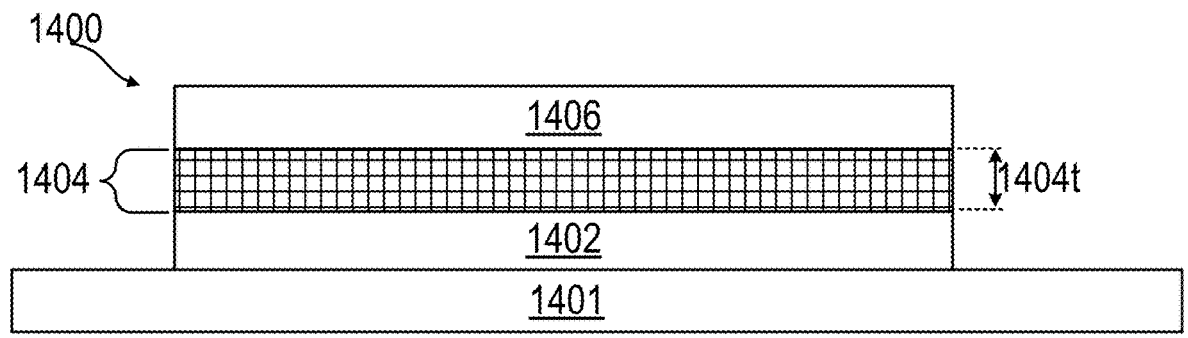

According to various aspects, the functional layer 1404 may be disposed at least partially between two electrodes 1402, 1406, c.f., for example, FIG. 14F. However, other shapes and/or arrangements of one or more electrodes may be suitable as well, e.g., depending on the configuration of the electronic device 1400. The electrodes of the electronic device 1400 may be formed as described herein with reference to the first electrode (e.g., first electrode 102, 502) and the second electrode (e.g., second electrode 106, 506).

According to various aspects, the functional layer 1404 may include a plurality of sublayers 1404-n (n may be in the range from about 2 to 20, e.g., in the range from about 3 to about 15), see, for example, FIG. 14E. An interface may remain between one or more (or each) neighboring pair of sublayers. In some aspects, the respective sublayers may partially crystallize, e.g., from the direction of the bottom electrode 1402. In this case, disordered crystals, defects, or other microstructural features may be present in an interface region between one or more (or each) neighboring pair of sublayers.

According to various aspects, a first sublayer of the plurality of sublayers (e.g., sublayer 1404-1) may include or may consist of a first material and the crystallization (in 1405) of the first sublayer may include or may consist of an annealing process at a first annealing temperature. Furthermore, a second sublayer of the plurality of sublayers (e.g., sublayer 1404-2) may include or may consist of a second material, distinct from the first material, and the crystallization (in 1405) of the second sublayer may include or may consist of an annealing process at a second annealing temperature distinct from the first annealing temperature. According to various aspects, a first sublayer of the plurality of sublayers (e.g., sublayer 1404-1) may include or may consist of a first material and the crystallization (in 1405) of the first sublayer may include or may consist of an annealing process having a first annealing duration. Furthermore, a second sublayer of the plurality of sublayers (e.g., sublayer 1404-2) may include or may consist of a second material, distinct from the first material, and the crystallization (in 1405) of the second sublayer may include or may consist of an annealing process having a second annealing duration distinct from the first annealing duration. Illustratively, a material dependent annealing temperature and/or annealing duration may be used in the interlayer anneal process, according to various aspects.

In some aspects, the electronic device 1400 may be a piezo-electric device or may be at least part of a piezo-electric device, e.g., the functional layer 1404 may be part of a piezo-electric device. An example for a piezo-electric device may be an acoustic resonator (e.g., a filter for a telecommunication device). The acoustic resonator may be a surface acoustic wave (SAW) resonator or a bulk acoustic wave (SAW) resonator, as example. In some aspects, the acoustic resonator may include two or more electrodes implemented as an input transducer and an output transducer coupled to (e.g., in contact with) the functional layer 1404 including the piezoelectric material. The method of forming the functional layer 1404 (e.g., the intra-layer anneal process) may enhance the piezoelectric coefficient by at least 20%, e.g., 50%, or 100%. A piezoelectric material may include or may be scandium doped aluminum nitride (Sc:AlN), aluminum doped zinc oxide (Al:ZnO). In some aspects, such piezoelectric materials may have no ferroelectric properties. According to various aspects, the electrodes of the electronic device 1400 may be configured as interdigital electrodes (IDEs). In some aspects, the electronic device 1400 may be an interdigital sensor. In some aspects, the electronic device 1400 may be an interdigital transducer.

In some aspects, the electronic device 1400 may be a pyroelectric device or may be at least part of a pyroelectric device, e.g., the functional layer 1404 may be part of a pyroelectric device. An example for a pyroelectric device may be an pyroelectric power generator, a pyroelectric heat sensor, only as examples. A pyroelectric material may include or may be gallium nitride, boron aluminum nitride (BAlN), boron gallium nitride (BGaN), caesium nitrate ($CsNO_3$), lithium tantalate ($LiTaO_3$), doped hafnium oxide ($HfO_2$). It is noted that some pyroelectric materials may exhibit piezoelectric properties as well.

In some aspects, the electronic device 1400 may be an energy storage capacitor (e.g., a supercap) or a decoupling capacitor, as example. In such applications, the ferroelectric polarization may provide a charge boost. However, memory properties in terms of data storage (as for example achieved by the memory cells and/or capacitive memory structures described herein) may not be in the focus of such applications.

According to various aspects, the functional layer 1404 of the electronic device 1400, e.g., for memory applications or other applications, may include any type of ferroelectric or antiferroelectric material, e.g., aluminum doped zinc oxide (Al:ZnO), e.g., scandium nitride (ScN), e.g. aluminum nitride (AlN), e.g., scandium-doped aluminum nitride (Sc:AlN). According to various aspects, the functional layer 1404 of the electronic device 1400, e.g., for memory applications or other applications, may include metal oxide or metal nitride, e.g., a transition metal oxide or transition metal nitride.

In the following, various aspects are described that are related to the methods 300, 500a, 500b, 1300a, 1300b, 1300c for manufacturing a functional structure (e.g., a capacitive memory structure, e.g., a functional layer), the capacitive memory structures 100, 200b, and the functional structures 500s, 620, 700, 802, 812, 902, 1002, 1102, 1202, 1400 (e.g., a capacitive memory structure, e.g., an electronic device).

In the following, various examples are provided that may include one or more aspects described above with reference to the methods 300, 500a, 500b, 1300a, 1300b, 1300c, the capacitive memory structures 100, 200b, the functional structures 500s, 620, 700, 802, 812, 902, 1002, 1102, 1202, 1400. It may be intended that aspects described in relation to one of the methods 300, 500a, 500b, 1300a, 1300b, 1300c may apply also to the other methods. It may be intended that aspects described in relation to the methods 300, 500a, 500b, 1300a, 1300b, 1300c may apply also to the capacitive memory structures 100, 200b and/or to the functional structures 500s, 620, 700, 802, 812, 902, 1002, 1102, 1202, 1400 and vice versa.

Example 1 is a method for manufacturing a functional structure, the method including: forming a first electrode of the functional structure, forming a second electrode of the functional structure, and forming a functional layer of the functional structure. The functional layer is at least partially disposed between the first electrode and the second electrode. At least one of forming the first electrode and/or forming the functional layer is configured such that the functional layer is formed with predefined properties (e.g., at least one of a predefined crystallographic texture and a defect density in a predefined range). According to some aspects, the functional structure may be a capacitive memory structure and the method may include: forming a first electrode of the capacitive memory structure, forming a second electrode of the capacitive memory structure, and forming a spontaneously polarizable memory layer of the capacitive memory structure. The spontaneously polarizable memory layer is at least partially disposed between the first electrode and the second electrode. Forming the spontaneously polarizable memory layer may include: depositing one or more transition-metal-oxides by vapor deposition, and crystallizing the deposited one or more transition-metal-oxides, at least one of forming the first electrode and/or forming the spontaneously polarizable memory layer is configured such that the spontaneously polarizable memory layer is formed with at least one of a predefined crystallographic texture and a defect density in a predefined range.

In Example 2, the method of Example 1 can optionally include that forming the spontaneously polarizable memory layer includes forming a plurality of sublayers of the spontaneously polarizable memory layer by a plurality of sublayer processes, each sublayer process including: depositing the one or more transition-metal-oxides by vapor deposition to form a sublayer, and, subsequently, crystallizing the deposited one or more transition-metal-oxides included in the sublayer.

Example 3 is a method for manufacturing a capacitive memory structure, the method including: forming a first electrode of the capacitive memory structure, forming a second electrode of the capacitive memory structure, and forming a spontaneously polarizable memory layer of the capacitive memory structure, wherein the spontaneously polarizable memory layer is at least partially disposed between the first electrode and the second electrode, and wherein forming the spontaneously polarizable memory layer includes: depositing one or more transition-metal-oxides by vapor deposition, and crystallizing the deposited one or more transition-metal-oxides to form a first sublayer of the spontaneously polarizable memory layer, and, subsequently, depositing one or more transition-metal-oxides by vapor deposition, and crystallizing the deposited one or more transition-metal-oxides to form a second sublayer of the spontaneously polarizable memory layer.

Example 4 is a method for manufacturing a capacitive memory structure, the method including: forming a first electrode of the capacitive memory structure, forming a second electrode of the capacitive memory structure, and forming a spontaneously polarizable memory layer of the capacitive memory structure, wherein the spontaneously polarizable memory layer is at least partially disposed between the first electrode and the second electrode, and wherein forming the spontaneously polarizable memory layer includes forming a plurality of sublayers of the spontaneously polarizable memory layer by a plurality of sublayer processes, each sublayer process including: forming a sublayer by vapor deposition, the sublayer including one or more materials, and, subsequently, crystallizing the one or more materials included in the sublayer.

Example 5 is a method for manufacturing a spontaneously polarizable memory layer, the method including: forming a plurality of sublayers of the spontaneously polarizable memory layer by a plurality of sublayer processes, each sublayer process including: forming a sublayer by vapor deposition, the sublayer including one or more materials, and, subsequently, crystallizing the one or more materials included in the sublayer.

In Example 6, the method of any one of Examples 2 to 5 can optionally include that the one or more materials included in the sublayer include one or more transition metal oxides. e.g., one or more amorphous transition metal oxides.

In Example 7, the method of any one of Examples 2 to 6 can optionally include that forming the sublayer by vapor deposition includes: depositing the one or more materials and, subsequently, doping the one or more materials, or the one or more one or more materials included in the sublayer are one or more doped materials.

In Example 8, the method of any one of Examples 2 to 7 can optionally include that forming the sublayer by vapor deposition includes depositing one or more amorphous materials.

In Example 9, the method of Example 8 can optionally include that crystallizing the one or more materials included in the sublayer includes generating one or more single crystalline or polycrystalline materials from the amorphous material.

In Example 10, the method of any one of Examples 2 to 9 can optionally include that crystallizing the one or more materials included in the sublayer includes increasing a crystallinity of one or more materials of the sublayer.

In Example 11, the method of Example 10 can optionally include that increasing the crystallinity of the one or more materials of the sublayer includes an increase of an average grain size of the one or more materials of the sublayer.

In Example 12, the method of Example 10 or 11 can optionally include that increasing the crystallinity of the one or more materials of the sublayer includes a reduction of a total number of grains of the one or more materials included in the sublayer.

In Example 13, the method of any one of Examples 2 to 12 can optionally include that crystallizing the one or more materials included in the sublayer includes thermally annealing the sublayer. An annealing temperature during thermally annealing the sublayer may be in the range from about 300° C. to about 1100° C. An annealing duration for thermally annealing the sublayer may be in the range from about 1 s to about 10 min.

In Example 14, the method of any one of Examples 2 to 13 can optionally include that crystallizing the one or more materials included in the sublayer includes generating a textured sublayer.

In Example 15, the method of Example 14 can optionally include that the textured sublayer has at least one of an (001)-texture or a (111)-texture.

In Example 16, the method of any one of Examples 2 to 15 can optionally include that the sublayer has a layer thickness in the range from about 0.5 nm to about 5 nm, preferably in the range from about 1 nm to about 4 nm.

In Example 17, the method of any one of Examples 2 to 16 can optionally include that a layer thickness of the spontaneously polarizable memory layer is defined by a total number of sublayers of the spontaneously polarizable memory layer and respective layer thicknesses of the sublayers.

In Example 18, the method of any one of Examples 2 to 17 can optionally include that the vapor deposition includes atomic layer deposition.

In Example 19, the method of any one of Examples 2 to 18 can optionally include that at least one of the first electrode and/or the second electrode have a curved or angled shape.

In Example 20, the method of any one of Examples 2 to 19 can optionally include that the vapor deposition includes sputtering.

In Example 21, the method of any one of Examples 2 to 18 and/or 20 can optionally include that at least one of the first electrode and/or the second electrode have a planar shape.

In Example 22, the method of any one of Examples 2 to 18 and/or 20 can optionally include that at least one of the first electrode and/or the second electrode have a non-planar shape.

In Example 23, the method of any one of Examples 1 to 22 can optionally include that at least one of forming the first electrode and/or forming the spontaneously polarizable memory layer is configured such that the spontaneously polarizable memory layer is formed with at least one of a predefined crystallographic texture and a defect density in a predefined range.

In Example 24, the method of Example 23 can optionally include that forming the spontaneously polarizable memory layer includes a surface treatment of the first electrode prior to depositing the one or more transition-metal-oxides such that the spontaneously polarizable memory layer is formed with the predefined crystallographic texture and the defect density in the predefined range.

Example 25 is a method for manufacturing a capacitive memory structure, the method including: forming a first electrode of the capacitive memory structure, forming a second electrode of the capacitive memory structure, and forming a spontaneously polarizable memory layer of the capacitive memory structure, wherein the spontaneously polarizable memory layer is at least partially disposed between the first electrode and the second electrode, and wherein forming the spontaneously polarizable memory layer includes: depositing one or more transition-metal-oxides by vapor deposition, a surface treatment of the first electrode prior to depositing the one or more transition-metal-oxides, and crystallizing the deposited one or more transition-metal-oxides.

In Example 26, the method of Example 24 or 25 can optionally include that the surface treatment includes a plasma treatment.

In Example 27, the method of any one of Examples 23 to 26 can optionally include that forming the spontaneously polarizable memory layer includes a surface treatment of the deposited one or more transition-metal-oxides prior to crystallizing the deposited one or more transition-metal-oxides and prior to forming the second electrode such that the spontaneously polarizable memory layer is formed with the predefined crystallographic texture and the defect density in the predefined range.

Example 28 is a method for manufacturing a capacitive memory structure, the method including: forming a first electrode of the capacitive memory structure, forming a second electrode of the capacitive memory structure, and forming a spontaneously polarizable memory layer of the capacitive memory structure, wherein the spontaneously polarizable memory layer is at least partially disposed between the first electrode and the second electrode, and wherein forming the spontaneously polarizable memory layer includes: depositing one or more transition-metal-oxides by vapor deposition, crystallizing the deposited one or more transition-metal-oxides, and a surface treatment of the deposited one or more transition-metal-oxides prior to crystallizing the deposited one or more transition-metal-oxides and prior to forming the second electrode.

In Example 29, the method of Example 27 or 28 can optionally include that the surface treatment includes a plasma treatment.

In Example 30, the method of any one of Examples 23 to 29 can optionally include that forming the spontaneously polarizable memory layer includes doping the one or more transition-metal-oxides with a trivalent dopant prior to crystallizing the deposited one or more transition-metal-oxides such that the spontaneously polarizable memory layer is formed with the predefined crystallographic texture and the defect density in the predefined range.

Example 31 is a method for manufacturing a capacitive memory structure, the method including: forming a first electrode of the capacitive memory structure, forming a second electrode of the capacitive memory structure, and forming a spontaneously polarizable memory layer of the capacitive memory structure, wherein the spontaneously polarizable memory layer is at least partially disposed between the first electrode and the second electrode, and wherein forming the spontaneously polarizable memory layer includes: depositing one or more transition-metal-oxides by vapor deposition, doping the one or more transition-metal-oxides with a trivalent dopant, and crystallizing the doped one or more transition-metal-oxides.

Example 32 is a method for manufacturing a spontaneously polarizable memory layer, the method including: depositing hafnium zirconium oxide by vapor deposition, doping the hafnium zirconium oxide with a trivalent dopant, and crystallizing the doped hafnium zirconium oxide.

In Example 33, the method of any one of Examples 30 to 32 can optionally include that doping the one or more transition-metal-oxides with a trivalent dopant includes doping at least a first portion and a second portion of the one or more transition-metal-oxides with the trivalent dopant. The first portion is at least partially disposed between the first electrode and a center portion of the one or more transition-metal-oxides and the second portion is at least partially disposed between the second electrode and the center portion of the one or more transition-metal-oxides.

In Example 34, the method of any one of Examples 30 to 33 can optionally include that the trivalent dopant includes at least one element of the following group of elements: gadolinium, lanthanum, yttrium, scandium, and/or ytterbium.

In Example 35, the method of any one of Examples 23 to 34 can optionally include that depositing the one or more transition-metal-oxides includes depositing a first transition-metal-oxide layer, depositing a second transition-metal-oxide layer, and forming an insulating layer at least partially disposed between the first transition-metal-oxide layer and the second transition-metal-oxide layer such that the spontaneously polarizable memory layer is formed with the predefined crystallographic texture and the defect density in the predefined range.

Example 36 is a method for manufacturing a capacitive memory structure, the method including: forming a first electrode of the capacitive memory structure, forming a second electrode of the capacitive memory structure, and forming a spontaneously polarizable memory layer of the capacitive memory structure, wherein the spontaneously polarizable memory layer is at least partially disposed between the first electrode and the second electrode, and wherein forming the spontaneously polarizable memory layer includes: depositing a first transition-metal-oxide layer, depositing a second transition-metal-oxide layer, forming an insulating layer at least partially disposed between the first transition-metal-oxide layer and the second transition-metal-oxide layer, and crystallizing the deposited first transition-metal-oxide layer and the deposited second transition-metal-oxide layer.

In Example 37, the method of Example 35 or 36 can optionally include that the insulating layer has a thickness of 1 nm or less.

In Example 38, the method of any one of Examples 35 to 37 can optionally include that the insulating layer includes aluminum oxide (e.g., consists of aluminum oxide, e.g., includes a compound including aluminum oxide).

In Example 39, the method of any one of Examples 23 to 38 can optionally include that forming the first electrode includes forming a plurality of crystalline electrode islands and forming a first electrode layer in direct physical contact with the plurality of crystalline electrode islands such that the spontaneously polarizable memory layer is formed with the predefined crystallographic texture and the defect density in the predefined range, a material of the crystalline electrode islands corresponds to a material of the first electrode layer.

Example 40 is a method for manufacturing a capacitive memory structure, the method including: forming a first electrode of the capacitive memory structure, forming a second electrode of the capacitive memory structure, and forming a spontaneously polarizable memory layer of the capacitive memory structure, wherein the spontaneously polarizable memory layer is at least partially disposed between the first electrode and the second electrode and wherein forming the first electrode includes: forming a plurality of (e.g., crystalline) electrode islands, and forming a first electrode layer in direct physical contact with the plurality of electrode islands, a material of the electrode islands corresponds to a material of the first electrode layer.

In Example 41, the method of any one of Examples 23 to 39 can optionally include that forming the first electrode includes forming a platinum layer and forming a first electrode layer in direct physical contact with the platinum layer such that the spontaneously polarizable memory layer is formed with the predefined crystallographic texture and the defect density in the predefined range.

Example 42 is a method for manufacturing a capacitive memory structure, the method including: forming a first electrode of the capacitive memory structure, forming a second electrode of the capacitive memory structure, and forming a spontaneously polarizable memory layer of the capacitive memory structure, wherein the spontaneously polarizable memory layer is at least partially disposed between the first electrode and the second electrode and wherein forming the first electrode includes: forming a platinum layer, and forming a first electrode layer in direct physical contact with the platinum layer.

In Example 43, the method of any one of Examples 23 to 42 can optionally include that forming the spontaneously polarizable memory layer includes depositing a plurality of transition-metal-oxide islands by vapor deposition and crystallizing the deposited plurality of transition-metal-oxide islands prior to depositing the one or more transition-metal-oxides such that the spontaneously polarizable memory layer is formed with the predefined crystallographic texture and the defect density in the predefined range, the plurality of transition-metal-oxide islands including the one or more transition-metal-oxides.

Example 44 is a method for manufacturing a capacitive memory structure, the method including: forming a first electrode of the capacitive memory structure, forming a second electrode of the capacitive memory structure, and forming a spontaneously polarizable memory layer of the capacitive memory structure, wherein the spontaneously polarizable memory layer is at least partially disposed between the first electrode and the second electrode, and wherein forming the spontaneously polarizable memory layer includes: depositing a plurality of transition-metal-oxide islands by vapor deposition, depositing one or more transition-metal-oxides by vapor deposition, and crystallizing the deposited plurality of transition-metal-oxide islands prior to depositing the one or more transition-metal-oxides, the plurality of transition-metal-oxide islands including the one or more transition-metal-oxides.

In Example 45, the method of any one of Examples 1 to 44 can optionally include that the vapor deposition includes an atomic layer deposition.

In Example 46, the method of Example 45 can optionally include that the atomic layer deposition (ALD) includes a plurality of ALD cycles, each ALD cycle of the plurality of ALD cycles includes a respective transition-metal precursor pulse for each transition-metal of the one or more transition-metal-oxides at a temperature equal to or below 300° C. (e.g., below 260° C.) and a precursor pulse of oxygen.

In Example 47, the method of Example 46 can optionally include that the respective precursor pulse of oxygen of each ALD cycle of the plurality of ALD cycles includes a pulse time in the range from about 1 second to about 30 seconds.

In Example 48, the method of Example 32 and any one of Examples 46 or 47 can optionally include that at least one ALD cycle of the plurality of ALD cycles includes a precursor pulse of the trivalent dopant.

Example 49 is a method for manufacturing a spontaneously polarizable memory layer, the method including: depositing doped one or more transition-metal-oxides by atomic layer deposition, the atomic layer deposition, ALD, including a plurality of ALD cycles, at least one of the plurality of ALD cycles includes: at least one precursor pulse including a transition metal of the one or more transition-metal-oxides, at least one precursor pulse of oxygen, and at least one precursor pulse including a trivalent dopant.

In Example 50, the method of any one of Examples 46 to 49 can optionally include that each ALD cycle of the plurality of ALD cycles includes a precursor pulse of the trivalent dopant.

In Example 51, the method of Example 33 and any one of Examples 46 to 50 can optionally include that the plurality of ALD cycles includes one or more first ALD cycles associated with depositing the first portion of the one or more transition-metal-oxides and one or more second ALD cycles associated with depositing the second portion of the one or more transition-metal-oxides, each ALD cycle of the one or more first ALD cycles and each ALD cycle of the one or more second ALD cycles includes a respective precursor pulse of the trivalent dopant.

In Example 52, the method of Example 35 and any one of Examples 46 to 51 can optionally include that forming the insulating layer includes an atomic layer deposition of an insulating material after a predefined number of ALD cycles of the plurality of ALD cycles and prior to the other ALD cycles of the plurality of ALD cycles.

In Example 53, the method of any one of Examples 1 to 52 can optionally include that the one or more transition-metal-oxides include hafnium zirconium oxide.

In Example 54, the method of Example 53 can optionally include that the hafnium zirconium oxide includes a mixing ratio of hafnium and zirconium in the range from about 40:60 to about 60:40.

In Example 55, the method of any one of Examples 1 to 54 can optionally include that the one or more transition-metal-oxides include hafnium oxide or zirconium oxide.

In Example 56, the method of any one of Examples 1 to 55 can optionally include that the first electrode has a thickness in the range from about 8 nm to about 12 nm.

In Example 57, the method of any one of Examples 1 to 56 can optionally include that the second electrode has a thickness in the range from about 8 nm to about 12 nm.

In Example 58, the method of any one of Examples 1 to 57 can optionally include that the spontaneously polarizable memory layer has a thickness in the range from about 8 nm to about 12 nm.

In Example 59, the method of any one of Examples 1 to 58 can optionally include that a thickness of the second electrode is different from a thickness of the first electrode.

In Example 60, the method of any one of Examples 1 to 59 can optionally include that the first electrode includes a metal nitride and the second electrode includes the metal nitride.

In Example 61, the method of Example 60 can optionally include that the metal nitride includes titanium nitride (e.g., TiN, e.g., Ti—C—N, e.g., Ti—Al—N, e.g., TiN—TaN) and/or tantalum nitride (e.g., TaN, e.g., Ta—C—N, e.g., Ta—Al—N, e.g., TiN—TaN).

In Example 62, the method of Example 60 or 61 can optionally include that forming the first electrode includes a physical vapor deposition of (e.g., sputtering) the metal nitride below 50° C. (e.g., at room temperature such as 25° C.).

In Example 63, the method of any one of Examples 60 to 62 can optionally include that forming the second electrode includes a physical vapor deposition of (e.g., sputtering) the metal nitride below 30° C.

In Example 64, the method of any one of Examples 60 to 63 can optionally include that the surface treatment includes a plasma treatment using a nitrogen-based compound (e.g., $N_2O$, e.g., $N_2$, e.g., $NH_3$).

In Example 65, the method of any one of Examples 60 to 64 can optionally include that the atomic layer deposition (ALD) includes a plurality of ALD cycles, each ALD cycle of the plurality of ALD cycles includes a respective transition-metal precursor pulse for each transition-metal of the one or more transition-metal-oxides and a precursor pulse of oxygen. The plurality of ALD cycles includes a first set of ALD cycles and a second set of ALD cycles performed after the first set of ALD cycles. The respective precursor pulse of oxygen of each ALD cycle of the first set of ALD cycles includes a pulse time in the range from about 0.1 second to about 1 second and the respective precursor pulse of oxygen of each ALD cycle of the second set of ALD cycles includes a pulse time in the range from about 1 second to about 30 seconds.

In Example 66, the method of any one of Examples 60 to 65 can optionally include that crystallizing the deposited one or more transition-metal-oxides includes annealing the deposited one or more transition-metal-oxides at 400° C. in a substantially oxygen-free atmosphere (e.g., $N_2$, e.g., Ar, e.g., vacuum).

In Example 67, the method of any one of Examples 1 to 59 can optionally include that the first electrode layer includes an oxidation resistant metal and the second electrode layer includes the oxidation resistant metal, the oxidation resistant metal including an electronegativity greater than 1.85 on the Pauling scale and a melting temperature greater than 1450° C.

In Example 68, the method of Example 67 can optionally include that the oxidation resistant metal includes tungsten, platinum, iridium, ruthenium, palladium, osmium, rhodium, molybdenum, cobalt, rhenium, or nickel.

In Example 69, the method of Example 67 or 68 can optionally include that the first electrode and the second electrode include a respective workfunction of the oxidation resistant metal equal to or greater than 5 eV.

In Example 70, the method of any one of Examples 67 to 69 can optionally include that forming the first electrode and/or forming the second electrode includes a physical vapor deposition of (e.g., sputtering) the oxidation resistant metal below 50° C. (e.g., at room temperature such as 25° C.).

In Example 71, the method of any one of Examples 67 to 70 can optionally include that forming the first electrode and/or forming the second electrode includes an atomic layer deposition of the oxidation resistant metal below 50° C. (e.g., at room temperature such as 25° C.).

In Example 72, the method of any one of Examples 67 to 71 can optionally include that crystallizing the deposited one or more transition-metal-oxides includes annealing the deposited one or more transition-metal-oxides (e.g., at a temperature in the range from about 350° C. to about 450° C.) in an atmosphere (e.g., nitrogen atmosphere, e.g., argon atmosphere) containing oxygen.

In Example 73, the method of any one of Examples 1 to 59 can optionally include that the first electrode includes a metal oxide and the second electrode includes the metal oxide.

In Example 74, the method of Example 73 can optionally include that the metal oxide includes iridium oxide, ruthenium oxide, osmium oxide, molybdenum oxide, indium tin oxide, strontium ruthenium oxide, strontium titanate, or lanthanum strontium manganite.

In Example 75, the method of Example 73 or 74 can optionally include that forming the first electrode and/or forming the second electrode includes a physical vapor deposition of (e.g., sputtering) the metal oxide below 50° C. (e.g., at room temperature such as 25° C.).

In Example 76, the method of any one of Examples 73 to 75 can optionally include that forming the first electrode and/or forming the second electrode includes an atomic layer deposition of the metal oxide below 50° C. (e.g., at room temperature such as 25° C.).

In Example 77, the method of any one of Examples 73 to 76 can optionally include that crystallizing the deposited one or more transition-metal-oxides includes annealing the deposited one or more transition-metal-oxides (e.g., at a temperature in the range from about 350° C. to about 450° C.) in an atmosphere (e.g., nitrogen atmosphere, e.g., argon atmosphere) containing oxygen.

In Example 78, the method of any one of Examples 73 to 76 can optionally include that crystallizing the deposited one or more transition-metal-oxides includes a laser annealing or a flash-lamp annealing of the deposited one or more transition-metal-oxides with local temperatures in the range from about 1500° C. to about 1850° C.

Example 79 is a method for manufacturing a capacitive memory structure on a carrier (e.g., a wafer), the method including: forming a first electrode of the capacitive memory structure, forming a second electrode of the capacitive memory structure, and forming a spontaneously polarizable memory layer of the capacitive memory structure, wherein the spontaneously polarizable memory layer is at least partially disposed between the first electrode and the second electrode, wherein a maximum thermal budget limit is associated with the processing of the carrier, and wherein forming the spontaneously polarizable memory layer includes: depositing one or more transition-metal-oxides by vapor deposition, crystallizing the deposited one or more transition-metal-oxides, and doping the one or more transition-metal-oxides prior to crystallizing the deposited one or more transition-metal-oxides, doping the one or more transition-metal-oxides is configured such that the deposited one or more transition-metal-oxides are crystallized with the maximum thermal budget of the wafer and that the spontaneously polarizable memory layer is formed with a predefined crystallographic texture.

In Example 80, the method of Example 79 can optionally include that doping the one or more transition-metal-oxides includes: doping the one or more transition-metal-oxides with at least one element of the following group of elements prior to crystallizing the deposited one or more transition-metal-oxides, the group of elements including: silicon, aluminum, germanium, or lanthanum.

In Example 81, the method of Example 79 or 80 can optionally include that crystallizing the deposited one or more transition-metal-oxides includes annealing the deposited one or more transition-metal-oxides at 600° C. for 1 second.

In Example 82, the method of Example 81 can optionally include that crystallizing the deposited one or more transition-metal-oxides further includes annealing the deposited one or more transition-metal-oxides at 400° C. for 1 hour after annealing the deposited one or more transition-metal-oxides at 600° C. for 1 second.

In Example 83, the method of any one of Examples 79 to 82 can optionally include that the one or more transition-metal-oxides include hafnium oxide.

In Example 84, the method of Example 79 can optionally include that doping the one or more transition-metal-oxides includes: doping the one or more transition-metal-oxides prior to crystallizing the deposited one or more transition-metal-oxides with at least one element of the following group of elements: silicon, aluminum, germanium, lanthanum, gadolinium, yttrium, scandium, or ytterbium, a cation percentage of the dopant is equal to or less than 40% (e.g., equal to or less than 10%, e.g., equal to or less than 5%), and the spontaneously polarizable memory layer has a thickness in the range from about 8 nm to about 12 nm (e.g., 10 nm).

In some aspects, a thickness of the layer may have an influence of the doping content that may be needed to stabilize a certain phase (e.g., a ferroelectric phase) of a material. For a transition metal oxide, a lower doping content may be needed for lower film thicknesses. According to various aspects, the material of the functional layer (e.g., the memory layer) may be doped to reach a ferroelectric phase or antiferroelectric state in the material. According to various aspects, the thermal budged, the doping, and/or the thickness of a layer may be adapted to reach a ferroelectric phase or antiferroelectric state in the material.

In Example 85, the method of Example 84 can optionally include that crystallizing the deposited one or more transition-metal-oxides includes annealing the deposited one or more transition-metal-oxides at 500° C. for 30 seconds.

In Example 86, the method of Example 85 can optionally include that crystallizing the deposited one or more transition-metal-oxides further includes annealing the deposited one or more transition-metal-oxides at 400° C. for 1 hour after annealing the deposited one or more transition-metal-oxides at 500° C. for 30 seconds.

In Example 87, the method of any one of Examples 84 to 86 can optionally include that the one or more transition-metal-oxides include hafnium oxide or hafnium zirconium oxide.

In Example 88, the method of Example 79 can optionally include that doping the one or more transition-metal-oxides includes: doping the one or more transition-metal-oxides prior to crystallizing the deposited one or more transition-metal-oxides with at least one element of the following group of elements: gadolinium, yttrium, scandium, or ytterbium.

In Example 89, the method of Example 88 can optionally include that crystallizing the deposited one or more transition-metal-oxides includes annealing the deposited one or more transition-metal-oxides at 350-450° C. for 30 min-1.5 hour.

In Example 90, the method of Example can optionally include that annealing the deposited one or more transition-metal-oxides at 400° C. for 1 hour includes six heating and cooling cycles, each of the six heating and cooling cycles includes heating the deposited one or more transition-metal-oxides to about 400° C. (e.g., to a temperature in the range from about 350° C. to about 450° C.), annealing the deposited one or more transition-metal-oxides at about 400° C. for about 10 minutes (e.g., for 5 min to 15 min), and cooling the deposited one or more transition-metal-oxides to a predefined temperature below 400° C.

In Example 91, the method of any one of Examples 88 to 90 can optionally include that the one or more transition-metal-oxides include hafnium oxide or hafnium zirconium oxide.

Example 92 is a functional structure (e.g., a capacitive memory structure) including: a first electrode, a second electrode, and a functional layer (e.g., a spontaneously polarizable memory layer), wherein the functional layer is at least partially disposed between the first electrode and the second electrode and includes a plurality of textured sublayers.

In Example 93, the functional structure of Example 92 can optionally include that the textured sublayers of the plurality of textured sublayers have a (001)-texture or (111)-texture. The textured sublayers of the plurality of textured sublayers may have a fiber texture or a biaxial texture.

In Example 94, the functional structure of Example 92 or 93 can optionally include that at least one of the first electrode and/or the second electrode have a curved or angled shape.

In Example 95, the functional structure of any one of Examples 92 to 94 can optionally include that the functional layer includes three or more textured sublayers, each of the three or more textured sublayers having a layer thickness in the range from about 1 nm to about 4 nm.

In Example 96, the functional structure of Example 92 to 95 can optionally include that the functional layer has a layer thickness in the range from about 8 nm to about 12 nm.

Example 97 is a method for manufacturing a functional layer (e.g., a spontaneously polarizable memory layer), the method including: forming a first sublayer of the spontaneously polarizable memory layer by vapor deposition, the first sublayer including a first material, and, subsequently, crystallizing the first material included in the first sublayer by a first annealing process, and forming a second sublayer of the spontaneously polarizable memory layer by vapor deposition, the second sublayer including a second material distinct from the first material, and, subsequently, crystallizing the second material included in the second sublayer by a second annealing process. The first annealing process and the second annealing process are distinct in at least one of an annealing temperature and/or an annealing duration.

In Example 98, the method of Example 97 can optionally further include forming a third sublayer of the spontaneously polarizable memory layer by vapor deposition, the third sublayer including the first material, and, subsequently, crystallizing the first material included in the third sublayer by a third annealing process, and forming a fourth sublayer of the spontaneously polarizable memory layer by vapor deposition, the fourth sublayer including the second material, and, subsequently, crystallizing the second material included in the fourth sublayer by a fourth annealing process. The third annealing process and the fourth annealing process are distinct in at least one of an annealing temperature and/or an annealing duration. The first sublayer, the second sublayer, the third sublayer, and the fourth sublayer may form a super-lattice based on the first material and the second material.

In Example 99, the method of Example 98 can optionally further include the annealing temperature of the first annealing process is substantially the same as the annealing temperature of the third annealing process, and/or the annealing duration of the first annealing process is substantially the same as the annealing duration of the third annealing process, and/or the annealing temperature of the second annealing process is substantially the same as the annealing temperature of the fourth annealing process, and/or the annealing duration of the second annealing process is substantially the same as the annealing duration of the fourth annealing process.

Example 100 is a capacitive memory structure including: a first electrode, a second electrode, a vapor deposited spontaneously polarizable memory layer. The vapor deposited spontaneously polarizable memory layer is at least partially disposed between the first electrode and the second electrode, and the vapor deposited spontaneously polarizable memory layer includes one or more crystallized transition-metal-oxides. The first electrode includes a plasma-treated surface in direct physical contact with the spontaneously polarizable memory layer.

Example 101 is a capacitive memory structure including: a first electrode, a second electrode, a spontaneously polarizable memory layer. The spontaneously polarizable memory layer is at least partially disposed between the first electrode and the second electrode, and the spontaneously polarizable memory layer includes one or more crystallized transition-metal-oxides. The first electrode includes a plasma-treated surface in direct physical contact with the spontaneously polarizable memory layer.

Example 102 is a capacitive memory structure including: a first electrode, a second electrode, a spontaneously polarizable memory layer. The spontaneously polarizable memory layer is at least partially disposed between the first electrode and the second electrode, and the spontaneously polarizable memory layer includes one or more crystallized transition-metal-oxides. The spontaneously polarizable memory layer includes a plasma-treated surface in direct physical contact with the second electrode.

Example 103 is a capacitive memory structure including: a first electrode, a second electrode, a spontaneously polarizable memory layer. The spontaneously polarizable memory layer is at least partially disposed between the first electrode and the second electrode. The spontaneously polarizable memory layer includes one or more crystallized transition-metal-oxides, and at least a first portion and a second portion of the one or more crystallized transition-metal-oxides are doped with a trivalent dopant. The first portion is at least partially disposed between the first electrode and a center portion of the one or more transition-metal-oxides and the second portion is at least partially disposed between the second electrode and the center portion of the one or more transition-metal-oxides.

Example 104 is a capacitive memory structure including: a first electrode, a second electrode, a spontaneously polarizable memory layer. The spontaneously polarizable memory layer is at least partially disposed between the first electrode and the second electrode, and the spontaneously polarizable memory layer includes gadolinium-doped hafnium zirconium oxide.

Example 105 is a capacitive memory structure including: a first electrode, a second electrode, a spontaneously polarizable memory layer. The spontaneously polarizable memory layer is at least partially disposed between the first electrode and the second electrode, and the spontaneously polarizable memory layer includes yttrium-doped hafnium zirconium oxide.

Example 106 is a capacitive memory structure including: a first electrode, a second electrode, a spontaneously polarizable memory layer. The spontaneously polarizable memory layer is at least partially disposed between the first electrode and the second electrode, and the spontaneously polarizable memory layer includes hafnium oxide doped with at least one element of the following elements: gadolinium, yttrium, scandium, and/or ytterbium.

Example 107 is a method for manufacturing a functional structure, the method including: forming a first electrode of the functional structure, forming a second electrode of the functional structure, and forming a functional layer of the functional structure. The functional layer is at least partially disposed between the first electrode and the second electrode. At least one of forming the first electrode and/or forming the functional layer is configured such that the functional layer is formed with predefined properties (e.g., at least one of a predefined crystallographic texture and a defect density in a predefined range). According to some aspects, the functional structure may be a capacitive memory structure and the method may include: forming a first electrode of the capacitive memory structure, forming a second electrode of the capacitive memory structure, and forming a spontaneously polarizable memory layer of the capacitive memory structure. The spontaneously polarizable memory layer is at least partially disposed between the first electrode and the second electrode. Forming the spontaneously polarizable memory layer may include: depositing one or more materials (e.g., transition-metal-oxides) by vapor deposition, and crystallizing the deposited one or more materials, at least one of forming the first electrode and/or forming the spontaneously polarizable memory layer is configured such that the spontaneously polarizable memory layer is formed with at least one of a predefined crystallographic texture and a defect density in a predefined range.

Example 111 is a method for manufacturing a functional layer of an electronic device, the method including: forming a plurality of sublayers of the functional layer by a plurality of consecutive sublayer processes, each sublayer process of the plurality of consecutive sublayer processes including: forming a sublayer by vapor deposition, the sublayer including one or more materials, and, subsequently, crystallizing the one or more materials included in the sublayer.

In Example 112, the method of Example 111 can optionally include that the one or more materials included in the sublayer are one or more metal oxides; or that the one or more materials included in the sublayer are one or more metal nitrides.

In Example 113, the method of Example 111 can optionally include that the one or more materials included in the sublayer are one or more transition metal oxides, or wherein the one or more materials included in the sublayer are one or more transition metal nitrides.

In Example 114, the method of Example 113 can optionally include that forming the sublayer by vapor deposition includes depositing the one or more transition metal oxides and, subsequently, doping the one or more transition metal oxides; or that the one or more one or more materials included in the sublayer are one or more doped transition metal oxides.

In Example 115, the method of any one of Examples 111 to 114 can optionally include that, prior to crystallizing the one or more materials included in the sublayer, the one or more materials included in the sublayer are one or more amorphous materials, and that, subsequent to crystallizing the one or more materials included in the sublayer, the one or more materials included in the sublayer are one or more single crystalline or polycrystalline materials.

In Example 116, the method of any one of Examples 111 to 115 can optionally include that crystallizing the one or more materials included in the sublayer includes increasing a crystallinity of one or more materials of the sublayer.

In Example 117, the method of Example 116 can optionally include that increasing the crystallinity of the one or more materials of the sublayer includes an increase of an average grain size of the one or more materials of the sublayer; and/or that increasing the crystallinity of the one or more materials of the sublayer includes a reduction of a total number of grains of the one or more materials included in the sublayer.

In Example 118, the method of any one of Examples 111 to 117 can optionally include that crystallizing the one or more materials included in the sublayer includes thermally annealing the sublayer.

In Example 119, the method of any one of Examples 111 to 118 can optionally include that crystallizing the one or more materials included in the sublayer includes generating a textured sublayer.

In Example 120, the method Example 119 can optionally include that the textured sublayer has at least one of an (001)-texture or a (111)-texture.

In Example 121, the method of any one of Examples 111 to 120 can optionally include that the sublayer has a layer thickness in the range from about 0.5 nm to about 5 nm.

In Example 122, the method of any one of Examples 111 to 121 can optionally include that a layer thickness of the functional layer is defined by a total number of sublayers of the functional layer and respective layer thicknesses of the sublayers.

In Example 123, the method of any one of Examples 111 to 122 can optionally include that the vapor deposition includes at least one of atomic layer deposition or sputter deposition.

In Example 124, the method of any one of Examples 111 to 123 can optionally include that the functional layer is a memory layer, and wherein the one or more materials included in each sublayer are one or more spontaneously polarizable materials.

Example 125 is a method for manufacturing a capacitive memory structure, the method including: forming a first electrode of the capacitive memory structure, forming a second electrode of the capacitive memory structure, and forming a spontaneously polarizable memory layer of the capacitive memory structure, wherein the spontaneously polarizable memory layer is at least partially disposed between the first electrode and the second electrode, and wherein forming the spontaneously polarizable memory layer includes: depositing one or more materials by vapor deposition, and crystallizing the deposited one or more materials to form a first sublayer of the spontaneously polarizable memory layer, and, subsequently, depositing one or more materials by vapor deposition, and crystallizing the deposited one or more materials to form a second sublayer of the spontaneously polarizable memory layer.

In Example 126, the method of Example 125 can optionally include that the one or more materials include one or more transition-metal-oxides, or wherein the one or more materials include one or more transition-metal-nitrides.

In Example 127, the method of Example 125 or 126 can optionally include that the one or more materials of the first sublayer are distinct from the one or more materials of the second sublayer, and that crystallizing the deposited one or more materials of the first sublayer is carried out by a first annealing temperature and crystallizing the deposited one or more materials of the second sublayer is carried out by a second annealing temperature distinct from the first annealing temperature.

In Example 128, the method of Example 125 or 126 can optionally include that the one or more materials of the first sublayer are the same as the one or more materials of the second sublayer, and that crystallizing the deposited one or more materials of the first sublayer is carried out by a first annealing temperature and wherein crystallizing the deposited one or more materials of the second sublayer is carried out by the first annealing temperature.

Example 129 is a capacitive memory structure including: a first electrode, a second electrode, and a spontaneously polarizable memory layer is at least partially disposed between the first electrode and the second electrode, wherein the spontaneously polarizable memory layer includes a plurality of textured sublayers.

In Example 130, the capacitive memory structure of Example 129 can optionally include that the spontaneously polarizable memory layer includes three or more textured sublayers, each of the three or more textured sublayers having a layer thickness in the range from about 1 nm to about 4 nm, and wherein the spontaneously polarizable memory layer has a layer thickness in the range from about 8 nm to about 12 nm.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The word "over", used herein to describe forming a feature, e.g. a layer "over" a side or surface, may be used to mean that the feature, e.g., the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

According to various aspects, the memory layer of a capacitive memory structure may be formed by sublayer processes, e.g., via an intra layer anneal process, as described above. In some aspects, the various sublayers may be formed over one another and not laterally next to one another.

The term "lateral" used with regards to a lateral dimension (in other words a lateral extent) of a structure, a portion, a structure element, a layer, etc., provided, for example, over and/or in a carrier (e.g. a layer, a substrate, a wafer, etc.) or "laterally" next to, may be used herein to mean an extent or a positional relationship along a surface of the carrier. That means, in some aspects, that a surface of a carrier (e.g. a surface of a layer, a surface of a substrate, a surface of a wafer, etc.) may serve as reference, commonly referred to as the main processing surface. Further, the term "width" used with regards to a "width" of a structure, a portion, a structure element, a layer, etc., may be used herein to mean the lateral dimension (or in other words the lateral extent) of a structure. Further, the term "height" used with regards to a height of a structure, a portion, a structure element, a layer, etc., may be used herein to mean a dimension (in other words an extent) of a structure in a direction perpendicular to the surface of a carrier (e.g. perpendicular to the main processing surface of a carrier). For example, the carrier may be or may include a silicon substrate (e.g., including a silicon oxide layer, e.g., not including a silicon oxide layer) and/or a glass substrate.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term region used with regards to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc. In some aspects, the continuous region of a semiconductor portion may be provided by semiconductor material having only one dominant doping type.

The term "thickness" used with regards to a "thickness" of a layer may be used herein to mean the dimension (in other words an extent) of the layer perpendicular to the surface of the support (the material or material structure) on which the layer is formed (e.g., deposited or grown). If a surface of the support is parallel to the surface of the carrier (e.g. parallel to the main processing surface) the "thickness" of the layer formed on the surface of the support may be the same as the height of the layer.

According to various aspects, various properties (e.g., physical properties, chemical properties, etc.) of a first component (e.g., elements, layers, structures, portions, etc.) and a second component may be compared to one another. It may be found that two or more components may be—with reference to a specific property—either equal to each other or different from one another. As a measure, a value that represents such a property may be either equal or not. In general, a skilled person may understand from the context of the application whether two values or properties are equal or not, e.g., usually, if values are in the range of a usual tolerance, they may be regarded equal. However, in some aspects or as long as not otherwise mentioned or understood, two values that differ from one another with at least 1% relative difference may be considered different from one another. Accordingly, two values that differ from one another with less than 1% relative difference may be considered equal to each other.

It may be understood, that the physical term "electrical conductivity" (also referred to as specific conductance, specific electrical conductance, as examples) may be defined as a material dependent property reciprocal to the physical term "electrical resistivity" (also referred to as specific electrical resistance, volume resistivity, as examples). Further properties of a layer or structure may be defined material dependent and the geometry dependent, e.g., by the physical terms "electrical resistance" and "electrical conductance". The terms "electrically conducting" or "electrically conductive" may be used herein interchangeably to describe a material or a layer having an electrical conductivity or an average electrical conductivity greater than $10^6$ S/m at a temperature of 20° C. The term "electrically insulating" may be used herein interchangeably to describe a material or a layer having an electrical conductivity or an average electrical conductivity less than $10^{-10}$ S/m at a temperature of 20° C. In some aspects, a difference in electrical conductivity between an electrically conducting material (or layer) and an electrically insulating material (or layer) may have an absolute value of at least $10^{10}$ S/m at a temperature of 20° C., or of at least $10^{15}$ S/m at a temperature of 20° C.

It may be understood, that the physical properties "average grain size" and/or "grain size distribution" may be determined based on various measurements and/or calculations. As an example, a volume-weighted average grain size may be determined by known formulas. In some aspects, an average grain size may be determined by the known linear intercept method. Preferably, a measurement may be performed in accordance with the ASTM E1382 (e.g., as valid from 2015) standard. However, in a thin layer, e.g., in a layer with a thickness below 1 µm, a TEM cross-section image may be used as a basis to determine the "average grain size" and/or "grain size distribution" at least in two dimensions. This two-dimensional determination may allow estimating or deducting the three-dimensional properties assuming, for example, that a two-dimensional image is (statistically) representative for substantially all directions in the layer. It may be understood, that the term "grain size distribution" may define a spatial distribution, e.g., a distribution along a line, in a plane, or in a volume. It may be understood, that the term "grain size distribution" may define a frequency distribution, e.g., a histogram including number of grains having a grain-size in a certain range.

It may be understood, that the term "density of grain boundaries" may be defined by a number of grain boundaries per volume and/or by a volume fraction comparing the volume of the grain boundaries with a reference volume.

It may be understood, that the term "chemical composition of grain boundaries" may consider that a grain boundary may include another material than the corresponding grains. As an example, the oxygen content in a grain boundary may be different from the oxygen content of the actual corresponding grains.

It may be understood, that the term "chemical composition of defects" may consider that defects may include impurities. As an example, the material causing impurities may have another chemical composition than the material in the surrounding of the impurities.

It may be understood, that a specific type of crystallinity of a material may be a microstructural property. Type of crystallinity may include, for example: single crystalline, polycrystalline, nano-crystalline, and, as an edge case, amorphous structures, as examples.

The term "metal material" may be used herein to describe a metal (e.g., a pure or substantially pure metal), a mixture of more than one metal, a metal alloy, an intermetallic material, a conductive metal compound (e.g., a nitride, e.g., an oxide), and the like. Illustratively, the term "metal material" may be used herein to describe a material having an electrical conductivity typical of a metal, for example an electrical conductivity greater than $10^6$ S/m at a temperature of 20° C. The term "metal material" may be used herein to describe a material having the Fermi level inside at least one band.

The term "content" may be used herein, in some aspects, in relation to the "content of an element" in a material or in a layer to describe the mass percentage (or fraction) of that element over a total mass of the material (or of the layer). The term "content" may be used herein in relation to the "content of defects" in the structure of a material to describe the mass percentage of the defects over a total mass of the constituents of the structure. The term "content" may be used herein, in some aspects, in relation to the "content of an element" in a material or in a layer to describe the volume percentage of that element over a total volume of the material (or of the layer). The term "content" may be used herein in relation to the "content of defects" in the structure of a material to describe the volume percentage of the defects over a total volume of the structure.

The expression "a material of a layer" or "a material of a portion", for example "a material of an electrode layer" or "a material of a memory portion", may be used herein to describe a main component of that layer or portion, e.g. a main material (for example, a main element or a main compound) present in that layer or portion. The term "a material of a layer" or "a material of a portion" may describe, in some aspects, the material of that layer or portion having a weight percentage greater than 60% over the total weight of the materials that the layer or portion includes. The term "a material of a layer" or "a material of a portion" may describe, in some aspects, the material of that layer or portion having a volume percentage greater than 60% over the total volume of the materials that the layer or portion includes. As an example, a material of a layer or portion including aluminum may describe that that layer or portion is formed mostly by aluminum, and that other elements (e.g., impurities) may be present in a smaller proportion, e.g. having less weight percentage or less volume percentage compared to aluminum. As another example, a material of a layer or portion including titanium nitride may describe that that layer or portion is formed mostly by titanium nitride, and that other elements (e.g., impurities) may be present in a smaller proportion, e.g. having less weight percentage or less volume percentage compared to titanium nitride.

According to various aspects, the properties and/or the structure of an electrode, an electrode layer, a memory layer, a memory portion, a separation portion, an ion conductor portion, the capacitive memory structure, and/or a functional layer as described herein may be evaluated with techniques known in the art. As an example, transmission electron microscopy (TEM) may be used to determine the structure of a material or a layer, for example the presence of one or more sub-layers in a layer. TEM may be used for identifying a layer, an interface, a crystal structure, a microstructure, and other properties. According to various aspects, electron diffraction may be used in combination with the TEM to characterize a structure, such as the capacitive memory structure. As another example, X-ray crystallography (X-ray diffraction) may be used to determine various properties of a layer or a material, such as the crystal structure, the lattice properties, the size and shape of a unit cell, the chemical composition, the phase or alteration of the phase, the presence of stress in the crystal structure, the microstructure, and the like. As a further example, electron backscatter diffraction (EBSD) may be used to determine various properties of a layer or a material, such as crystal orientation (e.g., to determine a crystallographic texture), one or more phases, a strain, etc. As a further example, energy-dispersive X-ray spectroscopy (EDS) may be used to determine the chemical composition of a layer or a material, e.g. the presence and/or the content of an element in the layer or material. As a further example, x-ray photoelectron spectroscopy (XPS) may be used to determine the chemical composition of a layer or a material, e.g. the presence and/or the content of an element in the layer or material. As a further example, Rutherford backscattering spectrometry (RBS) may be used to determine the structure and/or the composition of a material. As a further example, secondary ion mass spectrometry (SIMS) may be used to analyze the molecular composition of the upper monolayers of a solid, e.g. for analyzing the spatial distribution (e.g., the gradient) of an element across the solid. As a further example, neutron diffraction (also referred to as elastic neutron scattering) may be used to determine the atomic structure of a material.

Some aspects refer to a layer and sublayers of the layer. It is noted that each of the sublayers of a layer may include substantially the same material, and that this material forms substantially the layer. Furthermore, each of the sublayers of a layer may have the same chemical properties (e.g., the same chemical composition, the same doping content and/or doping type, materials of the same stoichiometry, as examples) and/or the same physical properties (e.g., the same hardness, the same electrical conductance, the same polarization properties, the same piezoelectric properties, the same pyroelectric properties, the same microstructure, the same texture, as examples).

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A method for manufacturing a memory layer of an electronic device, the method comprising:
    forming a plurality of sublayers of the memory layer by a plurality of consecutive sublayer processes, wherein each sublayer is spontaneously polarizable and wherein a first sublayer of the plurality of sublayers is formed on an electrode, each sublayer process of the plurality of consecutive sublayer processes comprising:
    forming a sublayer by vapor deposition, the sublayer comprising one or more materials, and, subsequently,
    crystallizing the one or more materials comprised in the sublayer, wherein crystallizing the one or more materials comprised in the sublayer comprises generating a textured sublayer and wherein the textured sublayer has at least one of an (001) texture or a (111) texture.

2. The method according to claim 1,
    wherein the one or more materials comprised in the sublayer are one or more metal oxides, or
    wherein the one or more materials comprised in the sublayer are one or more metal nitrides.

3. The method according to claim 1,
    wherein the one or more materials comprised in the sublayer are one or more transition metal oxides, or
    wherein the one or more materials comprised in the sublayer are one or more transition metal nitrides.

4. The method according to claim 3,
    wherein forming the sublayer by vapor deposition comprises depositing the one or more transition metal oxides and, subsequently, doping the one or more transition metal oxides; or
    wherein the one or more one or more materials comprised in the sublayer are one or more doped transition metal oxides.

5. The method according to claim 1,
    wherein, prior to crystallizing the one or more materials comprised in the sublayer, the one or more materials comprised in the sublayer are one or more amorphous materials; and
    wherein, subsequent to crystallizing the one or more materials comprised in the sublayer, the one or more materials comprised in the sublayer are one or more single crystalline or polycrystalline materials.

6. The method according to claim 1,
wherein crystallizing the one or more materials comprised in the sublayer comprises increasing a crystallinity of one or more materials of the sublayer.

7. The method according to claim 6,
wherein increasing the crystallinity of the one or more materials of the sublayer comprises an increase of an average grain size of the one or more materials of the sublayer; and/or
wherein increasing the crystallinity of the one or more materials of the sublayer comprises a reduction of a total number of grains of the one or more materials comprised in the sublayer.

8. The method according to claim 1,
wherein crystallizing the one or more materials comprised in the sublayer comprises thermally annealing the sublayer.

9. The method according to claim 1,
wherein the sublayer has a layer thickness in the range from about 0.5 nm to about 5 nm.

10. The method according to claim 1,
wherein a layer thickness of the memory layer is defined by a total number of sublayers of the memory layer and respective layer thicknesses of the sublayers.

11. The method according to claim 1,
wherein the vapor deposition comprises at least one of atomic layer deposition or sputter deposition.

12. The method according to claim 1,
wherein the one or more materials comprised in each sublayer are one or more spontaneously polarizable materials.

13. Method for manufacturing a capacitive memory structure, the method comprising:
forming a first electrode of the capacitive memory structure,
forming a second electrode of the capacitive memory structure, and
forming a spontaneously polarizable memory layer of the capacitive memory structure, wherein the spontaneously polarizable memory layer is at least partially disposed between the first electrode and the second electrode and wherein the spontaneously polarizable memory layer is in direct physical contact with both the first electrode and the second electrode, and wherein forming the spontaneously polarizable memory layer comprises:
depositing one or more materials by vapor deposition, and
crystallizing the deposited one or more materials to form a first sublayer of the spontaneously polarizable memory layer, and, subsequently,
depositing one or more materials by vapor deposition, and
crystallizing the deposited one or more materials to form a second sublayer of the spontaneously polarizable memory layer.

14. The method according to claim 13,
wherein the one or more materials comprise one or more transition-metal-oxides; or
wherein the one or more materials comprise one or more transition-metal-nitrides.

15. The method according to claim 13,
wherein the one or more materials of the first sublayer are distinct from the one or more materials of the second sublayer; and wherein crystallizing the deposited one or more materials of the first sublayer is carried out by a first annealing temperature and crystallizing the deposited one or more materials of the second sublayer is carried out by a second annealing temperature distinct from the first annealing temperature.

16. The method according to claim 13,
wherein the one or more materials of the first sublayer are the same as the one or more materials of the second sublayer; and wherein crystallizing the deposited one or more materials of the first sublayer is carried out by a first annealing temperature and wherein crystallizing the deposited one or more materials of the second sublayer is carried out by the first annealing temperature.

17. The method according to claim 1, wherein each sublayer process of the plurality of consecutive sublayer processes further comprises:
forming a further sublayer by vapor deposition, the further sublayer comprising one or more further materials distinct from the one or more materials of the sublayer, and, subsequently,
crystallizing the one or more further materials comprised in the further sublayer.

18. The method according to claim 1, wherein forming the sublayer comprises:
depositing a first transition-metal-oxide layer, depositing a second transition-metal-oxide layer, and forming an insulating layer at least partially disposed between the first transition-metal-oxide layer and the second transition-metal-oxide layer; and wherein crystallizing the one or more materials comprised in the sublayer comprises crystallizing both the first transition-metal-oxide layer and the second transition-metal-oxide layer.

* * * * *